(12) United States Patent
Kim et al.

(10) Patent No.: US 12,212,134 B2
(45) Date of Patent: Jan. 28, 2025

(54) APPARATUS, METHOD, AND DISTRIBUTION SYSTEM FOR PREVENTING ELECTRIC SHOCK AND FIRE DURING ELECTRIC LEAKAGE AND GROUND FAULT

(71) Applicants: ITE CO., LTD., Uijeongbu-si (KR); Na Woon Kim, Yangju-si (KR)

(72) Inventors: Na Woon Kim, Yangju-si (KR); In Tae Kim, Yangju-si (KR)

(73) Assignees: ITE CO., LTD., Uijeongbu-si (KR); Na Woon Kim, Yangju-si (KR)

( * ) Notice: Subject to any disclaimer, the term of this patent is extended or adjusted under 35 U.S.C. 154(b) by 266 days.

(21) Appl. No.: 17/997,338

(22) PCT Filed: Apr. 28, 2021

(86) PCT No.: PCT/KR2021/005377
§ 371 (c)(1),
(2) Date: Dec. 21, 2022

(87) PCT Pub. No.: WO2021/221461
PCT Pub. Date: Nov. 4, 2021

(65) Prior Publication Data
US 2023/0170686 A1 Jun. 1, 2023

(30) Foreign Application Priority Data

Apr. 28, 2020 (KR) .................. 10-2020-0051805
Apr. 6, 2021 (KR) .................. 10-2021-0044409
Apr. 7, 2021 (KR) .................. 10-2021-0044909

(51) Int. Cl.
*H02H 7/26* (2006.01)
*G01R 31/52* (2020.01)
(Continued)

(52) U.S. Cl.
CPC ............... *H02H 7/26* (2013.01); *G01R 31/52* (2020.01); *H02H 1/0007* (2013.01); *H02S 50/00* (2013.01)

(58) Field of Classification Search
CPC .......... H02H 1/0007; H02H 3/04; H02H 3/16; H02H 3/33; H02H 5/10; H02H 7/26;
(Continued)

(56) References Cited

U.S. PATENT DOCUMENTS 4,580,186 A 4/1986 Parker et al.
2002/0085325 A1 7/2002 Suzui et al.
(Continued)

FOREIGN PATENT DOCUMENTS

JP 4849094 B2 12/2011
JP 2014158365 A * 8/2014
(Continued)

OTHER PUBLICATIONS

Machine translation of Sato et al. Japanese Patent Document JP 2014-158365 A Aug. 2014 (Year: 2014).*
(Continued)

*Primary Examiner* — Kevin J Comber
(74) *Attorney, Agent, or Firm* — Studebaker & Brackett PC

(57) ABSTRACT

An apparatus for preventing an electric shock and a fire according to the present invention includes one or more failure detectors that have one end electrically connected to at least one of two or more power lines insulated from earth with a resistance value greater than or equal to a predetermined ground resistance value and a first neutral point having a potential between voltages of the two or more power lines, and the other end electrically connected to the earth, in which the failure detector detects a leakage current by forming a current path for the leakage current flowing (Continued)

from the two or more power lines or the first neutral point to the earth. According to the present disclosure, it is possible to prevent the electric shock and the occurrence of the fire due to the leakage current.

20 Claims, 29 Drawing Sheets

(51) Int. Cl.
*H02H 1/00* (2006.01)
*H02S 50/00* (2014.01)

(58) Field of Classification Search
CPC ......... H02S 50/00; G01R 31/08; G01R 31/52; H01F 27/40; Y04S 10/52
USPC .......................................................... 361/47
See application file for complete search history.

(56) References Cited

U.S. PATENT DOCUMENTS

| | | | |
|---|---|---|---|
| 2005/0280422 A1* | 12/2005 | Kishibata | G01R 31/52 324/522 |
| 2015/0349517 A1 | 12/2015 | Li et al. | |
| 2019/0348216 A1* | 11/2019 | Kim | G01R 19/165 |

FOREIGN PATENT DOCUMENTS

| | | |
|---|---|---|
| JP | 2017-034731 A | 2/2017 |
| KR | 10-2002-0013257 A | 2/2002 |
| KR | 10-2004-0041001 A | 5/2004 |
| KR | 101432017 B1 | 8/2014 |
| KR | 10-1631997 B1 | 6/2016 |
| KR | 10-2019-0128920 A | 11/2019 |
| KR | 10-2169232 B1 | 10/2020 |
| KR | 10-2219474 B1 | 2/2021 |
| WO | 2019/216626 A1 | 11/2019 |

OTHER PUBLICATIONS

An Office Action; "Notice of Reasons for Refusal," mailed by the Japanese Patent Office on Oct. 31, 2023, which corresponds to Japanese Patent Application No. 2022-565695 and is related to U.S. Appl. No. 17/997,338.
The partial supplementary European search report (R. 164 EPC) issued by the European Patent Office on May 7, 2024, which corresponds to European Patent Application No. 21796076.4-1002 and is related to U.S. Appl. No. 17/997,338.
International Search Report issued in PCT/KR2021/005377; mailed Aug. 6, 2021.
Written Opinion issued in PCT/KR2021/005377; mailed Aug. 6, 2021.
An Office Action; mailed by the Korean Intellectual Property Office on Jul. 6, 2020, which corresponds to Korean Patent Application No. 10-2020-0051805 and is related to U.S. Appl. No. 17/997,338.
An Office Action; mailed by the Korean Intellectual Property Office on Nov. 15, 2022, which corresponds to Korean Patent Application No. 10-2021-0044909 and is related to U.S. Appl. No. 17/997,338.
An Office Action mailed by the Indian Patent Office on Feb. 6, 2023, which corresponds to Indian Patent Application 202227067047 and is related to U.S. Appl. No. 17/997,338.
An Office Action mailed by the Korean Intellectual Property Office on May 8, 2023, which corresponds to Korean Patent Application No. 10-2021-0044409 and is related to U.S. Appl. No. 17/997,338.

* cited by examiner

230

(a) (b)

(a)  (b)

(a)           (b)

(a)

(b)

(a)

(b)

(a)

(b)

(a)

(b)

(a)

(b)

(a)

(b)

APPARATUS, METHOD, AND DISTRIBUTION SYSTEM FOR PREVENTING ELECTRIC SHOCK AND FIRE DURING ELECTRIC LEAKAGE AND GROUND FAULT

CROSS-REFERENCE TO RELATED APPLICATIONS

This application is a National Phase application of International Application No. PCT/KR2021/005377, filed on Apr. 28, 2021, which claims benefit of priority to Korean Patent Application No. 10-2021-0044909, filed on Apr. 7, 2021, Korean Patent Application No. 10-2021-0044409, filed on Apr. 6, 2021, and Korean Patent Application No. 10-2020-0051805, filed on Apr. 28, 2020, the entire content of which is incorporated herein by reference.

TECHNICAL FIELD

The present invention relates to an apparatus, method, and distribution system for preventing an electric shock and a fire during electric leakage and ground fault, and more particularly, to an apparatus, method, and distribution system for preventing an electric shock and a fire during electric leakage and ground fault capable of preventing the electric shock and fire caused by leakage current by detecting a leakage current between a power line, which is insulated from the earth and supplies power, and the earth to limit the detected leakage current to a dangerous current or less or cutting off the leakage current from flowing in a human body or peripheral facilities.

BACKGROUND ART

In general, electrical facilities refer to a transformer, an electric wire, a switchgear, a circuit breaker, a distribution box, an outlet, a control panel, a switch, and other ancillary facilities from a switchboard, which is a power receiving facility, to electrical use equipment, and include electrical facilities for electrical business, electrical facilities for general use, electrical facilities for private use, machinery and equipment (loads) installed for electricity use, and the like.

In order to connect between these electrical facilities, for example, a three-phase four-wire electrical facility supplies power by connecting a neutral line NL and power lines, which are a plurality of conductors (R-phase, S-phase, T-phase), by methods such as Y-connection, Δ-connection, and Y-Δ connection. Here, when the three-phase four-wire electrical facility connects to a load, if one conductor (power line) and another conductor (power line) are connected, the three-phase four-wire electrical facility becomes 380V, and when one conductor (power line) (e.g., R-phase) and a neutral line NL are connected, the three-phase four-wire electrical facility becomes 220V to supply power to a single-phase load.

In principle, the neutral line NL should have a zero potential which is an earth potential, but in reality, when phases of each phase do not come out exactly 120° in the field, the neutral line NL may have a little voltage. In this case, when the neutral line is commonly connected to a ground line, which is an earth potential line, in order to prevent a neutral line potential from increasing, since the neutral line is in contact with the earth even if the phases of each phase are slightly different, the zero potential is maintained.

A single-phase distribution line is used by connecting two wires, and one of the two wires is used by connecting to a neutral line that is equipotential with the earth, and the other is used by connecting to a plurality of conductors (power line) having a potential difference of 220V from the earth. When electric leakage (ground fault) occurs in a plurality of conductors (power line), there is a high risk of death due to an electric shock or the occurrence of a fire, but when the neutral line is not grounded, even if electric leakage, ground fault, etc., occur, one conductor may not detect the electric leakage, the ground fault, etc., a potential of a phase where there is no accident increases, and thus, a bigger accident may occur due to insulation breakdown of equipment, etc., and electrical accidents may occur when a surge voltage such as a charging voltage or lightning are introduced.

In addition, when a power supply side neutral line to which a single-phase load is commonly connected is disconnected, an abnormal voltage is introduced into a light load due to different unbalanced loads through a neutral line commonly connected to unbalanced single-phase loads connected to different three-phase phases, so electrical equipment is overheated and burned out and accordingly, a fire is frequently occurring. Image harmonics introduced into the neutral line also cause an abnormal overcurrent to flow through the neutral line, causing electrical accidents. To prevent the electrical accidents, a circuit breaker for wiring and an electric leakage circuit breaker are installed.

However, electric fires are occurring every year without decreasing. Since electrical facilities of low voltage consumers are poorer than that of high voltage consumers, most of the electric fires occur in the low voltage consumers. Due to the occurrence of the electric fires, when, in a distribution line, electricity is supplied with a neutral line disconnected, electricity is supplied with phases lost, electricity is supplied with misconnected, an abnormal voltage such as a surge is supplied, or an electrical failure such as increased resistance or poor connection (arc) occurs in electrical facilities of customers, the low voltage customers cannot take any countermeasures against the electrical failure, so an abnormal voltage is introduced into loads, or electrical facilities are overheated and burned out, thereby causing the electric shock and electric fire.

In addition, blind spots where an electrical failure such as electric leakage cannot be monitored are from an inlet that receives electricity of a low-voltage consumer building to a distribution board•switchboard where a main circuit breaker is installed. When electric leakage and ground fault accidents occur in blind spots, there is no countermeasure, resulting in personal and property damage due to the electric shock and fire.

When the electric leakage or the ground fault occurs in the power line, and thus, the leakage current flowing from the power line to the earth passes through a human body, the electric shock accident occurs, and when the leakage current flows through peripheral facilities or flammable objects, a fire may occur, and thus, a serious electrical accident may occur.

In particular, the electric shock accident that directly damages a human body among the electrical accidents occurs when a current flowing from one phase of a power supply through the human body flows in other phases or the earth. When the electric shock current flowing through the human body is a certain dangerous current or more, injury or death accident may occur.

In the case of the electric shock accident, in general, it has been known that, when a value of a current flowing in the human body is 15 mA or more, convulsions (pain) occur, and when the current value is 50 mA or more, death occurs. As a result, in order to prevent the electric shock accident, it is necessary to configure electrical facilities and distribution lines so that the electric shock current is 15 mA or less, which is the dangerous current or less, preferably, for example, 8 mA or less.

In the case of the electric leakage or the ground fault, the electric shock and the fire accident due to the leakage current may occur when a part of the human body or the flammable object comes into contact with one or more phases of a stripped power line or an outlet, or a leakage current caused by flooding of a power line, a terminal block, or an electrical facility flows in the earth through the human body or the flammable object.

However, the existing circuit breaker for cutting off the leakage current due to the ground fault or the electric leakage operates only when the leakage current should be a predetermined value or more even if the ground fault or the electric leakage occurs, and thus, the leakage current is detected, or has a limit to fundamentally preventing the electrical accidents caused by the leakage current since the electric shock or fire may occur due to even a small amount of leakage current even if the leakage current is limited to the dangerous current or less.

DISCLOSURE

Technical Problem

The present invention provides an apparatus, method, and distribution system for preventing electric shock and fire in electric leakage and ground fault capable of preventing the electric shock and fire caused by leakage current by detecting a leakage current between a power line, which is insulated from the earth and supplies power, and the earth to limit the detected leakage current to a dangerous current or less or cutting off the leakage current from flowing in a human body or peripheral facilities.

Objects of the present invention are not limited to the above-mentioned objects. That is, other objects that are not mentioned may be obviously understood by those skilled in the art to which the present invention pertains from the following description.

Technical Solution

In one general aspect, an apparatus for preventing an electric shock and a fire includes: one or more failure detectors that have one end electrically connected to at least one of two or more power lines insulated from earth with a resistance value greater than or equal to a predetermined ground resistance value and a first neutral point having a potential between voltages of the two or more power lines, and the other end electrically connected to the earth, in which the failure detector detects a leakage current by forming a current path for the leakage current flowing from the two or more power lines or the first neutral point to the earth.

Each of the failure detectors may include a current detection unit that limits the leakage current to a predetermined dangerous current or less, and detects the leakage current and output a detection signal.

Each of the failure detectors may further include a unidirectional current unit that limits the path for the leakage current so that the leakage current flows through the current detection unit in one-way direction.

The apparatus for preventing an electric shock and a fire may further include: a detection/recovery device that is connected in parallel with a load on a load side of the power line, detects an electrical failure of the power line, or detects the electrical failure to recover power.

The detection/recovery device may include: a second neutral point that is connected to the first neutral point; and two or more windings that have one end connected to each of the two or more power lines, and the other end commonly connected to the second neutral point, each of the two or more windings may include at least one coupling winding portion magnetically coupled to any one of the remaining windings, and at least one of the two or more windings may include the coupling winding portion in which voltages having phases opposite to those of voltages applied to each of the remaining windings are induced with respect to the second neutral point.

The power line may supply single-phase power, the detection/recovery device may include first and second windings that have one end connected to each of the power lines and the other end commonly connected to the second neutral point, and the first and second windings may be magnetically coupled to each other so that voltages having phases opposite to each other are each induced with respect to the second neutral point.

The power line may supply three-phase power having R, S and T-phases, the detection/recovery device may include first to third windings that have one end connected to each of the R, S and T-phases and the other end commonly connected to the second neutral point, and each of the first to third windings may include the coupling winding portion in which voltages having phases opposite to those of each of the voltages applied to the remaining windings are each induced with respect to the second neutral point.

The power line may supply three-phase power having R, S and T-phases, the detection/recovery device may include first to third windings that have one end connected to each of the R, S and T-phases and the other end commonly connected to the second neutral point, and one of the first to third windings may include the coupling winding portion in which voltages having phases opposite to those of each of the voltages applied to the remaining windings are each induced with respect to the second neutral point.

In another general aspect, a method of preventing an electric shock and a fire includes: insulating two or more power lines from earth with a resistance value greater than or equal to a predetermined ground resistance value; detecting a leakage current between a least one of the two or more power lines and a first neutral point having a potential between voltages of the two or more power lines and the earth; and outputting a detection signal according to the detecting of the leakage current.

The method of preventing an electric shock and a fire may further include: cutting off a supply of power to a power line through which the leakage current flows by interlocking with the detection signal; and recovering the cut off power and supplying the recovered power to a load.

In still another general aspect, an apparatus for preventing an electric shock and a fire includes: a failure detector that is electrically connected to a power supply unit to transmit AC or DC electricity from the power supply unit to a load facility, and configured to detect whether a leakage current occurs between at least one of two or more power lines insulated from earth with a resistance value greater than or equal to a predetermined ground resistance value and a neutral point having a potential between voltages of the two or more power lines and the earth, in which the failure detector operates to ground, to the earth, a power line or a neutral point in which the leakage current occurs among the two or more power lines and the neutral point when the leakage current occurs.

The apparatus for preventing an electric shock and a fire may further include: a ground switching unit that is controlled to short-circuit, to the earth, a power line or a neutral point in which the leakage current occurs among the two or more power lines and the neutral point according to the detection result of the failure detector to ground the power line or the neutral point.

The failure detector may include two or more failure detectors respectively electrically connected between the two or more power lines and the earth, and the ground switching unit may include two or more ground switches whose turn-on or turn-off is controlled in response to each of the two or more failure detectors.

At least one of the two or more ground switches may be a normal open (NO) type switch that is turned on when an operating current greater than or equal to a predetermined reference value flows in a corresponding failure detector, and may be electrically connected to at least one of a power line and a neutral point other than a power line, to which the corresponding failure detector is connected, among the two or more power lines and the neutral point.

At least one of the two or more ground switches may be a normal close (NC) type switch that is turned off when an operating current greater than or equal to a predetermined reference value flows in the corresponding failure detector, and may be electrically connected in parallel to the corresponding failure detector.

The power supply unit may be a three-phase AC power supply including an R-phase, an S-phase, and a T-phase, the failure detector may include first to third failure detectors respectively connected between the R-phase, the S-phase, and the T-phase and the earth, the ground switching unit may include first to third ground switches that correspond to each of the first to third failure detectors and are turned on when an operating current greater than or equal to a predetermined reference value flows in the corresponding failure detector, and the first to third ground switches may be installed between a plurality of power lines and the earth so that, when the electric leakage or the ground fault occurs in any one of the plurality of power lines connected to the R-phase, the S-phase, and the T-phase, the corresponding power line is grounded to the earth.

The power supply unit may be a three-phase AC power supply including an R-phase, an S-phase, and a T-phase, the failure detector may include first to third failure detectors respectively connected between the R-phase, the S-phase, and the T-phase and the earth, the ground switching unit may include first to third ground switches that correspond to each of the first to third failure detectors and are turned off when an operating current greater than or equal to a predetermined reference value flows in the corresponding failure detector, and the first to third ground switches may be installed between a plurality of power lines and the earth so that, when the electric leakage or the ground fault occurs in one or more of the plurality of power lines connected to the R-phase, the S-phase, and the T-phase, the corresponding power line is grounded to the earth.

A distribution system for preventing an electric shock and a fire include: a power supply unit configured to provide AC or DC electricity to a load facility; two or more power lines that is electrically connected to the power supply unit and insulated from earth with a resistance value greater than or equal to a predetermined ground resistance value; and the apparatus for preventing an electric shock and a fire described above.

In yet another general aspect, an apparatus for preventing an electric shock and a fire of a photovoltaic power generation system includes: one or more failure detectors that are electrically connected to a solar panel in which one or more solar cell modules are arranged to transmit electricity generated from the solar panel to a load facility, and are electrically connected between at least one of two or more power lines and a neutral point having a potential between voltages of the two or more power lines and earth to detect whether a leakage current occurs between at least one of the two or more power lines insulated from the earth with a resistance value greater than or equal to a predetermined ground resistance value and the earth; and a ground switching unit that is controlled to short-circuit, to the earth, a power line in which the leakage current occurs among the two or more power lines according to the detection result of the failure detector to ground the power line.

The two or more power lines may include first and second DC power lines that transmit DC electricity generated from the solar panel, and the failure detector may include first and second failure detectors that have one end electrically connected to the first and second DC power lines, respectively, and form a current path for a leakage current flowing in the earth to detect the leakage current from the current path.

The ground switching unit may include: a first ground switch that is controlled to ground the second DC power line to the earth when the leakage current flows in the second DC power line according to the detection result of the failure detector; and a second ground switch that is controlled to ground the first DC power line to the earth when the leakage current flows in the first DC power line according to the detection result of the failure detector.

The two or more power lines may include first and second DC power lines that transmit DC electricity generated from the solar panel, the failure detector may include first and second failure detectors that are electrically connected between the first and second DC power lines and the earth, respectively, and in the first and second failure detectors, an operating current may flow at a predetermined reference value or greater in a normal state, and when the leakage current occurs, the operating current may flow to the failure detector connected to a DC power line, through which the leakage current flows, at the predetermined value or less.

The two or more power lines may include first and second DC power lines that transmit DC electricity generated from the solar panel, the failure detector may be electrically connected between a neutral point having a potential between the voltages of the two or more power lines and the earth, and form a current path for a leakage current flowing in the earth to detect the leakage current from the current path, and a power line in which the leakage current occurs may be identified from among the two or more power lines according to a direction of the leakage current flowing through the failure detector.

In still yet another general aspect, a photovoltaic power generation system including the apparatus for preventing an electric shock and a fire includes: a solar panel in which one or more solar cell modules are arranged; two or more power lines that are electrically connected to the solar panel to transmit electricity generated from the solar panel to a load facility and insulated from earth with a resistance value greater than or equal to a predetermined ground resistance value; and the apparatus for preventing an electric shock and a fire described above.

Advantageous Effects

According to an apparatus, method, and distribution system for preventing an electric shock and a fire during electric leakage and ground fault according to the present invention, by detecting a leakage current between a power line, which is insulated from the earth and supplies power, and the earth to limit the detected leakage current to be a dangerous current or less or cutting off the leakage current from flowing in a human body or peripheral facilities, it is possible to prevent the electric shock and the occurrence of the fire due to the leakage current.

In addition, according to the present invention, by detecting a leakage current between a power line, which transmits AC or DC electricity, and the earth and grounding the power line through which the leakage current flows to the earth when the leakage current occurs, it is possible to fundamentally prevent a human body from being electric-shocked by the leakage current flowing in the human body.

In addition, according to the present invention, by detecting a leakage current caused by ground fault or electric leakage occurring in one or more lines and fundamentally preventing the leakage current from flowing in the outside, it is possible to prevent the occurrence of fire due to the ground fault or the electric leakage.

BEST MODE

An embodiment of the present disclosure will be described in detail with reference to the accompanying drawings. The following detailed description is merely an example, and merely illustrates exemplary embodiments of the present invention.

According to the present invention, an apparatus for preventing an electric shock and a fire during electric leakage and ground fault may be applied to electrical facilities and their loads installed in premises or outdoors to prevent electric accidents such as the electric shock or fire caused by a leakage current. Here, the electrical facilities includes all facilities using electricity, such as a power receiving/distribution facility, a transformer, various control panels including a motor control panel, a temporary distribution board, a street light distribution board, a cable reel, and direct current facilities such as sunlight and ESS, in addition to a power receiving/distribution panel, and the load includes electrical equipment, home appliances, disaster prevention equipment, and environmental equipment that use electricity.

The apparatus for preventing an electric shock and a fire of the present invention may be applied to electrical facilities handling not only AC but also DC electricity, and in the case of alternating current, and may be applied to a poly-phase power supply including a three-phase power supply as well as a single-phase power supply in the case of AC. When a leakage current occurs in electrical facilities and loads by flooding due to natural disasters, aging or damage, electric leakage or a ground fault, the apparatus for preventing an electric shock and a fire of the present invention may prevent the electric shock and fire due to the leakage current by limiting the leakage current flowing in the earth to a dangerous current or less and detecting the leakage current.

Figure 1:
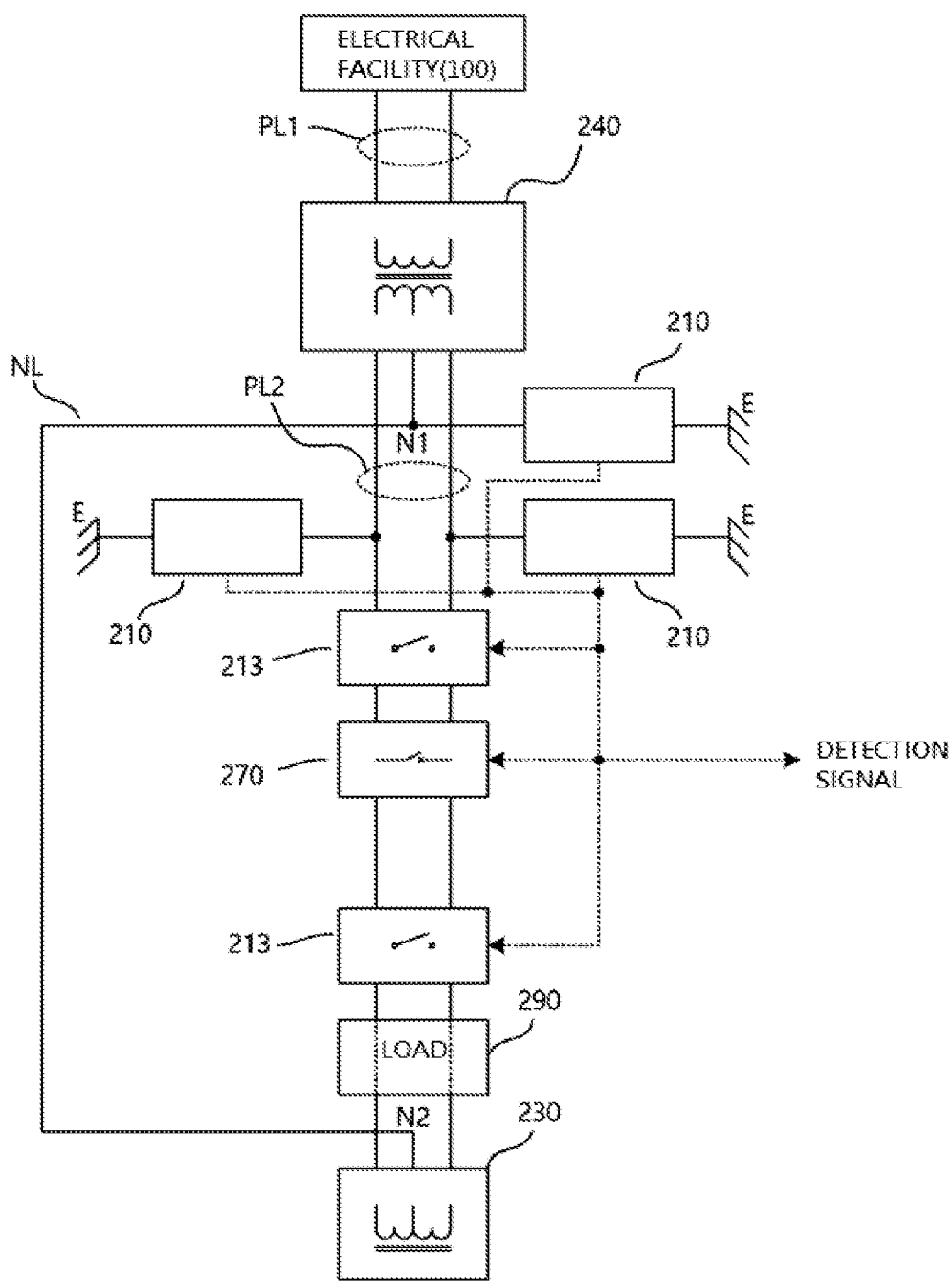
FIG. 1 is a block diagram illustrating the overall configuration of an apparatus for preventing an electric shock and a fire during electric leakage and ground fault according to the present invention.

FIG. 1 is a block diagram illustrating the overall configuration of an apparatus for preventing an electric shock and a fire during electric leakage and ground fault according to the present invention.

Referring to FIG. 1, according to the present invention, an apparatus for preventing an electric shock and a fire during electric leakage and ground fault includes one or more failure detectors 210 that are electrically connected between at least one of two or more power lines PL2 insulated from earth with a resistance value greater than or equal to a predetermined ground resistance value and a first neutral point N1 having a potential between voltages of the two or more power lines PL2 and the earth. In this case, the failure detector 210 is configured to form a current path for a leakage current flowing from two or more power lines PL2 or the first neutral point N1 to the earth due to flooding of at least one of the two or more power lines, caused electric leakage, ground fault, human contact, etc. In addition, the failure detector 210 may be controlled to detect a leakage current flowing between the power line PL2 or the first neutral point N1 and the earth and output a detection signal and to cut off the supply of power to the power line PL2 through which a leakage current flows by interlocking with the detection signal.

The power line PL2 is a conductor that supplies power to a load side 290 or an electricity receiving facility including a power receiving/distribution facility around the load 290, and is a collective term for all conductors that are electrically connected to each other and transmit power having the same phase, including not only separate conductors separated by a circuit breaker 270 or a switch but also a branch line that is connected by the circuit breaker 270, the switch, a switchgear, etc., or is branched from a main line. In this case, it is preferable that the power line PL2 is insulated from earth to have a resistance value greater than or equal to a predetermined ground resistance. Here, the insulation is not limited to the case of complete insulation, and includes the case where the power line PL2 or the neutral point has a larger resistance value than a normal earth resistance with the earth through grounding.

A power supply connected to the power line PL2 may be DC or AC. When the power supply is DC, the power supply may be sunlight or an energy storage system (ESS), and when the power supply is AC, the power supply may include a single-phase or three-phase, or poly-phase method in which voltages of each phase have a predetermined phase difference. Hereinafter, for convenience of description, the single-phase AC method will be mainly described, and the case of three-phase AC and DC power supplies will be additionally described if necessary.

The first neutral point N1 refers to a conduction point having a potential between potentials of two or more power lines PL2, and may be drawn out from a middle tap of a transformer or formed by summing voltages of the power lines PL2 at a predetermined ratio. It is sufficient that the sum of the voltages of the power lines PL2 with respect to the first neutral point N1 is 0, and therefore, the magnitudes of the voltages of the power lines PL2 with respect to the first neutral point N1 are not necessarily the same. However, the description will be made on the assumption that the phase voltages of the power lines PL2 have a different phase from each other but have the same magnitude.

The failure detector 210 is electrically connected between at least one of the two or more power lines PL2 and the first neutral point N1 and earth to form a current path for a leakage current flowing from the two or more power lines PL2 or the first neutral point N1 to the earth. In this case, the failure detector 210 may be controlled to detect the leakage current and output the detection signal, or cut off the supply of power to the power line PL2 or the neutral point through which the leakage current flows by interlocking with the detection signal. Here, the electrical connection includes not only a direct connection, but also an indirect connection through other electrical elements.

The failure detector 210 of the present invention may be installed on the power line PL2 or only on the first neutral point N1, or may be installed on both the power line PL2 and the first neutral point N1. In addition, even when the failure detector 210 is installed only on the power line PL2, the failure detector 210 may be configured to be installed not only on all the power lines PL2 but also on some of the power lines PL2. Preferably, the failure detector 210 may be installed on all the power lines PL2 to detect all leakage currents from the power lines PL2 to the earth, and furthermore, specify the power lines PL2 where the leakage current has occurred.

The apparatus for preventing an electric shock and a fire according to the present invention targets the power line PL2 insulated from the earth with a predetermined resistance value or greater. However, even if the power receiving/distribution line PL1 in FIG. 1 is not insulated from the earth or is insulated, if necessary, for insulation from the power receiving/distribution line PL1, the apparatus for preventing an electric shock and a fire of the present invention may further include an isolation transformer 240 between the power receiving/distribution line PL1 and the power line PL2 in which the failure detector 210 is installed.

The isolation transformer 240 includes a primary side to which the power receiving/distribution line PL1 is connected and a secondary side insulated from the primary side, and the secondary side may be electrically connected to two or more power lines PL2. Therefore, the power line PL2 and the first neutral point N1 are insulated from earth so that the failure detector 210 may be installed. Here, the first neutral point N1 may be drawn out from the middle tap of the secondary winding of the isolation transformer 240, but it may be omitted if the failure detector 210 is to be installed only on the power line PL2. In addition, the isolation transformer 240 may be a single-phase or three-phase transformer, but is not limited thereto and may be a poly-phase transformer wound to output poly-phase.

In addition, the apparatus for preventing an electric shock and a fire according to the present invention may be configured to include an open/close switch 213 and the circuit breaker 270 that are installed in series on the power line PL2 and controlled to cut off power by opening and closing the power line PL2 by interlocking with the detection signal of the failure detector 210. Here, opening/closing the power line PL2 by interlocking with the detection signal means that the open/close switch 213 and the circuit breaker 270 are directly controlled by the detection signal of the failure detector 210 and the opening/closing is controlled by the external control means receiving the detection signal.

The open/close switch 213 and the circuit breaker 270 have the same function in terms of cutting off power, but the circuit breaker 270 has a configuration fundamentally used in power receiving/distribution facilities, and includes an electric leakage circuit breaker, a circuit breaker for wiring, MG/SW, an electromagnetic switch, ACB, VCB, AISS, LBS, etc. Alternatively, the open/close switch 213 may be a non-standard switch means. In particular, the circuit breaker 270 may open and close lines at the same time, and the open/close switch 213 may be configured to individually open and close only lines in which an electrical failure occurs. Therefore, in the apparatus for preventing an electric shock and a fire according to the present invention, the failure detector 210 may be installed so as to specify the power line PL2 through which the leakage current flows due to the electrical failure such as ground fault, electric leakage, or electric shock, and the open/close switch 213 may be configured to selectively cut off the power line PL2 in which the electrical failure has occurred.

Also, as illustrated in FIG. 1, the open/close switch 213 is installed on the input side and the load 290 side of the power line PL2, respectively, to divide the power line PL2 into a predetermined section. In this way, when the leakage current occurs in a predetermined section, the cause may be removed by cutting off only the power line PL2 where the leakage current has occurred in the corresponding section. As will be described later, in this case, the recovered power may be supplied to the load 290 without outage by using the non-cut off power line PL2 and the neutral line NL.

In addition, the apparatus for preventing an electric shock and a fire according to the present invention may be configured to further include a detection/recovery device 230 connected in parallel with the load 290 on the load 290 side of the power line PL2. The detection/recovery device 230 may be configured to detect the electrical failure (leakage current, resistance increase, arc, disconnection, phase loss, unbalanced power, poor connection, misconnection, electric leakage, short circuit, occurrence of abnormal voltage) of the power line PL2, or restore power of the corresponding power line PL2 when one power line PL2 is cut off due to the disconnection, phase loss or leakage current of the power line PL2 and supply the restored power to the load 290. The structure and function of the detection/recovery device 230 will be described later in detail.

Figure 2:
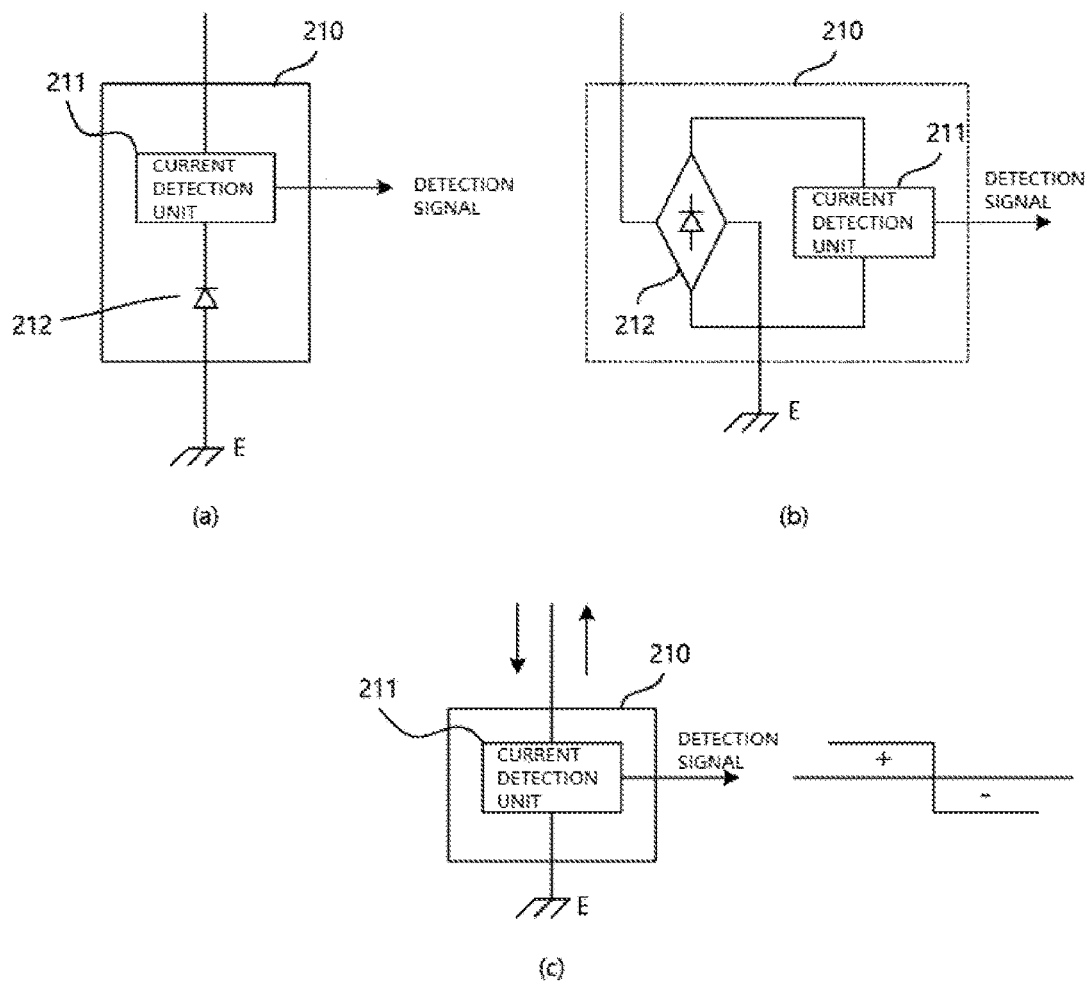
FIG. 2 is a block diagram illustrating an internal block of a failure detector according to the present invention.

FIG. 2 is a block diagram illustrating an internal block of the failure detector 210 according to the present invention.

Referring to FIG. 2, each failure detector 210 according to the present invention includes a current detection unit 211 that limits a leakage current to a predetermined dangerous current or less, and detects the leakage current and outputs a detection signal. In addition, each of the failure detectors 210 may further include a unidirectional current unit 212 that limits a path for the leakage current in a predetermined direction so that the leakage current flows through the current detection unit 211 in one-way direction.

The current detection unit 211 is a component for detecting a leakage current flowing from the power line PL2 or the first neutral point N1 to the earth, and may detect the leakage current and output a detection signal corresponding to the leakage current. The detection signal may be a signal including information on the magnitude and direction of the leakage current, and may be a signal outputting whether the leakage current exceeds a preset threshold value. The detection signal is provided directly to the open/close switch 213 or the circuit breaker 270 installed on the power line PL2, or a separately installed controller 220 controls the open/close switch 213 or the circuit breaker 270 to be open/closed, or a control signal for alarm, fault location indication or fault recovery may be provided to the controller 220 to be output. In this case, the controller 220 may control to issue an alarm signal through an alarm generator 250, or release an alarm when an administrator inputs an alarm release command to an alarm release input device 260.

In addition, the current detection unit 211 may further include a current limiting means (not illustrated) that is disposed in series on a current path through which the leakage current flows so that the leakage current becomes less than or equal to a predetermined dangerous current. In this case, the current limiting means may be configured to have a voltage drop device including a resistive device to limit a current value to a dangerous current or less with respect to a voltage applied to a failure detection unit when the leakage current occurs. Here, the dangerous current is a current that may cause the electric shock to the human body or fire, and may be appropriately set according to the purpose of use of the electrical facility 100. For reference, since it has been known that, when the leakage current flowing into the human body is 15 mA or more, it causes convulsions (pain) and when the leakage current is 50 mA or more, it leads to death, to prevent the electric shock accidents, the dangerous current may be set to 15 mA or less, for example, 8 mA, so the leakage current may be design to be limited to the current value or less.

In addition, the current detection unit 211 may be configured to detect a leakage current at any point on a current path through which the leakage current flows. For example, it is also possible to detect the leakage current by using a voltage applied to the current limiting means or by using a current sensor installed at an arbitrary point in the current path. Here, the current sensor may be configured to include a Hall sensor or a current transformer (CT).

The failure detector 210 according to the present invention may be configured to further include a switch for controlling opening and closing by interlocking with the detection signal. In this case, the switch may operate as the open/close switch 213 described above, and may be provided integrally with the failure detector 210 together with the current detection unit 211. In this case, the integrated switch and current detection unit 211 may be implemented as a solid-state relay (SSR).

The unidirectional current unit 212 is a component that limits a path for the leakage current in a predetermined direction so that the leakage current flows through the current detection unit 211 in one direction, and may be configured to include a switch device or a diode that is controlled to conduct only a current in a predetermined direction. In particular, when the unidirectional current unit 212 is configured as the diode, it may be in the form of a rectifier circuit including one or more diodes (FIG. 2(a)), or may be configured as a bridge diode circuit (FIG. 2(b)).

The failure detector 210 configured to include the unidirectional current unit 212 may be installed on the power line PL2 in the case of AC power or installed at the first neutral point N1 in the case of DC power to identify the power line PL2 through which the leakage current flows.

That is, the failure detector 210 configured to include the unidirectional current unit 212 may be installed on the power line PL2 or installed at a neutral point N to identify the power line PL2 through which the leakage current flows according to the direction of the leakage current. In this case, the failure detector 210 may detect in which any power line of the two or more power lines PL2 the leakage current occurs through the unidirectional current unit 212 configured to flow the leakage current in different directions.

In addition, the failure detector 210 according to the present invention may be configured to detect the power line PL2 in which the leakage current has occurred without using the unidirectional current unit 212.

Referring to FIG. 2C, the current detection unit 211 may be configured to identify the direction of the leakage current flowing through the failure detector 210. For example, as illustrated in FIG. 2(c), the current detection unit 211 may output different types of detection signals, i.e., detection signals of different polarities, depending on the direction of the leakage current, and identify which power line is the power line PL2 through which the leakage current flows based on the detection signal.

Figure 3:
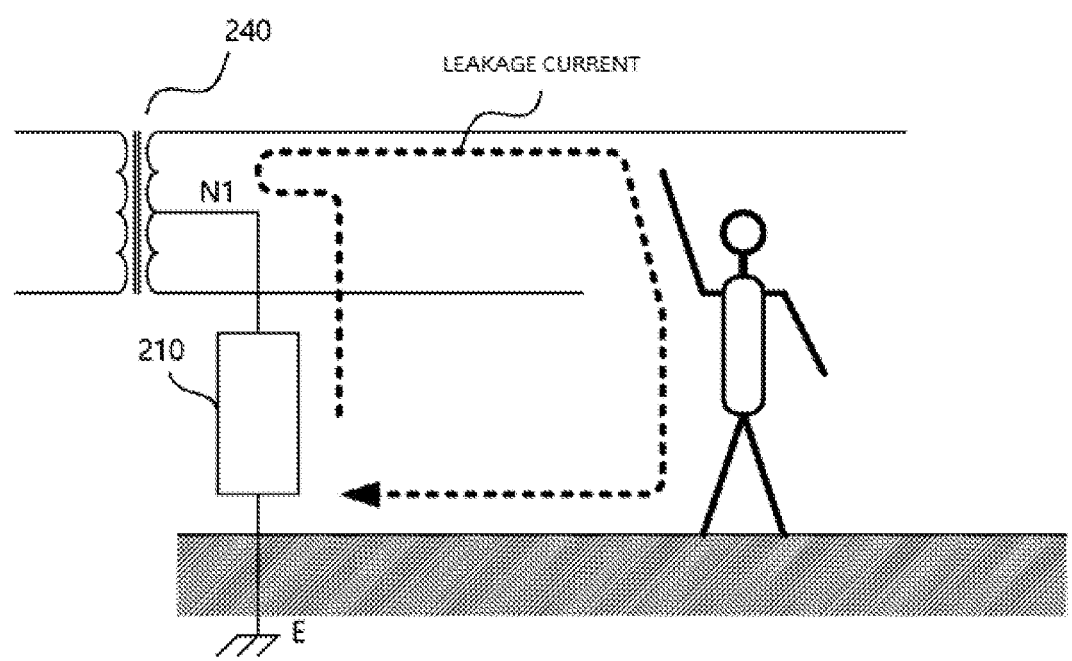
FIG. 3 is a conceptual diagram illustrating a principle of an apparatus for preventing an electric shock and a fire according to a first embodiment of the present invention to detect a leakage current.

FIG. 3 is a conceptual diagram illustrating a principle of an apparatus for preventing an electric shock and a fire according to a first embodiment of the present invention to detect a leakage current.

Referring to FIG. 3, the apparatus for preventing an electric shock and a fire according to the present invention may be configured to include the failure detector 210 installed between the first neutral point N1 having the potential between the voltages of power lines PL2 and the earth. In order to insulate the power line PL2 from the earth, the isolation transformer 240 may be installed between the power receiving/distribution line PL1 and the power line PL2, and the power line PL2 and the first neutral point N1 may be drawn out from the secondary side of the isolation transformer 240.

When the ground fault or human contact occurs in any one of the two or more power lines PL2 and thus the leakage current flows, the leakage current flows in the first neutral point N1 through the failure detector 210 as illustrated in FIG. 3. In this case, the failure detector 210 detects the leakage current while limiting the leakage current to a current or less harmless to the human body. FIG. 3 illustrates a case in which the leakage current occurs in one of the single-phase power lines PL2, but even in the case of the remaining power lines PL2 or three-phase, the failure detector 210 may detect the leakage current in a similar manner.

As illustrated in FIG. 3, the failure detector 210 connected to the first neutral point N1 for AC power does not need to include the unidirectional current unit 212 and detects the presence or absence of the leakage current regardless of the power line PL2 in which the leakage current occurs. However, in the case of DC power, by installing the failure detector 210 including the unidirectional current unit 212 at the first neutral point N1, it is possible to identify and detect not only the occurrence of the leakage current but also the power line PL2 in which the leakage current has occurred. In this case, the failure detector 210 is connected in parallel, and the current direction of each unidirectional current unit 212 of the failure detector 210 is set in a reverse direction, or it is possible to identify the power line PL2 in which the leakage current occurs by using the failure detector 210 including the unidirectional current unit 212 in the form of a bridge diode illustrated in FIG. 2(b).

Figure 4:
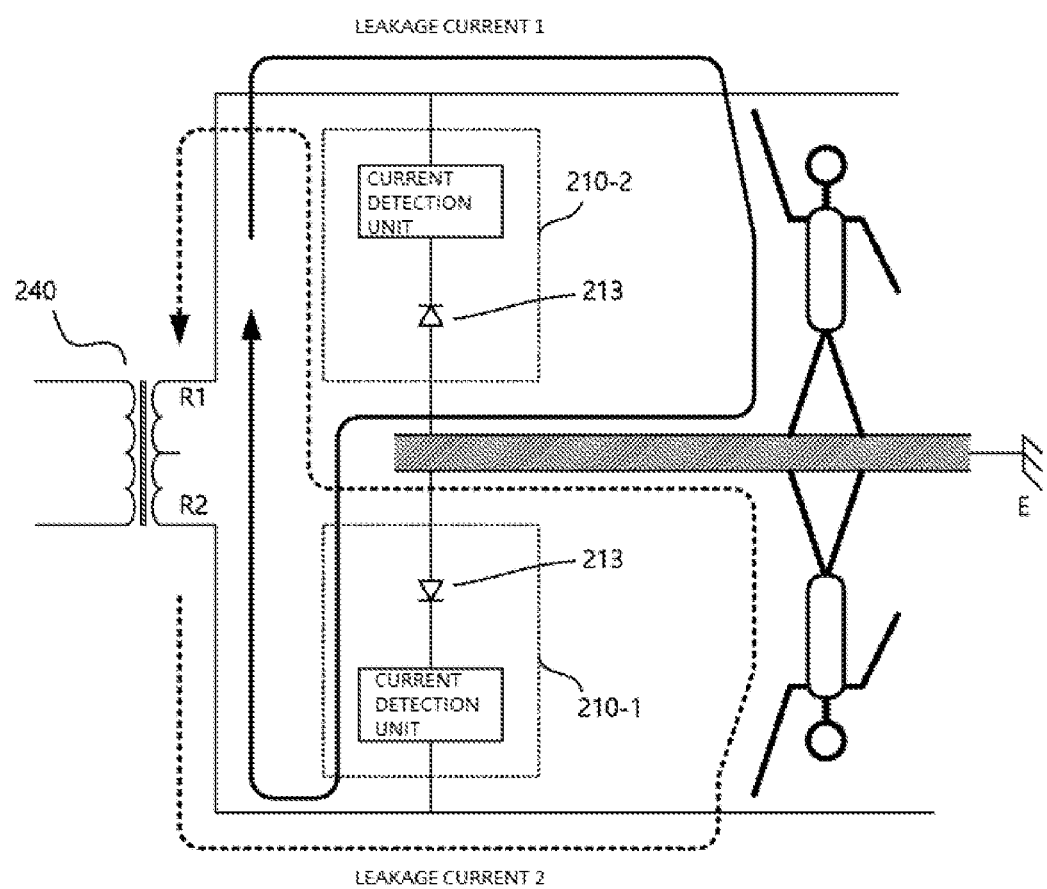
FIG. 4 is a conceptual diagram illustrating a principle of an apparatus for preventing an electric shock and a fire according to a second embodiment of the present invention to detect a leakage current.

FIG. 4 is a conceptual diagram illustrating a principle of detecting a leakage current by identifying the power line through which the leakage current flows by an apparatus for preventing an electric shock and a fire according to a second embodiment of the present invention.

Referring to FIG. 4, the apparatus for preventing an electric shock and a fire according to the second embodiment of the present invention is configured to include first and second failure detectors 210-1 and 210-2 respectively connected between a power line having single-phase voltages R1 and R2 and earth. In this case, the first and second failure detectors 210-1 and 210-2 include a unidirectional current unit 212, and the current direction allowed by the unidirectional current unit 212 is set between the single-phase voltages R1 and R2 in a reverse direction to prevent a current from flowing between both ends of the single-phase voltages R1 and R2.

According to FIG. 4, when leakage current 1 occurs on R1 of the power line, a current path through which the leakage current 1 flows in the first failure detector 210-1 along the solid line illustrated in the drawings is formed, and when leakage current 2 occurs on R2 of the power line, a current path through which the leakage current 2 flows in the second failure detector 210-2 along a broken line is formed. Accordingly, the first failure detector 210-1 outputs the detection signal to the power line in which the leakage current 1 has occurred and the second failure detector 210-2 outputs the detection signal to the power line in which the leakage current 2 has occurred, so the apparatus for preventing an electric shock and a fire of the present invention may identify and detect the power line in which the leakage current has occurred.

In the above, the case of the single-phase AC has been described as an example, but the detection principle is not limited thereto, and may be applied to a poly-phase power supply including three-phase or more power supplies. In other words, the failure detector of the present invention may be electrically connected between each of the two or more power lines and the earth, and may be configured so that the leakage current flowing in any one of the two or more power lines is detected in the failure detector connected to the remaining power lines among the failure detectors.

By the configuration described above, the apparatus for preventing an electric shock and a fire of the present invention may identify and cut off the power line through which the leakage current flows to prevent damage to the human body and fire. In addition, the apparatus for preventing an electric shock and a fire of the present invention selectively cuts off only the power line in which the leakage current occurs, so that it is possible for the detection/recovery device 230 of the present invention using the unblocked power line and the first neutral point N1 to restore the cut-off power and supply the restored power to the load 290.

In general, the detection/recovery device 230 of the present invention may be configured to include a second neutral point N2 that is connected to the first neutral point N1, and two or more windings that have one end connected to each of two or more power lines and the other end commonly connected to the second neutral point N2. In this case, each of the two or more windings includes at least one coupling winding portion magnetically coupled to any one of the remaining windings, and at least one winding of the two or more windings is configured to include a coupling winding portion in which voltages having phases opposite to those of voltages applied to each of the remaining windings are induced with respect to the second neutral point N2, respectively.

Figure 5:
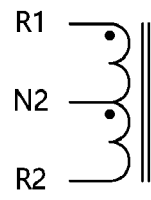
FIG. 5 is a diagram illustrating a configuration and vector diagram of a detection/recovery device of the present invention applicable to a single-phase power supply.
Figure 5:
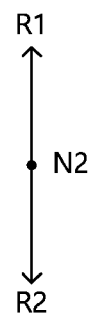

FIG. 5 is a diagram illustrating a configuration and a vector diagram of the detection/recovery device 230 of the present invention applicable to the single-phase power supply.

Referring to FIG. 5(a), the detection/recovery device 230 applied to a single-phase voltage may be configured to include first and second windings R1-N2 and R2-N2 that have one end connected to each of the single-phase voltages and the other end commonly connected to the second neutral point N2. In this case, as illustrated in FIG. 5(b), the first and second windings R1-N2 and R2-N2 are magnetically coupled to each other so that voltages having phases opposite to each other are induced with respect to the second neutral point N2. Therefore, when a leakage current occurs in the R1 or R2 side of the single-phase voltage and thus the corresponding line (e.g., R2) is forcibly cut off, a normal voltage may be supplied to the load 290 by restoring the cut off portion using the remaining normal lines (e.g., R1) and the second neutral point N2.

The single-phase detection/recovery device 230 of the present invention has a kind of single winding transformer structure, but is not limited to the case in which a winding ratio of the first winding R1-N2: the second winding R2-N2 is limited to 1:1, but may be variously set and manufactured if necessary. However, when the detection/recovery device 230 and the isolation transformer 240 are electrically connected through the power line, it is preferable to set the winding ratio of the detection/recovery device 230 according to the winding ratio of the corresponding isolation transformer 240.

The detection/recovery device 230 of the present invention can also be applied to a three-phase power supply.

Figure 6:
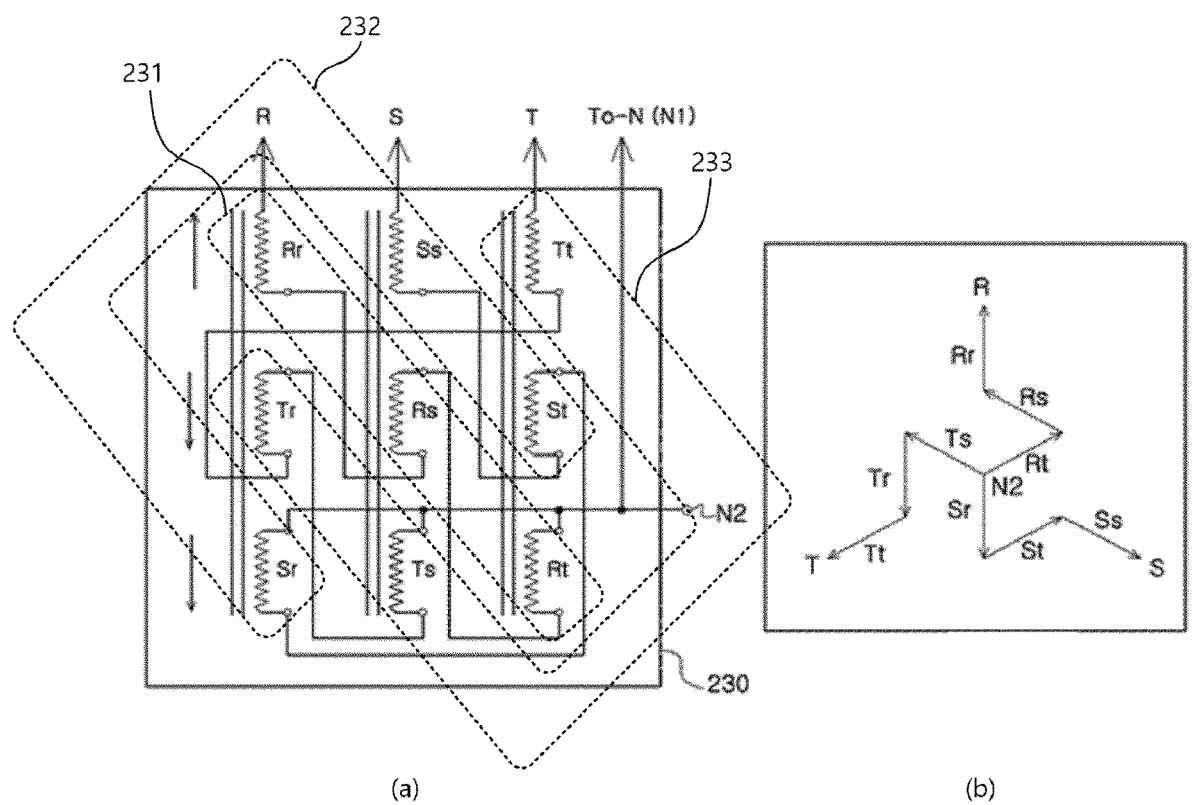
FIG. 6 is a diagram illustrating an exemplary configuration and vector diagram of a detection/recovery device applicable to a three-phase power supply.

FIG. 6 is a diagram illustrating an exemplary configuration and vector diagram of the detection/recovery device 230 applicable to the three-phase power supply.

Referring to FIG. 6(a), the detection/recovery device 230 of the present invention applicable to the three-phase power supply includes first to third windings 231, 232, and 233 that have one end connected to each of R, S and T-phases for three-phase power having R, S and T-phases, and the other end commonly connected to the second neutral point N2, and each of the first to third windings 231, 232, and 233 may be configured to include the coupling winding portion in which voltages of having phases opposite to those of the voltages applied to the remaining windings are induced with respect to the second neutral point N2, respectively.

According to the configuration of FIG. 6(a), three coupling winding portions are provided in the first winding 231 connected to the R-phase, and voltages having Rr, Rs and Rt vectors are induced in each coupling winding portion. In addition, three coupling winding parts are provided in the second winding 232 connected to the S-phase, and voltages having Ss, St, and Sr vectors are induced in each coupling winding part. In addition, three coupling winding parts are provided in the third winding 233 connected to the T-phase, and voltages having Tt, Tr, and Ts vectors are induced in each coupling winding part.

In the three-phase power supply, the sum of the R, S, and T vectors, respectively, is 0, so the relationship between the voltages having the R, S, and T-phase is expressed by Equation 1.

$$R+S+T=O \qquad \text{[Equation 1]}$$

When a three-phase voltage is applied to the first to third windings 231, 232, and 233, respectively, since the voltage induced in the first to third windings 231, 232, and 233 with respect to the second neutral point N2 is equal to the sum of the voltages induced in the coupling winding portions provided in each winding, it is expressed as a vector expression as shown in Equations 2 to 4.

$$R=Rr+Rs+Rt \qquad \text{[Equation 2]}$$

$$S=Ss+St+Sr \qquad \text{[Equation 3]}$$

$$T=Tt+Tr+Ts \qquad \text{[Equation 4]}$$

In order to help the understanding of Equations 1 to 4 above, the vector diagram of induced voltages is illustrated in FIG. 6(b).

Referring to FIG. 6(b), each winding is configured to include the coupling winding portion in which voltages having phases opposite to those of the voltages applied to each of the remaining windings are induced with respect to the second neutral point N2, respectively. In other words, in the case of the first winding 231, the coupling winding portion that induces the voltages of the Rs and Rt vectors induces voltages having phases opposite to those of the S-phase and T-phase, respectively. In the case of the second winding 232, the voltages of the Sr and St vectors have phases opposite to those of the voltages of the R-phase and T-phase, respectively. In addition, in the case of the third winding 233, the voltages of the Tr and Ts vectors have phases opposite to those of the voltages of the R-phase and S-phase, respectively.

Furthermore, the coupling winding portion that induces the voltage of the Rr vector among the coupling winding portions of the first winding 231 induces voltages having phases opposite to those of the coupling winding portion of Tr and the coupling winding portion of Sr. Similarly, the Ss vector in the second winding 232 has phases opposite to the Rs and Ts, and the Tt vector in the third winding 233 has phases opposite to the St and Rt vectors. If the relationship between the voltages induced in the coupling winding portion is arranged in a vector expression, it is as shown in the following Equations 5 to 7.

$$Rr==-Sr==-Tr \qquad \text{[Equation 5]}$$

$$Ss==-Ts=-Rs \qquad \text{[Equation 6]}$$

$$Tt=-Rt==-St \qquad \text{[Equation 7]}$$

Even if any one of the R, S, and T-phases applied to the first to third windings 231, 232, and 233 is lost due to disconnection or other electrical failures, the detection/recovery device 230 of the present invention, which is configured to satisfy the above conditions, may recover a phase-lost voltage by the remaining phases and supply the recovered voltage to the load 290.

While the power line of the three-phase voltage R, S, and T is operating by connecting to the first to third windings 231, 232, and 233 of the detection/recovery device 230, it is assumed that any one phase (e.g., R-phase) is disconnected/lost due to the electrical failure. In this case, since the S and T-phases are normally applied to the second winding 232 and the third winding 233 that are not disconnected, the relational expressions of Equations 3 to 7 are established. However, since the R-phase is not applied to the first winding 231, it can be seen that Equation 2 is not valid, and an unknown voltage X defined in Equation 8 is induced in the first winding 231.

$$X = Rr + Rs + Rt \qquad \text{[Equation 8]}$$

Hereinafter, it will be mathematically examined whether the unknown voltage X induced in the first winding 231 having the lost phase restores the lost R-phase.

By arranging S and T expressed in Equations 3 and 4 with respect to Rr, Rs, and Rt using Equations 5 to 7, Equation 9 below can be obtained.

$$Rr = -\frac{1}{2}(S+T) \qquad \text{[Reaction 9]}$$

In addition, when all the coupling winding portions of the detection/recovery device 230 have the same winding ratio, magnitudes of voltages induced in each coupling winding portion are equal to each other as shown in Equation 10 below.

$$|Rr|=|Rs|=|Rt|=|Sr|=|Ss|=|St|==-Tr|=|Ts|=|Tt| \qquad \text{[Equation 10]}$$

Equation 11 may be obtained by obtaining Rs+Rt using Equation 10 and Equations 3 to 7 above.

$$Rs + Rt = -\frac{1}{2}(S+T) \qquad \text{[Equation 11]}$$

Substituting Equations 9 and 11 into Equation 8 and arranging these Equations 9 and 11 using Equation 1, the unknown voltage X induced in the first winding 231 whose R-phase was lost is obtained by Equation 12.

$$X = Rr + Rs + Rt = -\frac{1}{2}(S+T) - \frac{1}{2}(S+T) = -(S+T) = R \qquad \text{[Equation 12]}$$

It can be seen from Equation 12 that, even if the R-phase to be applied to the first winding 231 is lost, the detection/recovery device 230 of the present invention uses the S and T-phases applied to the second and third windings 232 and 233 to recover the voltage having the R-phase on the first winding 231.

In the above, the case when the R-phase is lost in the first winding 231 of the detection/recovery device 230 is described as an example, but power may be recovered in the same way even when the phase loss occurs in the S-phase or the T-phase applied to the second and third windings 232 and 233.

FIG. 6 illustrates a structure in which the first to third windings 231, 232, and 233 of the detection/recovery device 230 each include three coupling winding portions, but the detection/recovery device 230 of the present invention is not limited thereto, and may be changed in various forms as long as at least one of the first to third windings 231, 232, and 233 have a structure including a coupling winding portion in which voltages having phases opposite to those of each voltage applied to the remaining windings are induced, respectively.

For example, although not illustrated in the drawing, the detection/recovery device 230 of the present invention may have a structure in which the coupling winding portions corresponding to Rr, Ss and Tt provided in the first to third windings 231, 232, and 233 are omitted in the configuration of FIG. 6. Using a proof process similar to Equations 1 to 12, it can be seen that the voltage is normally restored to a phase-lost winding in this structure as well.

Also, the detection/recovery device 230 of the present invention may be configured to have a simpler structure for the three-phase power supply.

Figure 7:
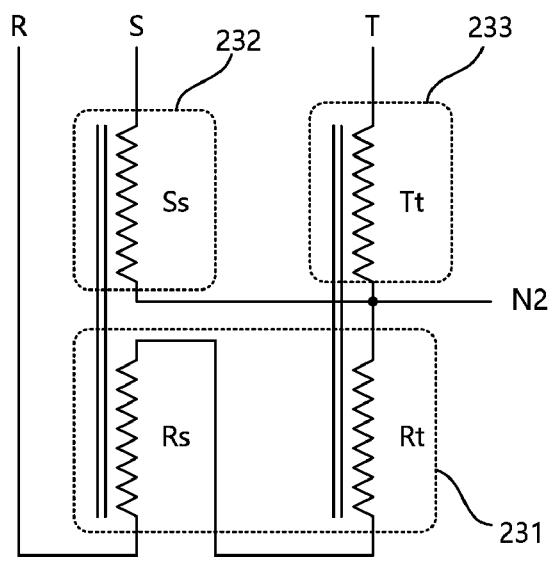
FIG. 7 is a diagram illustrating another exemplary configuration and vector diagram of the detection/recovery device applicable to the three-phase power supply.
Figure 7:
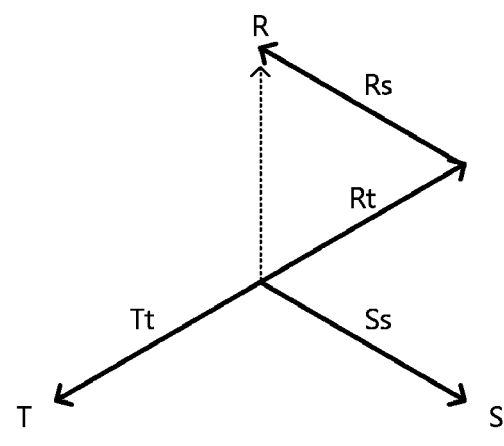

FIG. 7 is a diagram illustrating another exemplary configuration and vector diagram of the detection/recovery device 230 applicable to the three-phase power supply.

Referring to FIG. 7, the detection/recovery device 230 of the present invention includes the first to third windings 231, 232, and 233 that have one end connected to each of the R, S and T-phases, and the other end commonly connected to the second neutral point N2, and one of the first to third windings 231, 232, and 233 may be configured to include the coupling winding portion in which voltages of having phases opposite to those of the voltages applied to the remaining windings are induced with respect to the second neutral point N2, respectively. The detection/recovery device 230 of FIG. 7(a) includes the coupling winding in which the voltages of the Rs and Rt vectors are induced in the first winding 231 to which the R-phase is applied, and the Rs and Rt have voltages having phases opposite to the S and T-phases of the second and third windings 232 and 233, respectively. FIG. 7(b) illustrates a vector diagram showing such a relationship.

As previously demonstrated mathematically the principle of the detection/recovery device 230 having the structure of FIG. 6(a) to recover the lost phase, the principle of recovering the lost phase may be examined through a similar process for the structure of FIG. 7(a).

In the three-phase power supply, the sum of the R, S, and T vectors, respectively, is 0, so when the relationship between the voltages of the R, S, and T-phases is expressed as in Equation, Equation 13 identical to Equation 1 may be obtained.

$$R+S+T=O \qquad \text{[Equation 13]}$$

The voltages applied to or induced in the first to third windings 231, 232, and 233 with respect to the second neutral point N2 are expressed as the vector expression as shown in Equations 14 to 16 below.

$$R = Rs + Rt \qquad \text{[Equation 14]}$$

$$S = Ss \qquad \text{[Equation 15]}$$

$$T = Tt \qquad \text{[Equation 16]}$$

In order to help the understanding of Equations 14 to 16 above, the vector diagram of induced voltages is illustrated in FIG. 7(b). Referring to FIG. 7(b), it can be seen that the coupling winding portion in which the voltages of the Rs and Rt vectors are induced in the first winding 231 induces voltages having phases opposite to the S-phase and T-phase, respectively.

Furthermore, among the coupling winding portions of the first winding 231, the coupling winding portion in which the voltage of the Rs vector is induced induces a voltage having a phase opposite to that of the coupling winding portion of Ss, and the coupling winding portion in which the voltage of the Rt vector is induced induces a voltage having a phase opposite to the coupling winding portion of Tt. As described above, if the relationship between the voltages induced in the coupling winding portion is arranged in the vector expression, it is as shown in the following Equations 17 and 18.

$$Rs = -Ss \quad \text{[Equation 17]}$$

$$R = -Tt \quad \text{[Equation 18]}$$

Even if any one of the R, S, and T-phases applied to the first to third windings 231, 232, and 233 is lost due to disconnection or other electrical failures, the detection/recovery device 230 of the present invention, which is configured to satisfy the above conditions, may recover a phase-lost voltage by the remaining phases and supply the recovered voltage to the load 290.

While the power line of the three-phase voltage R, S, and T is operating by connecting to the first to third windings 231, 232, and 233 of the detection/recovery device 230, it is assumed that any one phase (e.g., R-phase) is disconnected/lost due to the electrical failure. In this case, since the S and T-phases are normally applied to the second winding 232 and the third winding 233 that are not disconnected, the relational expressions of Equations 15 to 18 are established. However, since the R-phase is lost in the first winding 231, it can be seen that Equation 14 is not valid, and an unknown voltage X defined in Equation 19 is induced in the first winding 231.

$$Xr = Rs + Rt \quad \text{[Equation 19]}$$

Substituting Equations 17 and 18 into Equation 19 and arranging these Equations 17 and 18 using Equation 13, the unknown voltage Xr induced in the first winding 231 whose R-phase was lost is obtained by Equation 20.

$$Xr = Rs + Rt = -(Ss + Tt) = -(S + T) = R \quad \text{[Equation 20]}$$

Similarly, the case in which the S-phase or the T-phase is lost in the second winding 232 or the third winding 233 is also obtained by the following Equations 21 and 22.

$$Xs = Ss = -(R + Tt) = -(R + T) = S \quad \text{[Equation 21]}$$

$$Xt = Tt - (R + Ss) = -(R + S) = T \quad \text{[Equation 22]}$$

It can be seen from Equations 20 to 22 that, even if the phase loss or the disconnection occurs in any one of the first to third windings 231, 232, and 233, As illustrated in the vector diagram of FIG. 7(*b*), the detection/recovery device 230 having the structure illustrated in FIG. 7(*a*) recovers the phase-lost voltage by using the voltage applied to the remaining windings. In particular, the detection/recovery device 230 having the structure illustrated in FIG. 7 may include only two magnetic cores instead of three magnetic cores for magnetic coupling, and thus, there is an advantage in that the winding structure may be simple to reduce the process and cost during production.

The detection/recovery device 230 of the present invention is not limited to the structure described above, and may be changed into various forms as long as at least one of the first to third windings 231, 232, and 233 have a structure including a coupling winding portion in which voltages having phases opposite to those of each voltage applied to the remaining windings are induced, respectively.

Figure 8:
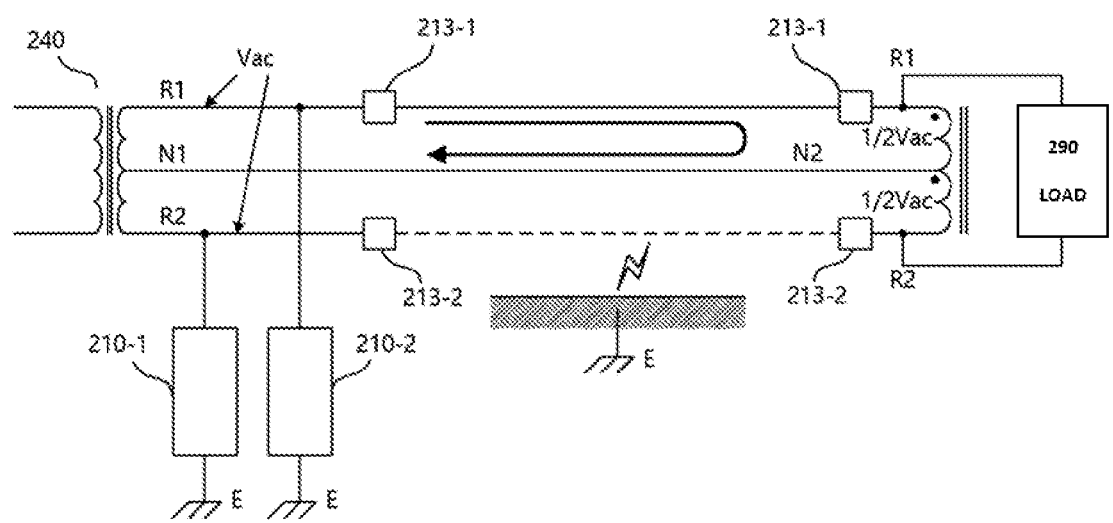
FIG. 8 is a circuit diagram of the apparatus for preventing an electric shock and a fire according to the present invention to which the failure detector and the detection/recovery device are applied at the same time.

FIG. 8 is a connection diagram of the apparatus for preventing an electric shock and a fire according to the present invention to which the failure detector 210 and the detection/recovery device 230 are applied at the same time.

Referring to FIG. 8, an apparatus for preventing an electric shock and a fire according to the present invention may be configured to include the detection/recovery device 230 that is electrically connected to the load 290 side of the first neutral point N1 and the single-phase voltages R1 and R2, the first and second failure detectors 210-1 and 210-2 respectively connected between the R2 phase and the R1 phase of the single-phase voltages R1 and R2 and the earth, and first and second open/close switches 213-1 and 213-2 provided on the power supply side and the load 290 side of the single-phase voltages R1 and R2 to divide the power line into predetermined sections. Accordingly, in the normal operation state in which the electrical failure such as the leakage current does not occur, a voltage Vac by the single-phase voltages R1 and R2 is applied to the load 290 and the detection/recovery device 230, so the load 290 may operate normally.

However, as illustrated in FIG. 8, when the leakage current occurs in the line on the R2 divided by the second open/close switch 213-2, the leakage current is detected by the second failure detector 210-2 connected to R1 and the detection signal is output. In addition, the second open/close switch 213-2 interlocks with the detection signal of the output second failure detector 210-2, and thus, the second open/close switch 213-2 blocks the divided predetermined section of the R2-phase line.

Even if the R2 phase is cut off due to the leakage current, ½Vac is applied to an R1 terminal and the second neutral point N2 of the detection/recovery device 230 by the non-cut off R1 phase and the first neutral point N1, and ½Vac is restored between an R2 terminal and the second neutral point N2 of the detection/recovery device 230 according to the recovery principle described above. Therefore, even if the R2 phase is cut off by the leakage current, the load 290 may be continuously supplied with Vac by the detection/recovery device 230 and operate normally.

FIG. 8 shows a case where the leakage current occurs in the line on R2, but even when the leakage current occurs on R1, the apparatus for preventing an electric shock and a fire of the present invention may perform similar detection, cut off, and recovery operations.

Hereinafter, embodiments in which the apparatus for preventing an electric shock and a fire of the present invention are applied to the electrical facility 100 are presented as exemplary connection diagrams. The following detailed description and connection diagrams are merely exemplary, and are modified and applied in more various forms, which is only within the scope of the creative ability of a person skilled in the art.

Figure 9:
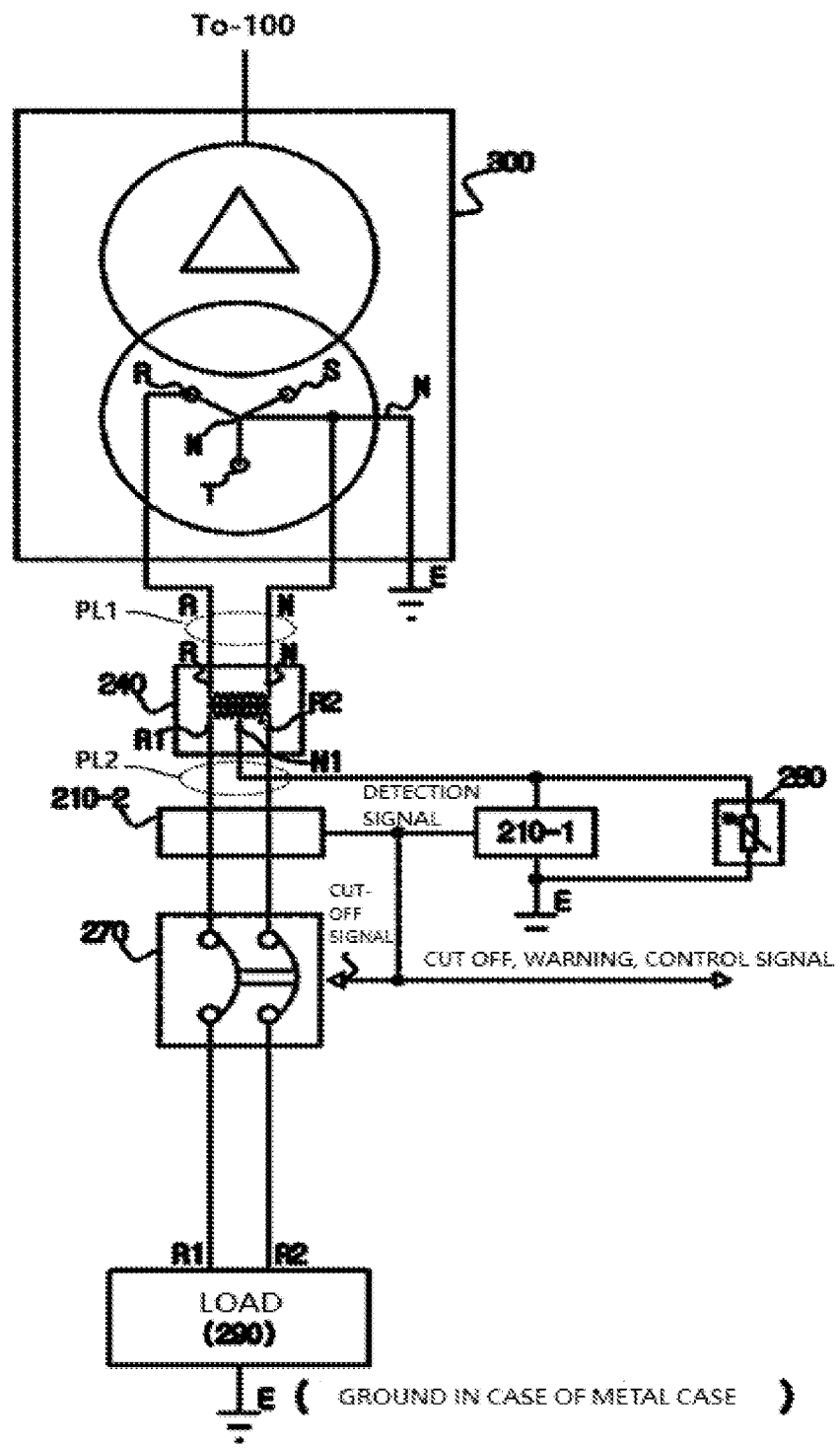
FIG. 9 is a connection diagram in which the apparatus for preventing an electric shock and a fire according to the present invention is applied to the single-phase power supply.

FIG. 9 is a connection diagram in which the apparatus for preventing an electric shock and a fire according to the present invention is applied to the single-phase power supply.

Referring to FIG. 9, the apparatus for preventing an electric shock and a fire according to the present invention may include the isolation transformer 240 in order to insulate the power line PL2 and the first neutral point N1 from the power receiving/distribution line PL1 drawn out from a grounded main transformer 300 with a resistance value greater than or equal to the earth resistance value, and the first failure detection 210-1 provided between the first neutral point N1 and the earth. Also, alternatively or additionally, it is possible to install the second failure detector 210-2 between the power line PL2 and the earth.

In addition, in order to protect the electrical facility 100 from the surge voltage, a surge protector 280 may be installed between at least one of the power line PL2 and the first neutral point N1 and the earth. The power line PL2 and the first neutral point N1 to which the apparatus for preventing an electric shock and a fire according to the present invention is applied are configured to have a resistance value greater than or equal to the earth and the ground resistance, and thus, the power line PL2 and the first neutral point N1 may be vulnerable to the surge voltage such as lightning, so the surge protector 280 may supplement the surge voltage.

In addition, the apparatus for preventing an electric shock and a fire according to the present invention receives the detection signal from the failure detectors 210-1 and 210-2 although not illustrated in FIG. 9 to determine whether there is a failure, and may further include the controller 220 that outputs a control signal in response to the determination. In this case, the control signal may include at least one of a cut off signal for cutting off power from a leakage current, an alarm signal for issuing an alarm that an electrical failure has occurred, a location signal for displaying a failure section or a location, and a recovery signal for recovering a failure.

Therefore, the circuit breaker 270, the open/close switch 213, etc., that are installed in the power line PL2 may be controlled to cut off the supply of power by the detection signals of the failure detectors 210-1 and 210-2 or the control signal of the controller 220 that has received the detection signals when the leakage current occurs.

Figure 10:
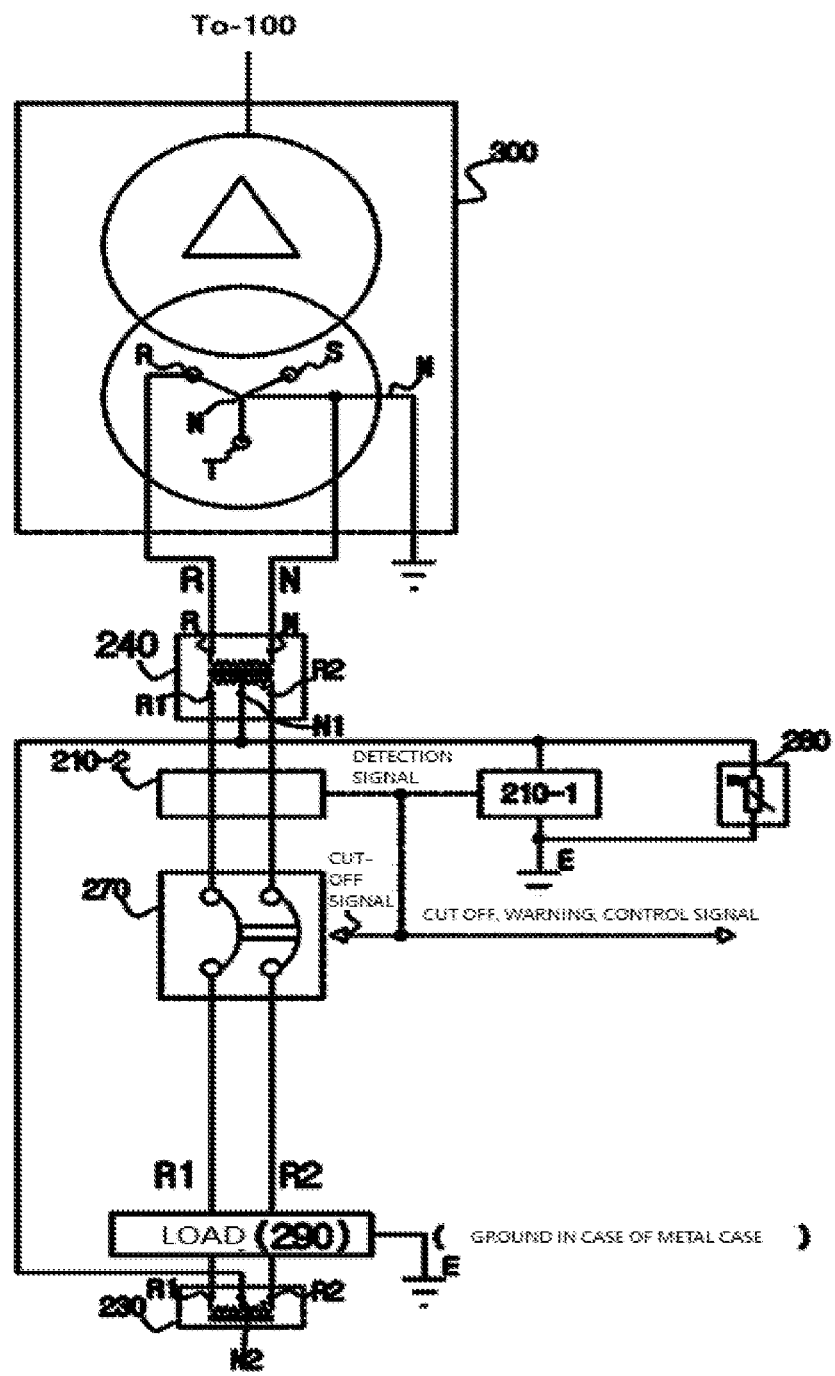
FIG. 10 is a connection diagram in which the apparatus for preventing an electric shock and a fire according to the present invention including the detection/recovery device is applied to the single-phase power supply.

FIG. 10 is a connection diagram in which an apparatus for preventing an electric shock and a fire according to the present invention including the detection/recovery device 230 is applied to the single-phase power supply.

The apparatus for preventing an electric shock and a fire of the present invention illustrated in FIG. 10 further includes the detection/recovery device 230 in the configuration of FIG. 9. The detection/recovery device 230 connected in parallel to the load 290 side of the power line PL2 may operate to detect the electrical failure (leakage current, resistance increase, arc, disconnection, phase loss, unbalanced power, poor connection, misconnection, electric leakage, short circuit, occurrence of abnormal voltage) of the power line PL2, or restore power of the corresponding power line PL2 when one power line PL2 is cut off due to the disconnection, phase loss or leakage current of the power line PL2 and restore the power of the corresponding power line PL2 to supply the restored power to the load 290.

Figure 11:
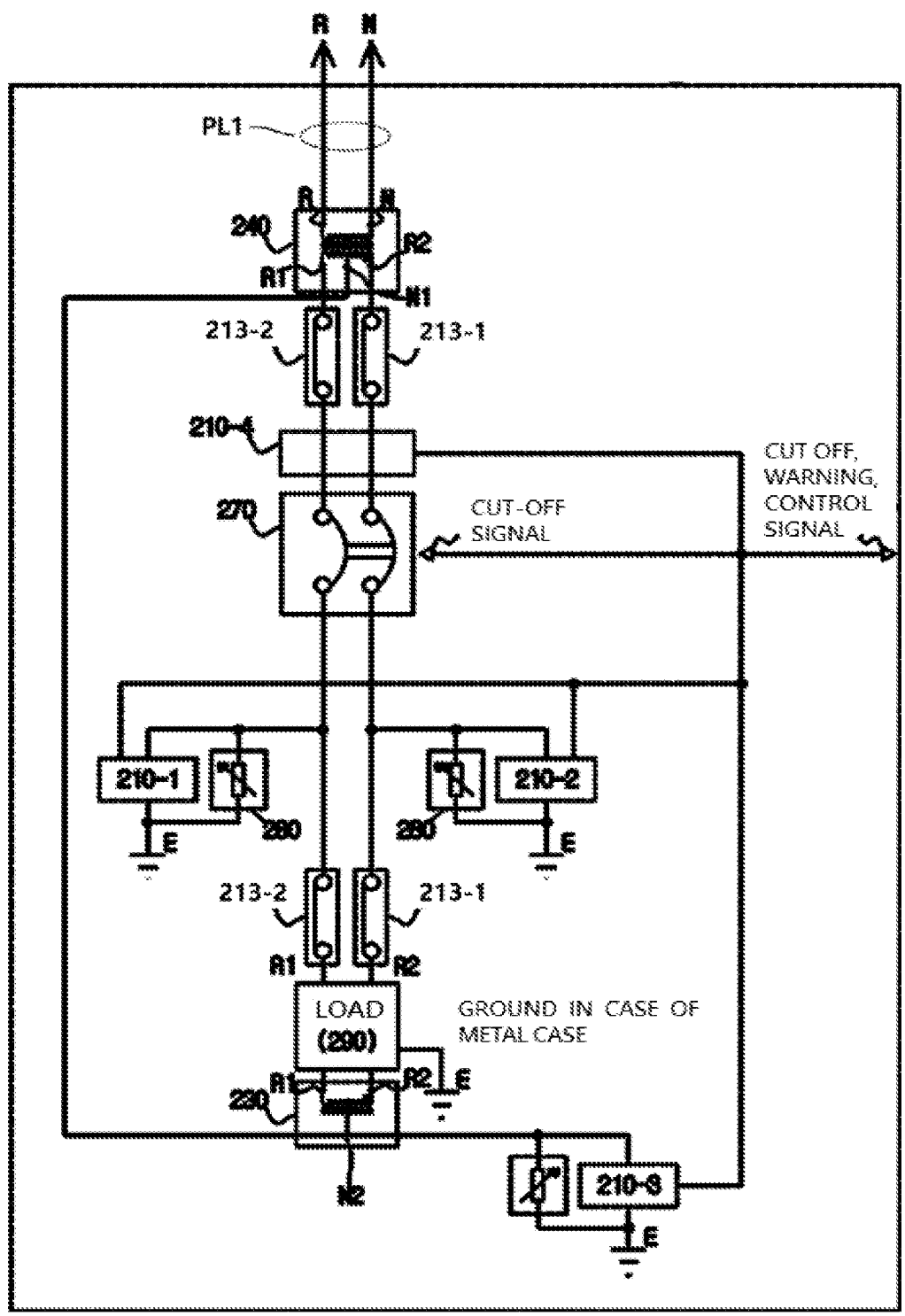
FIG. 11 is another connection diagram in which the apparatus for preventing an electric shock and a fire according to the present invention including the detection/recovery device is applied to the single-phase power supply.

FIG. 11 is another connection diagram in which an apparatus for preventing an electric shock and a fire according to the present invention including the detection/recovery device 230 is applied to the single-phase power supply.

Referring to FIG. 11, the apparatus for preventing an electric shock and a fire of the present invention may include the isolation transformer 240 for electrically insulating the power receiving/distribution line PL1 and the power line PL2. Here, the power receiving/distribution line PL1 may be a line grounded to the earth, but also includes a line already insulated from the earth by the isolation transformer 240.

In addition, the apparatus for preventing an electric shock and a fire of the present invention may be configured to include the open/close switches 213-1 and 213-2 capable of opening and closing the power line PL2 for each line. Since the interlocking relationship between the open/close switches 213-1 and 213-2 and the failure detectors 210-1 to 210-4 is the same as described above, a detailed description thereof will be omitted. In addition, the failure detectors 210-1 to 210-4 may be electrically connected to at least one of the power line PL2 and the first neutral point N1, and the second neutral point N2 connected to first neutral point N1 by the neutral line NL, and if necessary, the plurality of fault detectors 210-1 to 210-4 may be installed in parallel on the same line.

Figure 12:
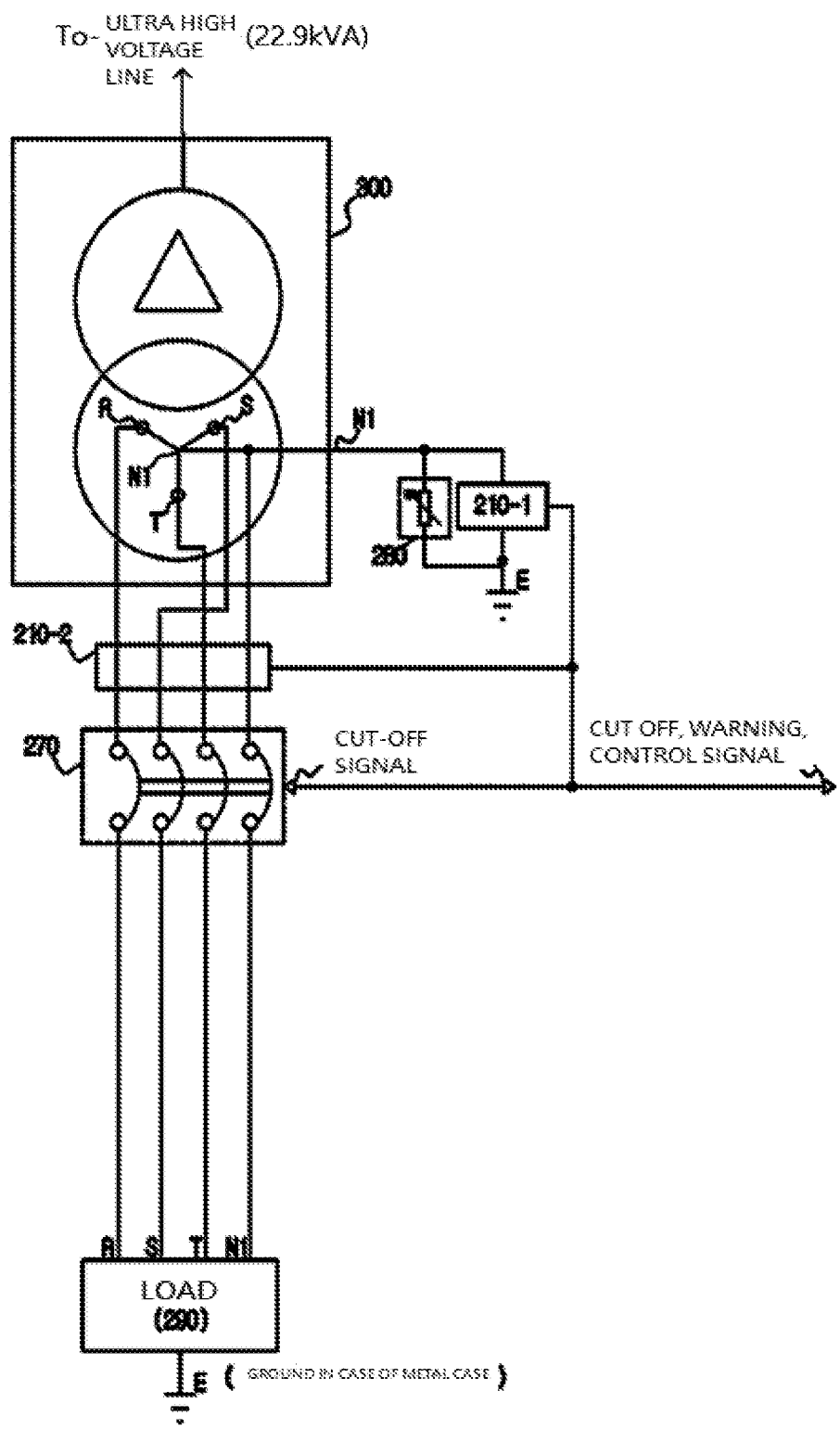
FIG. 12 is a connection diagram in which the apparatus for preventing an electric shock and a fire according to the present invention is applied to the three-phase power supply.

The apparatus for preventing an electric shock and a fire according to the present invention may be applied to the three-phase power supply as well as the single-phase power supply. FIG. 12 is a connection diagram in which the apparatus for preventing an electric shock and a fire according to the present invention is applied to the three-phase power supply.

Referring to FIG. 12, the main transformer 300 receiving power from an ultra high voltage line may connect the first failure detector 210-1 between the first neutral point N1 and the earth without directly grounding the first neutral point N1 with the earth so that the main transformer 300 operates as the isolation transformer 240 whose secondary side is insulated from the earth. In addition, alternatively or additionally, it is also possible to install the second failure detector 210-2 on at least one of the three-phase power line PL2 on the secondary side of the main transformer 300. In addition, in order to protect the electrical facility 100 from the surge voltage, a surge protector 280 may be installed between at least one of the power line PL2 and the first neutral point N1 and the earth.

Figure 13:
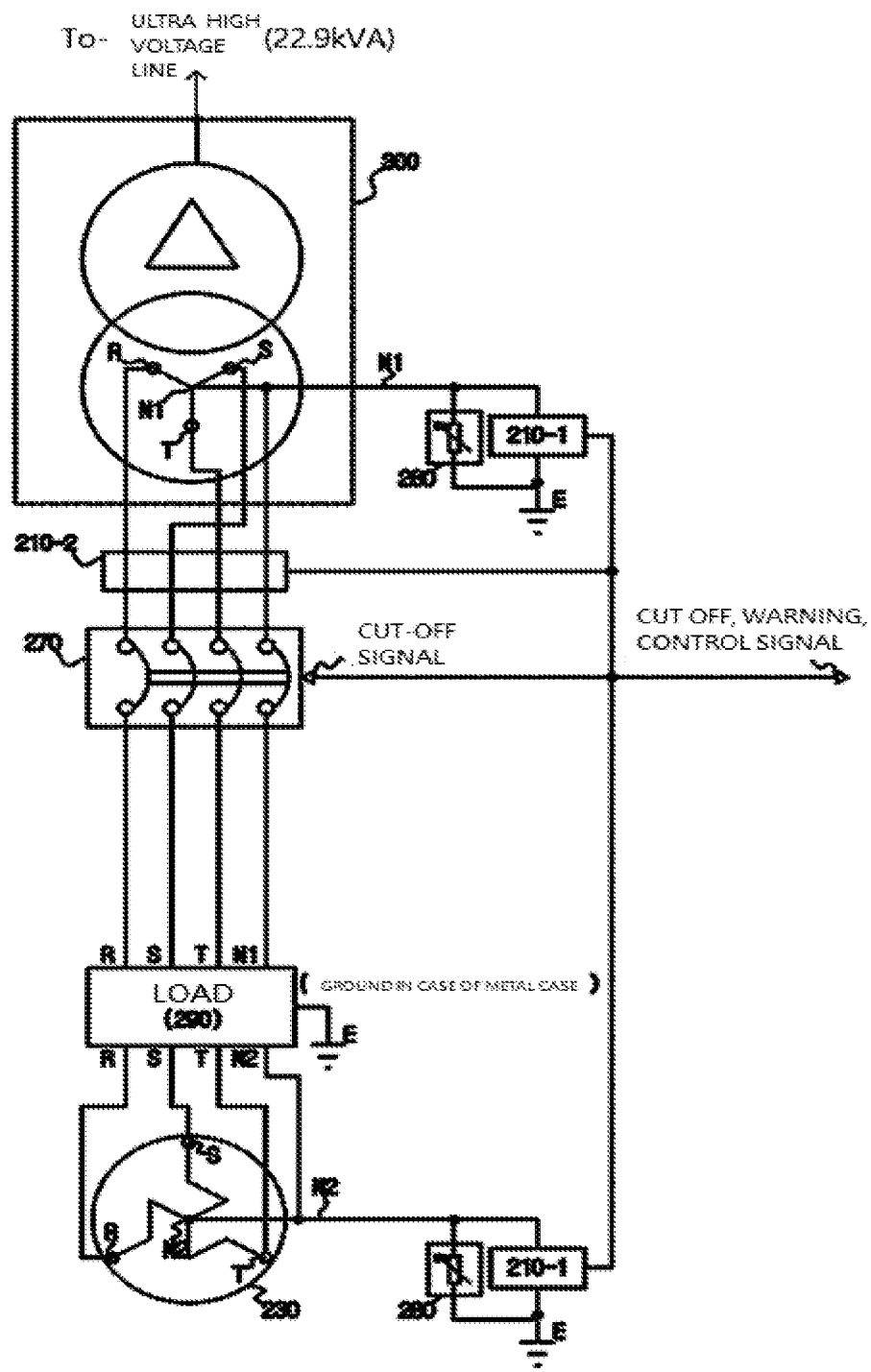
FIG. 13 is a connection diagram in which the apparatus for preventing an electric shock and a fire according to the present invention including the detection/recovery device is applied to the three-phase power supply.

FIG. 13 is a connection diagram in which an apparatus for preventing an electric shock and a fire according to the present invention including the detection/recovery device 230 is applied to the three-phase power supply.

The apparatus for preventing an electric shock and a fire of the present invention illustrated in FIG. 13 may further include the detection/recovery device 230 connected in parallel to the load 290 side in the three-phase connection diagram of FIG. 12. Here, in order to apply to the three-phase power, the detection/recovery device 230 is configured for three-phase, and the detection/recovery device 230 may operate to detect the electrical failure (leakage current, resistance increase, arc, disconnection, phase loss, unbalanced power, poor connection, misconnection, electric leakage, short circuit, occurrence of abnormal voltage) of the power line PL2, or restore power of the cut-off power line PL2 using the remaining power line PL2 when one power line PL2 is cut off due to the disconnection, phase loss or leakage current of the power line PL2 and supply the restored power to the load 290.

Figure 14:
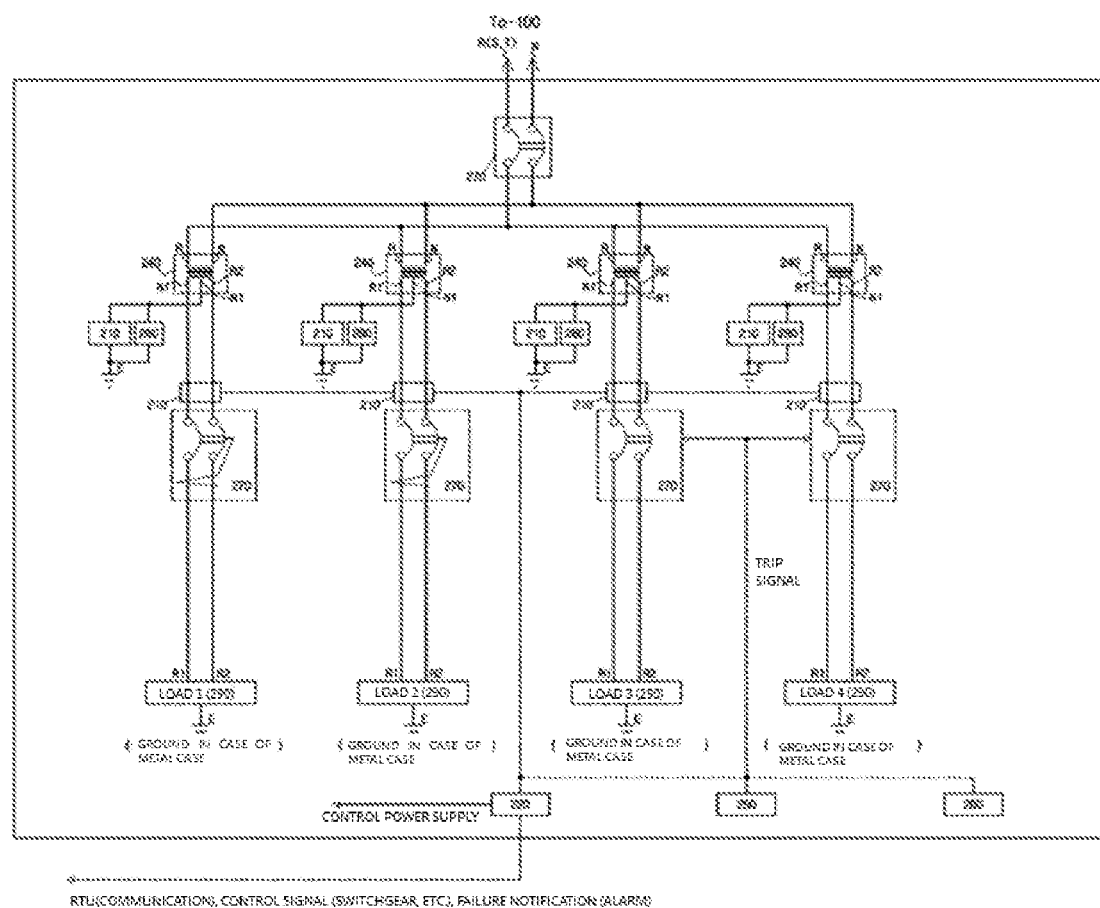
FIG. 14 is a connection diagram in which the apparatus for preventing an electric shock and a fire according to the present invention is applied to a branch line of the single-phase power supply.

The apparatus for preventing an electric shock and a fire according to the present invention may be applied not only to a main line of a receiving distribution line but also to a branch line branched from the main line. FIG. 14 is a connection diagram in which the apparatus for preventing an electric shock and a fire according to the present invention is applied to the branch line of the single-phase power supply.

Referring to FIG. 14, the apparatus for preventing an electric shock and a fire according to the present invention may be configured to include the isolation transformer 240 for insulating the branch line provided on the branch line branched from the main line from the earth. The isolation transformer 240 may be installed on all the branch lines, respectively, but it is also possible to selectively install only on branch lines with a high risk of electrical accidents due to the leakage current.

As illustrated in FIG. 14, when each branch line includes the isolation transformer 240 and each failure detector 210 is installed on the secondary side of the isolation transformer 240, the failure detector 210 installed in the branch line in which the leakage current occurs detects the leakage current and transmits the diction signal to the controller 220 or directly controls the circuit breaker 270 or the open/close switch 213 to cut off the branch line. In this case, the controller 220 receiving the detection signal may identify the branch line in which the leakage current has occurred, and output a cut off signal (trip signal) for selectively cutting off the branch line, or output a location signal indicating the location of the branch line. Therefore, when the isolation transformer 240 and the failure detector 210 are installed in each branch line, there is an advantage in that it is possible to identify the location of the branch line where the electrical failure due to leakage current occurs and selectively cut off only the branch line.

On the other hand, when the isolation transformer 240 and the failure detector 210 are installed in the main line, there is no need to install the isolation transformer 240 and the failure detector 210 for each branch line, so the connection is simplified, but additional consideration may be required to identify and selectively cut off the branch line where the leakage current has occurred. For example, when the leakage current occurs in any one of the plurality of branch lines branched from the main line, the failure detector 210 transmits the detection signal to the controller 220, and the controller 220 may identify the branch line in which the leakage current has occurred while controlling the opening and closing of the circuit breaker 270 to sequentially open the circuit breaker 270 of the branch circuit.

In addition, although not illustrated in FIG. 14, the detection/recovery device 230 and the open/close switch 213 may be provided on the load 290 side of the power line PL2 for each branch line to recover the phase-lost power supply during the disconnection due to the leakage current or the electrical failure and stably supply power to the load 290.

Figure 15:
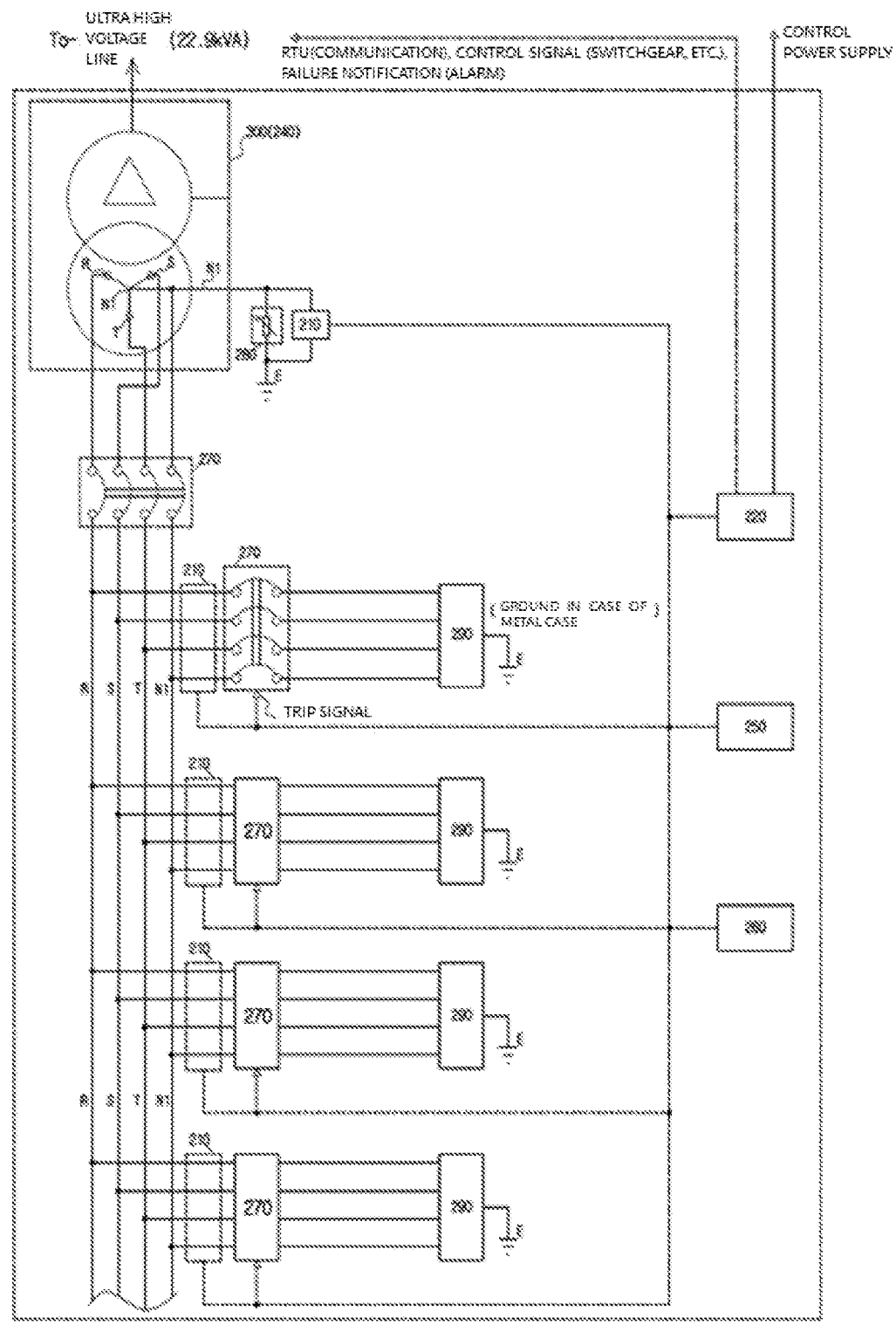
FIG. 15 is a connection diagram in which the apparatus for preventing an electric shock and a fire according to the present invention is applied to a branch line of the three-phase power supply.

FIG. 15 is a connection diagram in which the apparatus for preventing an electric shock and a fire according to the present invention is applied to the branch line of the three-phase power supply.

The apparatus for preventing an electric shock and a fire of the present invention applied to the branch line of the three-phase power supply illustrated in FIG. 15 has the same operating principle and connection method as the single-phase power supply of FIG. 14 except that the isolation transformer 240 is not provided in each branch line, but the main transformer 300 provided in the main line is the isolation transformer 240, and therefore, detailed description thereof will be omitted. In addition, although FIG. 15 illustrates that the failure detector 210 is installed in each branch line, a configuration in which the failure detector 210 is installed only in the main line is also possible.

Figure 16:
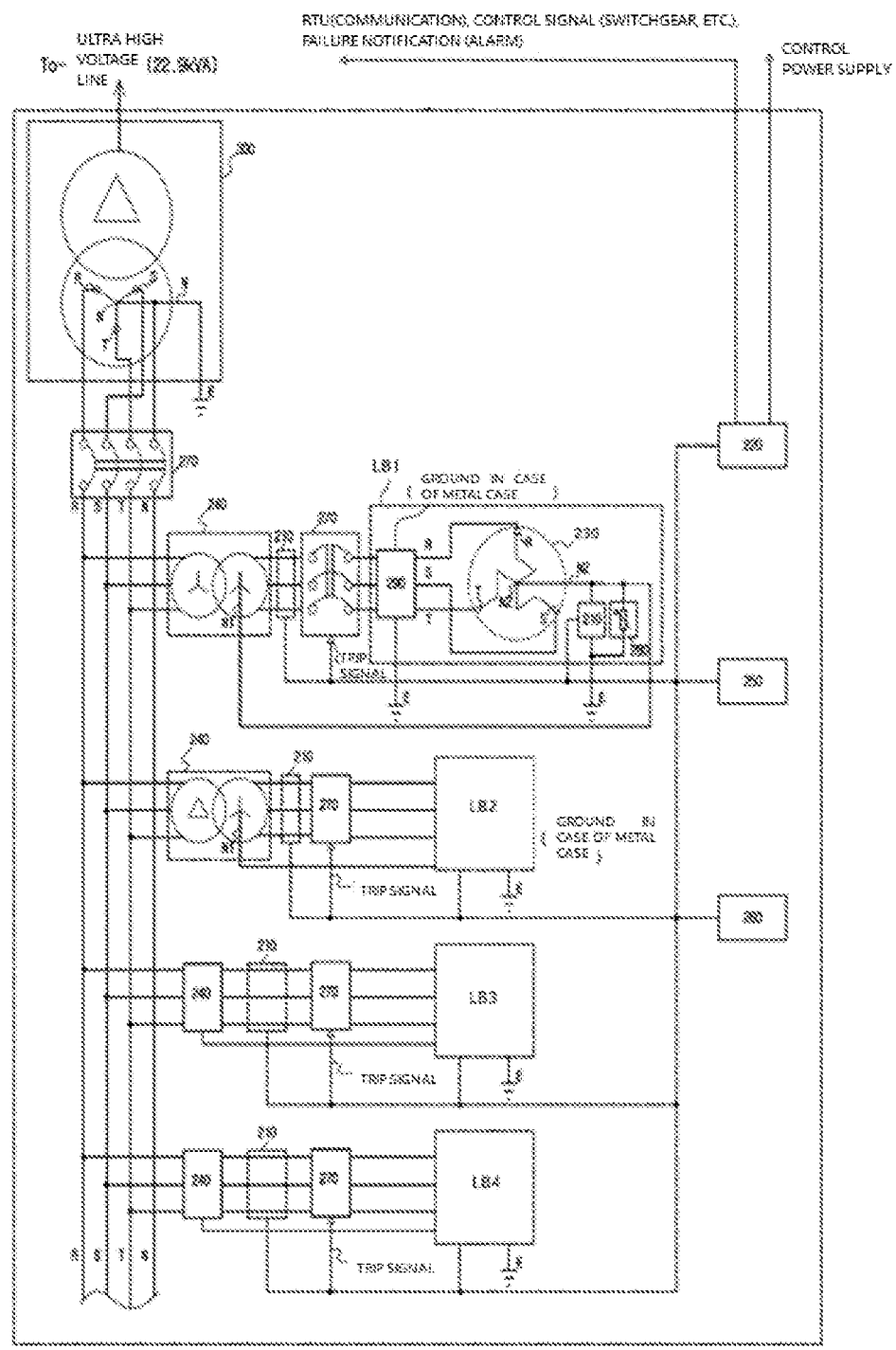
FIG. 16 is a connection diagram in which the apparatus for preventing an electric shock and a fire according to the present invention including the detection/recovery device is applied to the branch line of the three-phase power supply.

FIG. 16 is a connection diagram in which an apparatus for preventing an electric shock and a fire according to the present invention including the detection/recovery device 230 is applied to the branch line of the three-phase power supply.

Referring to FIG. 16, the apparatus for preventing an electric shock and a fire according to the present invention may be configured to include the isolation transformer 240 for insulating the branch line from the earth provided in each branch line branched from the main line drawn from the grounded main transformer 300. In this case, the isolation transformer 240 is a three-phase transformer, and may have a Y-Y connection or a Δ-Y connection structure. In addition, as illustrated in the load block of FIG. 16, the detection/recovery device 230 for three-phase may be connected in parallel to the load 290 on the load 290 side of at least one of the branch lines.

In addition, the failure detector 210 capable of detecting the leakage current may be provided while limiting the leakage current to a predetermined dangerous current or less between the earth and at least one of the power line PL2 of the branch line, the first neutral point N1, or the second neutral point N2 of the detection/recovery device 230 connected thereto.

In addition, in order to protect the electrical facility 100 of the rear end of the isolation transformer 240 from the surge voltage, the surge protector 280 may be installed between the earth and at least one of the power line PL2, the first neutral point N1, and the second neutral point N2.

In the above, the configuration and operation of the apparatus for preventing an electric shock and a fire according to the present invention have been described.

A method of preventing an electric shock and a fire during electric leakage and ground fault according to the present invention based on this may be configured to include insulating two or more power lines PL2 from an earth with a resistance value greater than or equal to a predetermined ground resistance value, detecting a leakage current between a least one of the two or more power lines PL2 and a first neutral point N1 having a potential between voltages of the two or more power lines PL2 and the earth, and outputting a detection signal according to the detecting of the leakage current.

In addition, the method of preventing an electric shock and a fire according to the present invention may further include cutting off a supply of power to the power line PL2 through which a leakage current flows by interlocking with the detection signal of the failure detector 210, and restoring the cut off power and supplying the restored cut off power to the load 290.

Here, the recovering of the power may be configured to include receiving power from the power line PL2 and the first neutral point N1 other than the power line PL2 cut off in the cutting of the power line, and recovering the power cut off by using the power received in the receiving of the power and supplying the recovered power to the load 290.

The embodiments in which the apparatus for preventing an electric shock and a fire of the present invention limits a leakage current flowing in the earth through the human body or the electrical facility to the dangerous current or less when the leakage current due to the electric leakage or the ground fault occurs and detects the leakage current have been described above.

Figure 17:
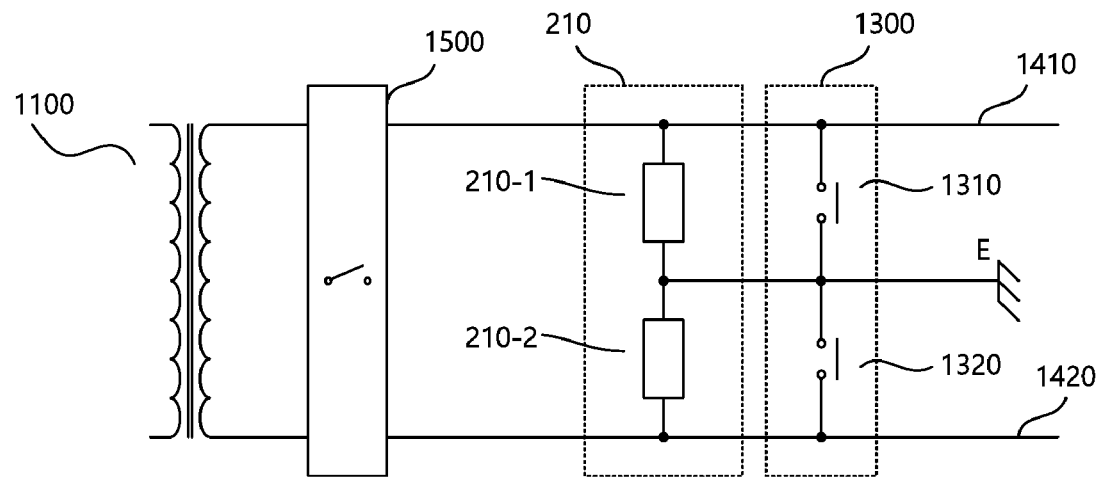
FIG. 17 is a connection diagram illustrating a configuration of an apparatus for preventing an electric shock and a fire during electric leakage and ground fault according to a third embodiment of the present invention and a distribution system including the same.

Hereinafter, as another embodiment of the apparatus for preventing an electric shock and a fire of the present invention, the embodiments in which the electric shock and fire may be prevented from occurring during the electric leakage and the ground fault by fundamentally cutting off the leakage current from passing through the human body or the electrical facility when the leakage current occurs will be described FIG. 17 is a connection diagram illustrating a configuration of an apparatus for preventing an electric shock and a fire during electric leakage and ground fault according to a third embodiment of the present invention and a distribution system including the same.

Referring to FIG. 17, the apparatus for preventing an electric shock and a fire during electric leakage and ground fault according to the present invention may be configured to include two or more power lines 1410 and 1420 that are electrically connected to the power supply unit 1100 to transmit AC or DC electricity from the power supply unit 1100 to a load facility and are insulated from the earth by a resistance value greater than or equal to a predetermined ground resistance value, and the failure detector 210 that is configured to detect whether the leakage current occurs between at least one of the neutral points N having a potential between the voltages of the two or more power lines 1410 and 1420 and the earth. In this case, the failure detector 210 operates to ground, to the earth, the power lines 1410 and 1420 or the neutral point N in which the leakage current occurs among the two or more power lines 1410 and 1420 and the neutral point N when the leakage current occurs.

Referring to FIG. 17, the power distribution system according to the present invention is configured to include the above-described apparatus for preventing an electric shock and a fire, the power supply unit 1100 that is configured to provide the AC or DC electricity to the load facility, and the two or more power lines 1410 and 1420 that are electrically connected to the power supply unit 1100 and insulated from the earth with the resistance value greater than or equal to the predetermined ground resistance value.

The power lines 1410 and 1420 are a conductor that supplies power from the power supply unit 1100 to the load side or peripheral power facilities (hereinafter, referred to as load facility), and is a collective term for all conductors that are electrically connected to each other and transmit power, including not only separate conductors separated by the circuit breaker 270 or the switch but also a branch line that is connected by the circuit breaker 270, the switch, the switchgear, etc., or is branched from the main line. In this case, it is preferable that the power lines 1410 and 1420 are insulated from earth to have a resistance value greater than or equal to a predetermined ground resistance. Here, the insulation is not limited to the case of complete insulation, and includes the case where the power lines 1410 and 1420 or the neutral point N has a larger resistance value than a normal earth resistance with the earth through a grounding work.

The power supply unit 1100 is a component that supplies electricity to the power lines 1410 and 1420, and may be a DC or AC power supply. When the power supply is DC, the power supply may be sunlight or an energy storage system (ESS), and when the power supply is AC, the power supply may include a single-phase or three-phase, or poly-phase method in which voltages of each phase have a predetermined phase difference. Hereinafter, the case in which the power supply unit 1100 is AC will be described as the third and fourth embodiments, and the case where the power supply unit 1100 is a direct current such as sunlight will be described as the fifth and sixth embodiments.

The power distribution system according to the present invention may include a circuit breaker 1500 that controls supply or cut-off of power to the power lines 1410 and 1420 by interlocking with the detection result of the failure detector 210.

The circuit breaker 1500 is to be controlled to separate the power supply unit 1100 from the power lines 1410 and 1420 when the failure detector 210 detects that the ground fault or electric leakage has occurred in the power lines 1410 and 1420. In particular, when the leakage current occurs in the plurality of power lines 1410 and 1420 among the power lines 1410 and 1420, the power supply unit 1100 may be controlled to be separated from the power lines 1410 and 1420.

The failure detector 210 of the present invention detects whether the leakage current occurs, but may be electrically connected between at least one of the two or more power lines 1410 and 1420 and the earth to identify the power lines 1410 and 1420 or the neutral point N where the leakage current has occurred.

The apparatus for preventing an electric shock and a fire according to the present invention may be configured to include a ground switching unit 1300 that is controlled to short-circuit, to the earth, the power lines 1410 and 1420 in which the leakage current occurs among the two or more power lines 1410 and 1420 according to the detection result of the failure detector 210 to ground the power lines 1410 and 1420. Additionally, when the power supply unit 1100 is a three-phase alternating current, the ground switching unit 1300 may be configured to short-circuit, to the earth, the neutral point N or the neutral line NL through which the leakage current flows to ground the neutral point N or the neutral line NL.

The ground switching unit 1300 is electrically connected between at least one of the two or more power lines 1410 and 1420 or the neutral point N and the earth to ground, to the earth, the power lines 1410 and 1420 or the neutral point N in which the leakage current occurs according to the detection result of the failure detector 210 and allow the leakage current to flow bypassing the ground switching unit 1300 instead of flowing in the human body, the peripheral facilities, or the load facility, thereby fundamentally preventing the electric shock or fire caused by the leakage current.

FIG. 17 illustrates a configuration of the apparatus for preventing an electric shock and a fire during electric leakage and ground fault according to the third embodiment of the present invention in the case where the power supply unit 1100 is a single-phase alternating current, and a power distribution system including the same.

Referring to FIG. 17, the apparatus for preventing an electric shock and a fire and the power distribution system according to the third embodiment of the present invention may include the first and second failure detectors 210-1 and 210-2 that are electrically connected between the two power lines 1410 and 1420 and the earth, respectively, and the ground switching unit 1300 may include first and second ground switches 1310 and 1320 whose turn-on or turn-off is controlled in response to each failure detector 210.

In particular, in the configuration of the third embodiment of the present invention, the ground switch may be electrically connected in parallel to the corresponding failure detector 210. In this case, the ground switch is preferably a normal close (NC) type switch that is turned off when an operating current greater than or equal to a predetermined reference value flows in the corresponding failure detector 210.

When the electric leakage and the ground fault occur in a first power line 1410 of the two power lines 1410 and 1420, a voltage across the first failure detector 210-1 connected between the first power line 1410 and the earth drops, and thus, a current flowing in the failure detector is less than or equal to a predetermined reference value, so the first ground switch 1310 is short-circuited. On the other hand, when the electric leakage and the ground fault occur in a second power line 1420, the voltage across the second failure detector 210-2 connected between the second power line 1420 and the earth drops, and thus, a current flowing in the failure detector is less than or equal to a predetermined reference value, so the second ground switch 1320 is short-circuited.

As in the third embodiment of the present invention, when the ground switch is configured in a normal close (NC) type, it is possible to detect even if the electric leakage or the ground fault occurs in not only one power line but also a plurality of power lines.

The failure detector 210 applied to the apparatus for preventing an electric shock and a fire and a power distribution system according to the present invention may be configured to be electrically connected between at least one of the two or more power lines and the earth to detect whether the leakage current occurs from the power line to the earth.

As described above in FIG. 2, each of the failure detectors 210 includes the current detection unit 211 that detects the leakage current and outputs the detection signal. In this case, the failure detector 210 may include a current limiting device in which the resistance values of both ends are set to be greater than or equal to a predetermined resistance value to limit the leakage current to a predetermined dangerous current or less. In addition, the failure detector 210 may be configured to further include a unidirectional current unit 212 that limits a path for the leakage current in a predetermined direction so that the leakage current flows through the current detection unit 211 in one-way direction.

Figure 22:
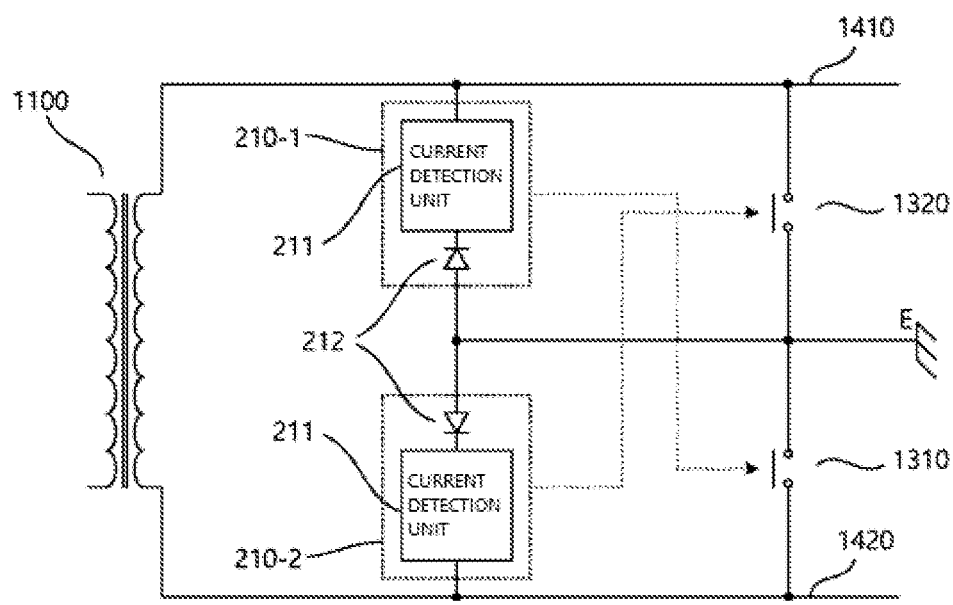
FIG. 22 is a connection diagram illustrating the configuration of an apparatus for preventing an electric shock and a fire during electric leakage and ground fault according to a fourth embodiment of the present invention and a distribution system including the same.
Figure 23:
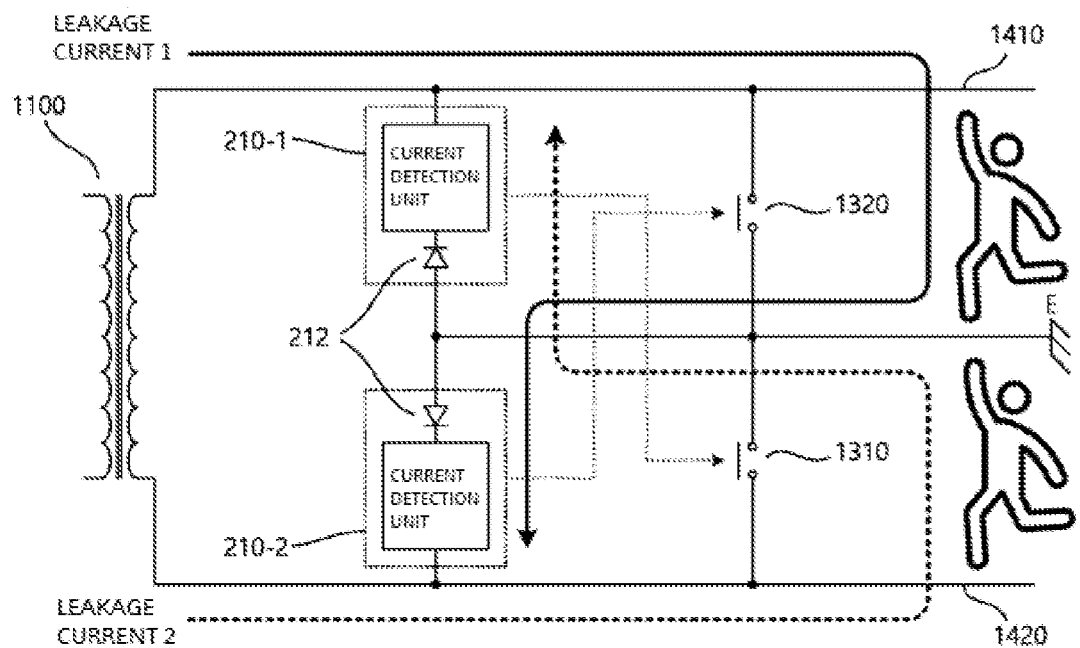
FIG. 23 is a conceptual diagram for describing an operation when electric leakage or ground fault occurs in one phase in the fourth embodiment of the present invention illustrated in FIG. 22.

In the third embodiment of the present invention as illustrated in FIG. 17, the failure detector 210 having the structure illustrated in FIG. 2(*c*) may be used, and in the fourth embodiment of the present invention as illustrated in FIGS. 22 and 23, as illustrated in FIG. 2(*a*) or 2(*b*), the failure detector 210 having a structure further including the unidirectional current unit 212 may be used.

Hereinafter, the configuration and operating principle of the fourth embodiment of the present invention to which the failure detector 210 of FIG. 2(*a*) or 2(*b*) is applied, and the third embodiment to which the failure detector 210 of FIG. 2(*c*) is applied will be described.

Figure 18:
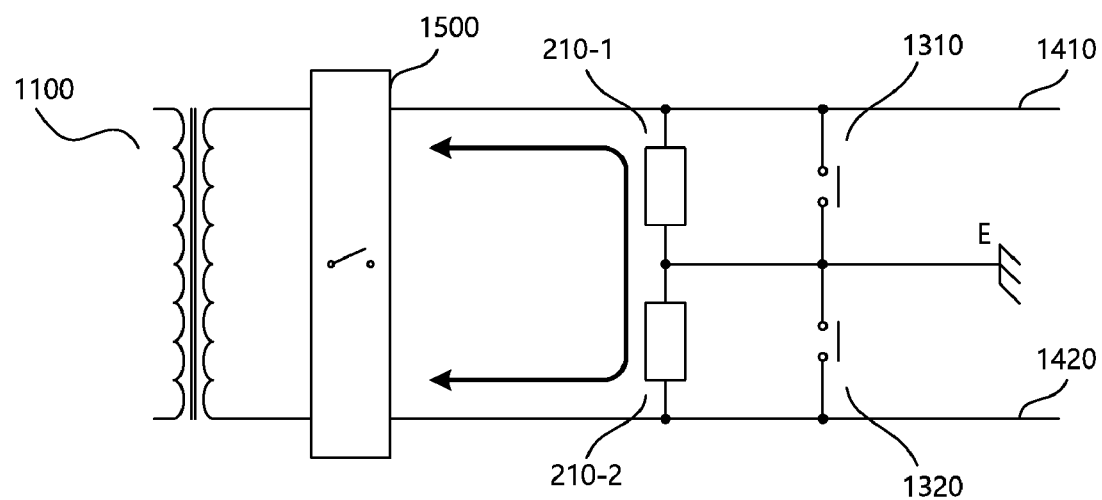
FIG. 18 is a conceptual diagram for describing an operation in a normal state in the third embodiment of the present invention illustrated in FIG. 17.
Figure 19:
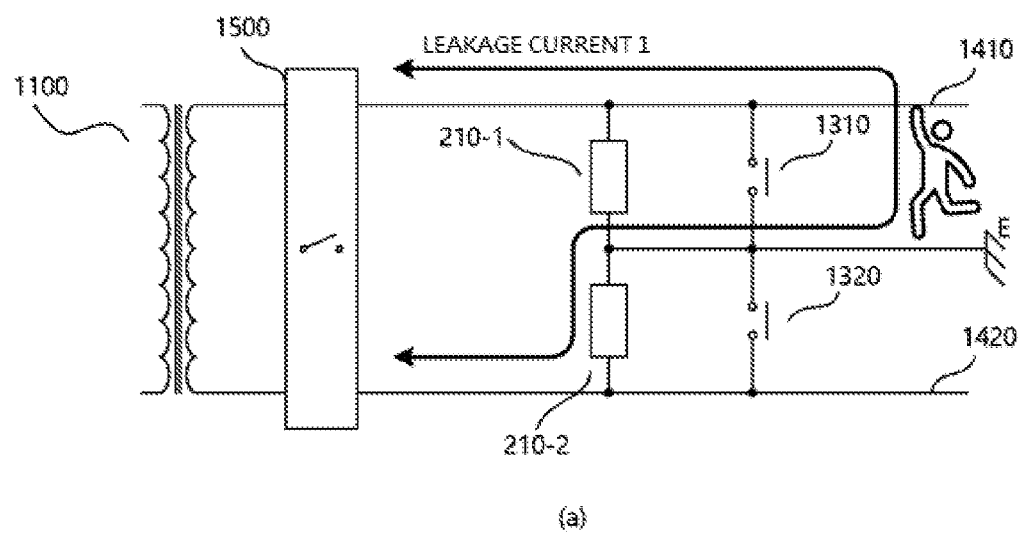
FIGS. 19 and 20 are conceptual diagrams for describing an operation when electric leakage or ground fault occurs in one phase in the third embodiment of the present invention.
Figure 19:
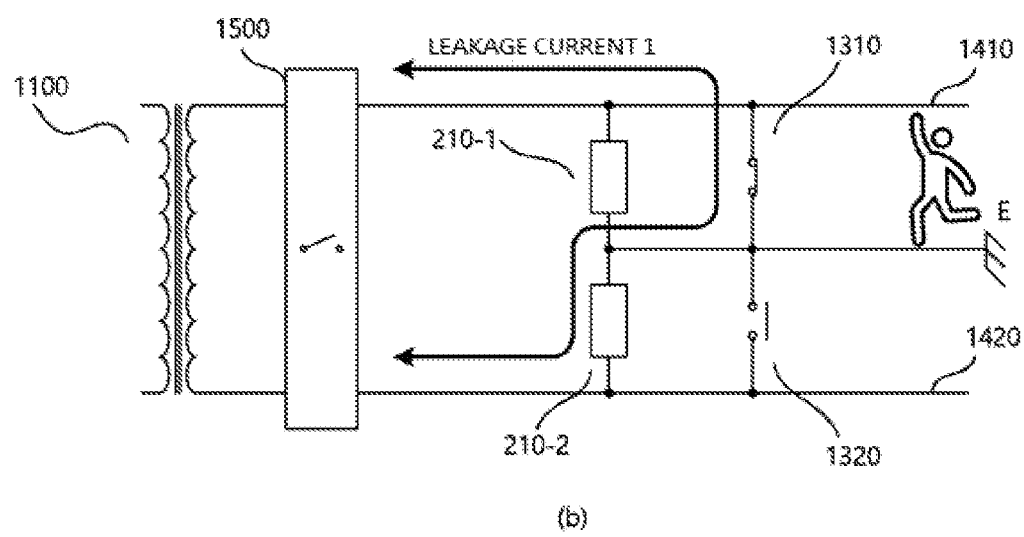
Figure 20:
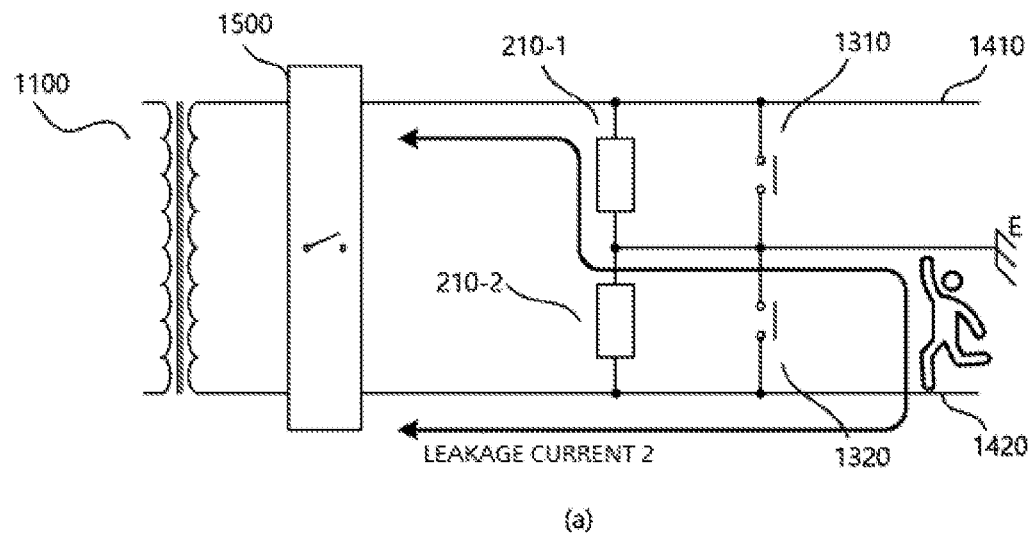
Figure 20:
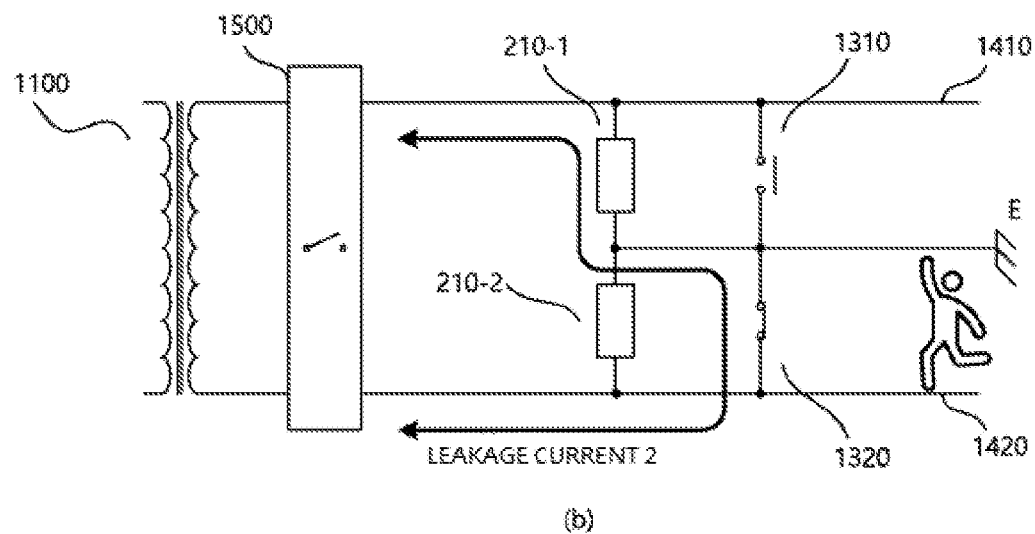
Figure 21:
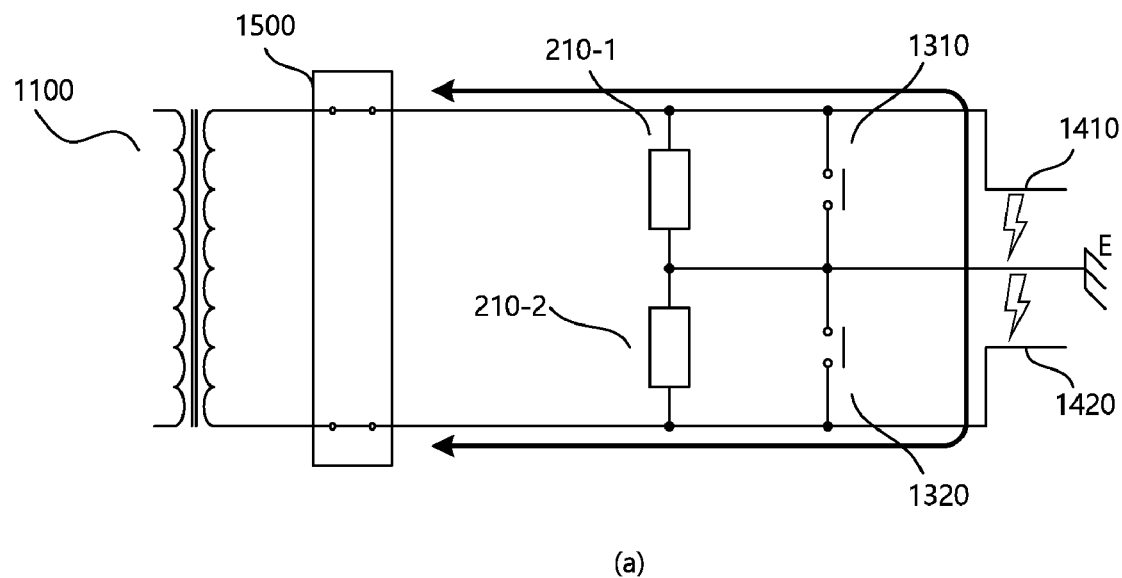
FIG. 21 is conceptual diagrams for describing an operation when the electric leakage or the ground fault occurs in two phases in the third embodiment of the present invention.
Figure 21:
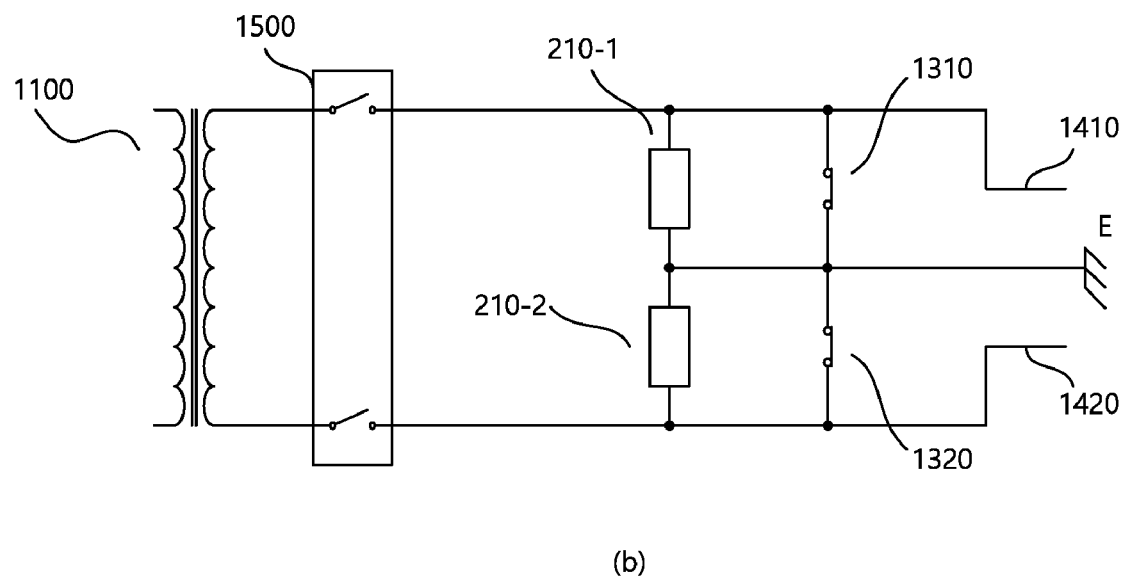

FIG. 18 is a conceptual diagram for describing a normal state in the third embodiment of the present invention illustrated in FIG. 17, FIGS. 19 and 20 are conceptual diagrams for describing an operation when the electric leakage or the ground fault occurs in one of the power lines 1410 and 1420 or one phase, FIG. 21 is a conceptual diagram for describing an operation when the electric leakage or the ground fault occurs in the plurality of power lines 1410 and 1420 or two phases. The ground switch in the apparatus for preventing an electric shock and a fire and the power distribution system according to the third embodiment of the present invention is a normal close (NC) type switch that is turned off when an operating current greater than or equal to a predetermined reference value flows in the corresponding failure detector 210, and may be configured to be electrically connected in parallel to the same power lines 1410 and 1420 as the corresponding failure detector 210. Here, the failure detector 210 may detect when a current less than or equal to a predetermined reference value flows and control the ground switch to be short-circuited.

Referring to FIG. 18, in the normal state, an operating current greater than or equal to a predetermined reference value flows in the first and second failure detectors 210-1 and 210-2, and each of the first and second failure detectors 210-1 and 210-2 is controlled to open the corresponding first and second ground switches 1310 and 1320, so normal power is supplied to the load side through the power lines 1410 and 1420.

As illustrated in FIG. 19(*a*), when the electric leakage and the ground fault occur in a first power line 1410 of the two power lines 1410 and 1420, the voltage across the first failure detector 210-1 connected between the first power line 1410 and the earth drops, and thus, the current flowing in the first failure detector 210-1 is less than or equal to a predetermined threshold value, so the first ground switch 1310 which is controlled by the first failure detector 210-1 is short-circuited.

In this way, when the first power line 1410 in which the electric leakage or the ground fault has occurred is grounded to the earth by the first ground switch 1310, the leakage current 1 flowing from the first power line 1410 to the earth flows in the earth through the first ground switch 1310 as illustrated in FIG. 19(*b*) instead of the human body, the peripheral facility, or the flammable object, so the electric accidents such as electric shock or fire are fundamentally prevented.

On the other hand, as illustrated in FIG. 20(*a*), when the electric leakage and the ground fault occur in the second power line 1420 of the two power lines 1410 and 1420, the voltage across the second failure detector 210-2 connected between the second power line 1420 and the earth drops, and thus, the current flowing in the second failure detector 210-2 is less than or equal to a predetermined reference value, so the second ground switch 1320 which is controlled by the second failure detector 210-2 is short-circuited.

In this way, when the second power line 1420 in which the electric leakage or the ground fault has occurred is grounded to the earth by the second ground switch 1320, the leakage current 2 flowing from the second power line 1420 to the earth flows in the earth through the second ground switch 1320 instead of the human body, the peripheral facility, or the flammable object, so the electric accidents such as electric shock or fire are fundamentally prevented.

In addition, when electric leakage or ground fault simultaneously occurs in the first and second power lines 1410 and 1420 as illustrated in FIG. 21, since all currents flowing through the first and second failure detectors 210-1 and 210-2 are less than or equal to a predetermined reference value, the first and second ground switches 1310 and 1320 controlled by the first and second failure detectors 210-1 and 210-2 may be controlled to be short-circuited. In addition, when it is detected that the electric leakage or the ground fault has occurred in the plurality of power lines 1410 and 1420 by the first and second failure detectors 210-1 and 210-2, as illustrated in FIG. 21(*b*), the circuit breaker 1500 may be opened and controlled to cut off the supply of power from the power supply unit 1100 to the power lines 1410 and 1420.

In this way, when the electric leakage or the ground fault occurs in the plurality of power lines 1410 and 1420, before the circuit breaker 1500 cuts off the supply of power, to prevent a short circuit between the power lines 1410 and 1420 by the plurality of ground switches, a short-circuit protection device may be installed in series with the ground switch. Here, the short-circuit protection device may be an inductor device for limiting an instantaneous short-circuit current.

In this way, in the same structure as the third embodiment of the present invention, the ground switch is configured in a normal close (NC) type, so the ground fault or the electric leakage can be detected even in the situation where the leakage current occurs not only in one of the power lines 1410 and 1420 but also in the plurality of power lines 1410 and 1420. As such, in the situation where the ground fault or the electric leakage is detected in the plurality of power lines 1410 and 1420, the circuit breaker 1500 is opened/closed and thus may be controlled to electrically separate the power supply unit 1100 from the power lines 1410 and 1420.

FIG. 22 is a connection diagram illustrating a configuration of an apparatus for preventing an electric shock and a fire during electric leakage and ground fault according to a fourth embodiment of the present invention and a distribution system including the same.

In the apparatus for preventing an electric shock and a fire according to the fourth embodiment of the present invention, unlike the third embodiment, when the electric leakage or the ground fault occurs in the power lines 1410 and 1420, the operating current due to the leakage current flows in the failure detector 210 at a predetermined reference value or greater, so the corresponding ground switch is controlled by the failure detector 210.

To this end, the failure detector 210 in the apparatus for preventing an electric shock and a fire according to the fourth embodiment of the present invention may be configured to include the unidirectional current unit 212 in which conduction is allowed only for leakage current flowing in specific power lines 1410 and 1420, and the ground switch may be a normal open (NO, normal open) type switch that is turned on when an operating current greater than or equal to a predetermined reference value flows in the corresponding failure detector 210. In this case, the ground switch is electrically connected to at least one of the power lines 1410 and 1420 and the neutral point N, not the power lines 1410 and 1420 to which the corresponding failure detector 210 is connected among the two or more power lines 1410 and 1420 and the neutral point N.

Referring to FIG. 22, the apparatus for preventing an electric shock and a fire and the power distribution system according to the fourth embodiment of the present invention may be configured to include the first and second failure detectors 210-1 and 210-2 that are electrically connected between the two power lines 1410 and 1420 and the earth, respectively, and the first and second ground switches 1310 and 1320 whose turn-on or turn-off is controlled in response to each failure detector.

As illustrated in FIG. 2(*a*) or 2(*b*), each of the first and second failure detectors 210-1 and 210-2 may be configured to include the current detection unit 211 that detects a leakage current and a unidirectional current unit 212 that limits a path of the leakage current so that the leakage current flows through the current detection unit 211 in one-way direction.

In particular, as illustrated in FIG. 22, when all current conduction directions of the unidirectional current units 212 of each of the first and second failure detectors 210-1 and 210-2 are configured to flow out from or flow in the earth, in the normal state where the electric leakage or the ground fault does not occur, the leakage current does not flow in the failure detector 210, and only when the leakage current occurs in any one of the first and second power lines 1410 and 1420, the failure detector 210 detects the leakage current and operates the corresponding ground switch.

The ground switch is a normal open (NO) type switch in which a contact is short-circuited by a detection signal output when an operating current greater than or equal to a predetermined reference value flows in the corresponding failure detector 210, and is electrically connected to the power lines 1410 and 1420, not the power lines 1410 and 1420 to which the corresponding failure detector 210 is connected.

In other words, when the first failure detector 210-1 is connected between the first power line 1410 and the earth, and the second failure detector 210-2 is connected between the second power line 1420 and the earth, the first ground switch 1310 corresponding to the first failure detector 210 may be installed between the second power line 1420 and the earth, and the second ground switch 1320 corresponding to the second failure detector 210-2 may be installed between the first power line 1410 and the earth.

FIG. 23 is a conceptual diagram for describing an operation when the electric leakage or the ground fault occurs in one phase in the fourth embodiment of the present invention illustrated in FIG. 22.

Referring to FIG. 23, when the electric leakage and the ground fault occur in the first power line 1410 of the two power lines 1410 and 1420 and thus the leakage current 1 flows, the leakage current 1 flows in the second failure detector 210-2 connected between the second power line 1420 and the earth at a predetermined reference value or greater, so the second ground switch 1320 is controlled to ground the first power line 1410 to the earth by the second failure detector 210-2 that has detected the leakage current 1.

In this way, when the first power line 1410 in which the electric leakage or the ground fault has occurred is grounded to the earth by the second ground switch 1320, the leakage current 1 flowing from the first power line 1410 to the earth flows in the earth through the second ground switch 1320 instead of the human body, the peripheral facility, or the flammable object, so the electric accidents such as electric shock or fire are fundamentally prevented.

On the other hand, when the electric leakage and the ground fault occur in the second power line 1420 of the two power lines 1410 and 1420 and thus the leakage current 2 flows, the leakage current 2 flows in the first failure detector 210-1 connected between the first power line 1410 and the earth at a predetermined reference value or greater, so the first ground switch 1310 is controlled to ground the second power line 1420 to the earth by the first failure detector 210-1 that detects the leakage current 2.

In this way, when the second power line 1420 in which the electric leakage or the ground fault has occurred is grounded to the earth by the first ground switch 1310, the leakage current 2 flowing from the second power line 1420 to the earth flows in the earth through the first ground switch 1310 instead of the human body, the peripheral facility, or the flammable object, so the electric accidents such as electric shock or fire are fundamentally prevented.

In the above, the third and fourth embodiments of the present invention have been described by taking the case where the power supply unit 1100 is the single-phase AC power supply as an example, but the technical idea of the present invention is not limited thereto, and the third and fourth embodiments of the present invention may be applied to a DC circuit as well as a poly-phase AC circuit including the three-phase AC circuit.

As an example, the configuration when the third and fourth embodiments of the present invention are applied to a three-phase AC circuit will be described.

Figure 24:
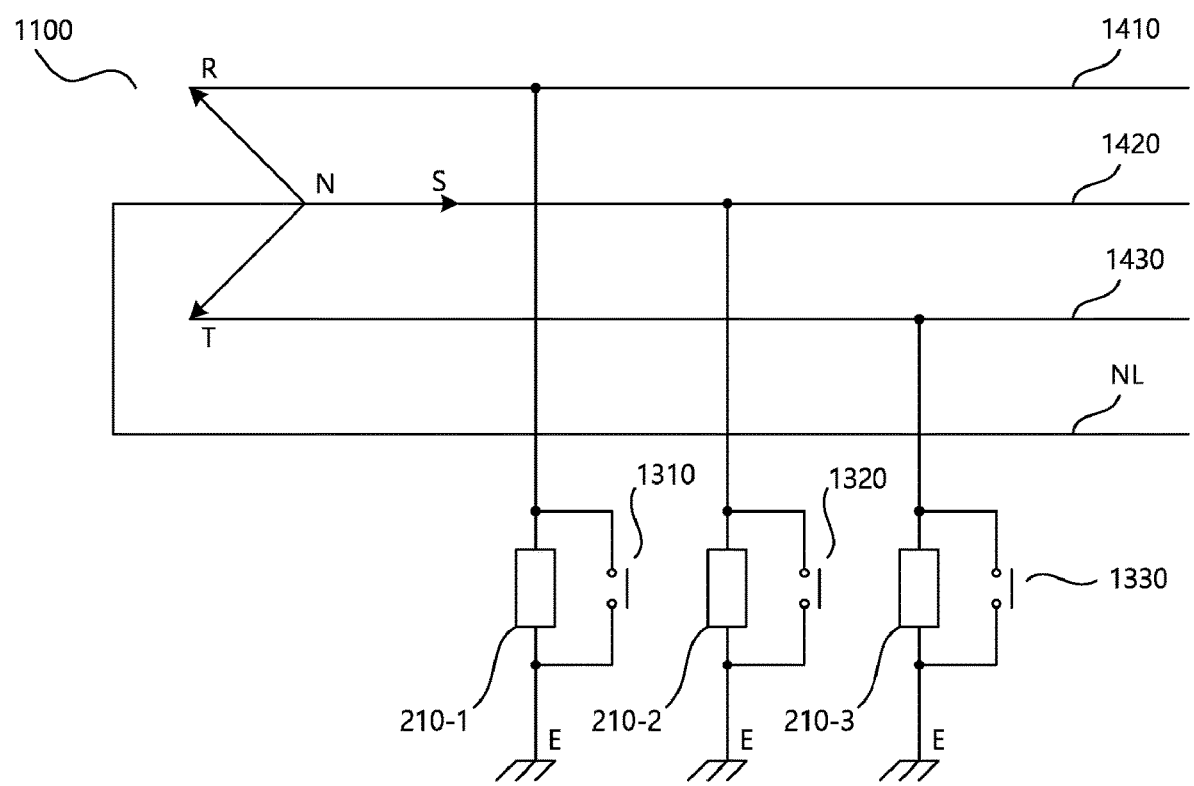
FIG. 24 is a connection diagram when the configuration according to the third embodiment of the present invention is applied to the three-phase power supply.

FIG. 24 is a connection diagram when the configuration according to the third embodiment of the present invention is applied to a three-phase AC power supply.

Referring to FIG. 24, in the apparatus for preventing an electric shock and a fire and distribution system according to a third embodiment of the present invention, the power supply unit 1100 is a three-phase AC power source including R-phase, S-phase, and T-phase, the failure detector 210 includes first to third failure detectors 210-1, 210-2, and 210-3 respectively connected between the R-phase, the S-phase, and the T-phase and the earth, the ground switching unit 1300 includes the first to third ground switches 1310, 1320, and 1330 corresponding to the first to third failure detectors 210-1, 210-2, 210-3, respectively, and the first to third ground switches 1310, 1320, and 1330 are normal close (NC) type switches that operate when an operating current greater than or equal to a predetermined reference value flows in the corresponding failure detector 210 to open contacts.

In this case, the first to third ground switches 1310, 1320, and 1330 may be installed between the plurality of power lines 1410, 1420, 1430 and the earth so that the corresponding power line is grounded to the earth when the electric leakage or the ground fault occurs in one or more of the first to third power lines 1410, 1420, and 1430 connected to the R-phase, the S-phase, and the T-phase, and more specifically, the first to third ground switches 1310, 1320, and 1330 may be configured to be connected in parallel to each of the corresponding failure detectors 210.

As described above, in the three-phase AC circuit to which the configuration according to the third embodiment of the present invention is applied, when the electric leakage and the ground fault occur in any one of the first to third power lines 1410, 1420, and 1430, the voltage across the failure detector 210 connected between the corresponding power line and the earth drops, and thus, the current flowing in the failure detector 210 is less than or equal to a predetermined reference value, so the ground switch controlled by the corresponding failure detector 210 is short-circuited.

In this way, when the power lines 1410, 1420, and 1430 in which the electric leakage or the ground fault has occurred are grounded to the earth by the ground switch, the leakage current flowing from the power lines 1410, 1420, and 1430 to the earth flows in the earth through the short-circuited ground switch instead of the human body, the peripheral facility, or the flammable object, so the electric accidents such as electric shock or fire are fundamentally prevented.

In addition, when the electric leakage or the ground fault simultaneously occurs in the plurality of power lines among the first to third power lines 1410, 1420, and 1430, since all the currents flowing in the failure detector 210 connected to the power lines 1410, 1420, and 1430 in which the electric leakage or the ground fault has occurred are less than or equal to a predetermined reference value, the ground switches controlled by the corresponding failure detector 210 are short-circuited, so the power lines 1410, 1420, and 1430 with the electric leakage and the ground fault may be controlled to be grounded to the earth. In addition, when it is detected that the electric leakage or the ground fault has occurred in the plurality of power lines 1410, 1420, and 1430 by the failure detector 210, the circuit breaker 1500 installed between the power supply unit 1100 and the first to third power lines 1410, 1420, and 1430 is opened and thus may be controlled to cut off the supply of power from the power supply unit 1100 to the power lines 1410, 1420, and 1430.

As such, when the electric leakage or the ground fault occurs in the plurality of power lines 1410, 1420, and 1430, in order for the operation of the plurality of ground switches to prevent the power lines 1410, 1420, and 1430 from being instantaneously short-circuited to each other before the circuit breaker 1500 cuts off the supply of power, the short-circuit protection device may be installed in series with the ground switch and the short-circuit protection device may be an inductor device for limiting an instantaneous short-circuit current.

As described above, in the same structure as the third embodiment of the present invention, the ground switch is configured in the normal close (NC) type, so the situation where the ground fault or the electric leakage occurs not only in one of the power lines 1410, 1420, and 1430 but also in the plurality of power lines 1410, 1420, and 1430 can also be detected. As such, in the situation where the ground fault or the electric leakage is detected in the plurality of power lines 1410, 1420, and 1430, the circuit breaker 1500 is opened and thus may be controlled to electrically separate the power supply unit 1100 from the power lines 1410, 1420, and 1430.

Figure 25:
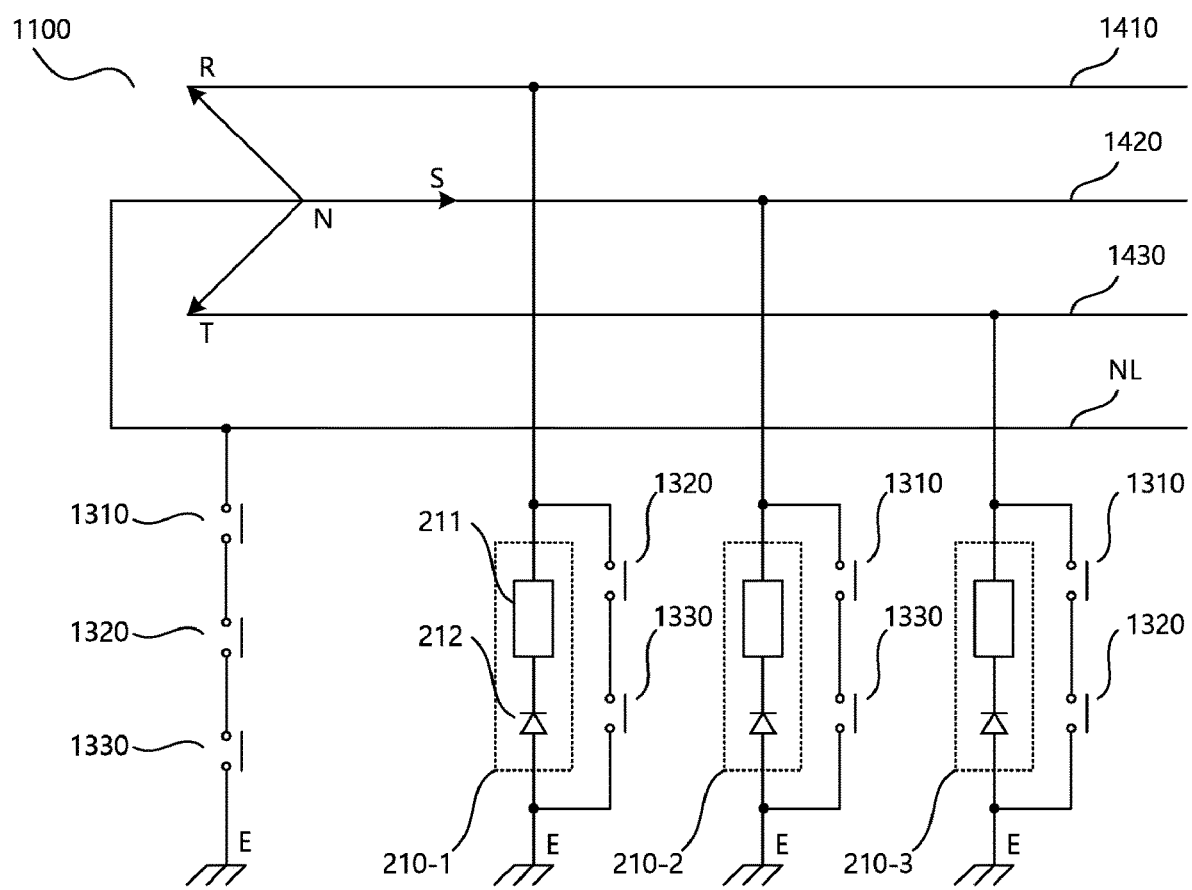
FIG. 25 is a connection diagram when the configuration according to the fourth embodiment of the present invention is applied to the three-phase power supply.

FIG. 25 is a connection diagram when the configuration according to the fourth embodiment of the present invention is applied to the three-phase power supply.

Referring to FIG. 25, in the apparatus for preventing an electric shock and a fire and distribution system according to the fourth embodiment of the present invention, the power supply unit 1100 is a three-phase AC power source including R-phase, S-phase, and T-phase, the failure detector 210 includes first to third failure detectors 210-1, 210-2, and 210-3 respectively connected between the R-phase, the S-phase, and the T-phase and the earth, the ground switching unit 1300 includes the first to third ground switches 1310, 1320, and 1330 corresponding to the first to third failure detectors 210-1, 210-2, 210-3, respectively, and the first to third ground switches 1310, 1320, and 1330 are the normal open (NO) type switches that are turned on when an operating current greater than or equal to a predetermined reference value flows in the corresponding failure detector 210 to short-circuit contacts.

In this case, the first to third ground switches 1310, 1320, and 1330 may be installed between the plurality of power lines 1410, 1420, and 1430 and the earth so that the corresponding power lines 1410, 1420, and 1430 are grounded to the earth when the electric leakage or the ground fault occurs in one or more power lines 1410, 1420, and 1430 of the first to third power lines 1410, 1420, and 1430 connected to the R-phase, the S-phase, and the T-phase. In addition, the first to third ground switches 1310, 1320, and 1330 can be installed between the neutral line NL and the earth so that the neutral NL is grounded to the earth when the electric leakage or the ground fault occurs in the neutral NL connected to the neutral point N of the R, S and T-phases.

As illustrated in FIG. 2(*a*) or 2(*b*), each of the first to third failure detectors 210-1, 210-2, and 210-3 may be configured to include the current detection unit 211 that detects a leakage current and a unidirectional current unit 212 that limits a path of the leakage current so that the leakage current flows through the current detection unit 211 in one-way direction.

In particular, as illustrated in FIG. 25, when all current conduction directions of the unidirectional current units 212 of each of the first to third failure detectors 210-1, 210-2, and 210-3 are configured to flow out from or flow in the earth, in the normal state where the electric leakage or the ground fault does not occur, the leakage current does not flow in the failure detector 210, and only when the leakage current occurs in any one 1410, 1420, or 1430 of the first to third power lines 1410, 1420, and 1430, the failure detector 210 detects the leakage current and operates the corresponding ground switch.

The ground switch is a normal open (NO) type switch in which a contact is short-circuited by a detection signal output when an operating current greater than or equal to a predetermined reference value flows in the corresponding failure detector 210, and is electrically connected to the power lines 1410, 1420, and 1430, not the power lines 1410, 1420, and 1430 to which the corresponding failure detector 210 is connected.

In other words, when the electric leakage or the ground fault occurs in any one of the first to third power lines 1410, 1420, and 1430 and thus the leakage current flows, since the operation current greater than or equal to a predetermined reference value flows in the remaining failure detectors 210 other than the failure detector 210 connected to the power lines 1410, 1420, and 1430 in which the electric leakage or the ground fault has occurred among the first to third failure detectors 210-1, 210-2, and 210-3, the ground switch may be disposed so that the power lines 1410, 1420, and 1430 with the electric leakage or the ground fault may be grounded to the earth by using the ground switch interlocking with the detection signal of the remaining failure detectors 210.

For example, referring to FIG. 25, assuming that the first to third failure detectors 210-1, 210-2, and 210-3 are respectively connected between the first to third power lines 1410, 1420, and 1430 and the earth, the second and third ground switches 1320 and 1330 corresponding to the second and third failure detectors 210-2 and 210-3 may be connected in series between the first power line 1410 and the earth, the first and third ground switches 1310 and 1330 corresponding to the first and third failure detectors 210-1 and 210-3 may be connected in series between the second power line 1420 and the earth, and the first and second ground switches 1310 and 1320 corresponding to the first and second failure detectors 210-1 and 210-2 may be connected in series between the third power line 1430 and the earth.

In addition, when the neutral point N or the neutral line NL is short-circuited or ground-faulted, the leakage current flows to all of the first to third failure detectors 210-1, 210-2, and 210-3, so the first to the third ground switches 1310, 1320, and 1330 may be connected in series between the neutral line NL and the earth.

However, the connection configuration of FIG. 25 is only an example according to the fourth embodiment of the present invention, and in order to ground, to the earth, the power lines 1410, 1420, 1430 or the neutral line NL in which the electric leakage or the ground fault occurs, various methods and configurations, such as logically calculating the detection result of the failure detector 210, may be devised.

According to the fourth embodiment of the present invention, when the electric leakage or the ground fault occurs in the power lines 1410, 1420, and 1430 or the neutral line NL in the three-phase AC circuit, since the corresponding power lines 1410, 1420, and 1430 or the neutral line NL may be grounded to the earth, since the leakage current flowing from the power lines 1410, 1420, and 1430 or the neutral line NL to the earth flows to the earth through the ground switch instead of the human body, the peripheral facilities, or the flammable object, so the electric accidents such as electric shock or fire are fundamentally prevented.

In addition, the power distribution system according to the present invention may further include a surge protector (not illustrated) that is electrically connected between at least one of two or more power lines 1410, 1420, and 1430 and the neutral point N having a potential between the voltages of the two or more power lines 1410, 1420, and 1430 and the earth. The surge protector may be installed between each of the power lines 1410, 1420, and 1430 and the earth in parallel with the failure detector 210, and is also installed between the neutral point N or the neutral line NL and the earth to serve to suppress the surge voltage introduced into the power lines 1410, 1420, and 1430 or the neutral line NL.

In this case, the apparatus for preventing an electric shock and a fire according to the present invention may be configured to detect the leakage current due to a defect, a deterioration, or a failure of the surge protector, thereby recognizing the defects, deterioration or failure of the surge protector.

The surge protector is a component that protects peripheral facilities by suppressing an abnormal surge voltage introduced into the power lines 1410, 1420, 1430 and the neutral line NL by lightning, etc., and may be configured to include a varistor.

Due to the deterioration or failure of the surge protector and the introduction of overvoltage exceeding a rated capacity, the impedance of the surge protector is lowered, so the leakage current may flow even in a normal state, similar to the occurrence of the electric leakage or the ground fault. In this case, the apparatus for preventing an electric shock and a fire according to the present invention may detect the leakage current due to the defect, deterioration, or failure of the surge protector to recognize the defect, deterioration, or failure of the surge protector and notifying an administrator of the defect, deterioration, or failure of the surge protector, so the administrator may properly replace the surge protector.

In addition, the apparatus for preventing an electric shock and a fire during electric leakage and ground fault according to the present invention can be applied not only to an AC circuit but also to a DC circuit such as sunlight. Hereinafter, embodiments in which the apparatus for preventing an electric shock and a fire according to the present invention is applied to a photovoltaic power generation system will be described.

Figure 26:
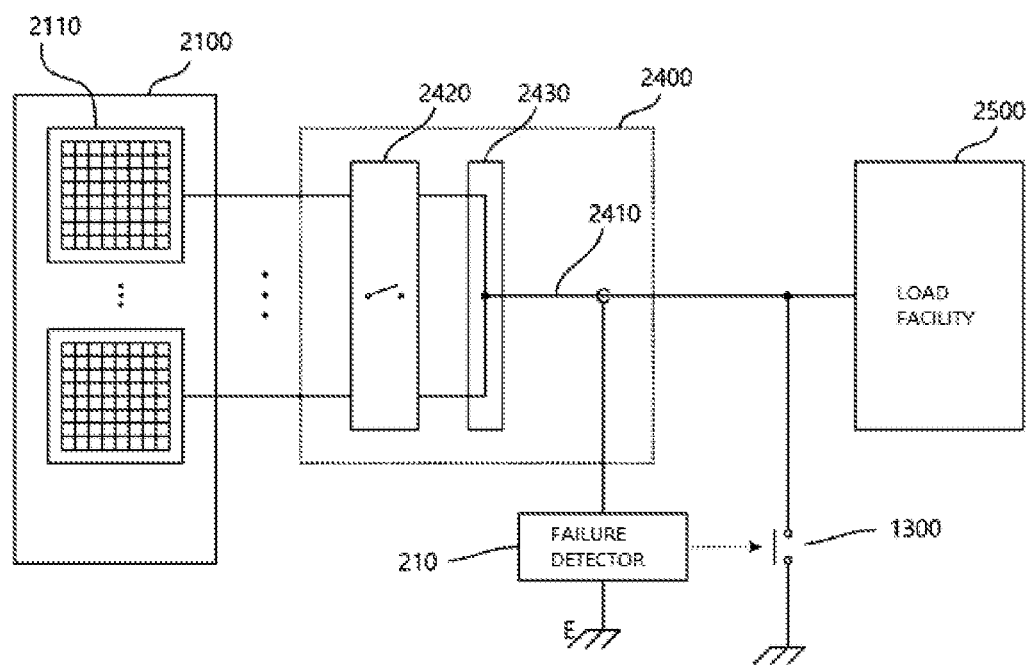
FIG. 26 is a block diagram illustrating the overall configuration of a photovoltaic power generation system including the apparatus for preventing an electric shock and a fire during electric leakage and ground fault according to the present invention.

FIG. 26 is a block diagram illustrating the overall configuration of a photovoltaic power generation system including the apparatus for preventing an electric shock and a fire during electric leakage and ground fault according to the present invention.

Referring to FIG. 26, the apparatus for preventing an electric shock and a fire of the photovoltaic power generation system includes at least one failure detector 210 that is configured to be electrically connected to a solar panel 2100 to transmit electricity generated from the solar panel 2100 in which one or more solar cell modules 2110 are arranged, to the load facility 2500 and detect whether the leakage current occurs between two or more power lines 2410 insulated from earth with a resistance value greater than or equal to a predetermined earth resistance value and the earth, and the failure detector 210 operates to ground, to the earth, a power line 2410 in which the leakage current has occurred among two or more power lines 2410 when the leakage current occurs.

Here, the photovoltaic power generation system according to the present invention may be configured to include the solar panel 2100 in which one or more solar cell modules 2110 are arranged, two or more power lines 2410 that are electrically connected to the solar panel 2100 to transmit the electricity generated from the solar panel 2100 to the load facility 2500 and are insulated from the earth with a resistance value greater than or equal to a predetermined earth resistance value, and the above-described apparatus for preventing an electric shock and a fire.

The power line 2410 is a conductor that supplies power from the solar panel 2100 to the load side or peripheral power facilities (hereinafter, referred to as load facility), and is a collective term for all conductors that are electrically connected to each other and transmit power, including not only separate conductors separated by the circuit breaker or the switch but also a branch line that is connected by the circuit breaker, the switch, the switchgear, etc., or is branched from the main line. In this case, it is preferable that the power line 2410 is insulated from earth to have a resistance value greater than or equal to a predetermined ground resistance. Here, the insulation is not limited to the case of complete insulation, and includes the case where the power line 2410 or the neutral point N has a larger resistance value than a normal earth resistance with the earth through a grounding.

The circuit of the load facility 2500 connected to the power line 2410 may be a DC or AC circuit. In the case of the DC circuit, the power line 2410 may include a DC power line connected to the solar panel 2100 and the energy storage system (ESS), and in the case of the AC circuit, may include an AC power line connected to an output of the inverter that converts a direct current to an alternating current.

Referring to FIG. 26, the photovoltaic power generation system includes a collection unit 2430 that collects a current generated from each of the solar cell modules 2110 when two or more solar cell modules 2110 are arranged in a solar panel 2100. The DC current collected by the collection unit 2430 is transmitted to the load facility 2500 through the DC power line 2410.

In addition, the photovoltaic power generation system may include a DC circuit breaker 2420 that is disposed between the solar cell module 2110 and the collection unit 2430, and controls opening and closing by interlocking with the detection signal of the failure detector 210.

The DC circuit breaker 2420 may be one or more circuit breaker respectively corresponding to the solar cell module 2110. In the case of the plurality of circuit breakers, the plurality of DC circuit breakers 2420 can confirm the detection signal while simultaneously or sequentially cutting off all the plurality of DC circuit breakers 2420 by interlocking with the detection signal of the failure detector 210 to cut off only the solar cell module 2100 in which the leakage current occurs.

The DC circuit breaker 2420 may be controlled to separate the solar cell module 2110 from the power line 2410 when the failure detector 210 detects that the ground fault or the electric leakage has occurred in two or more power lines 2410.

The collection unit 2430 and the DC circuit breaker 2420 described above may be installed in the connector band 2400. The connector band 2400 may be configured to further include the failure detector 210 and the ground switching unit 1300 to be described later.

The apparatus for preventing an electric shock and a fire of the photovoltaic power generation system according to the present invention may be configured to further include the ground switching unit 1300 that is controlled to short-circuit, to the earth, the power line 2410 in which the leakage current occurs among the two or more power lines 2410 according to the detection result of the failure detector 210 to ground the power line 2410.

The ground switching unit 1300 is electrically connected between at least one of the two or more power lines 2410 and the earth to ground, to the earth, the power line 2410 in which the leakage current occurs according to the detection result of the failure detector 210, and allow the leakage current to flow bypassing the ground switching unit 1300 instead of flowing in the human body, the peripheral facilities, or the load facility 2500, thereby fundamentally preventing the electric shock or fire caused by the leakage current.

To this end, the failure detector 210 of the present invention may be configured to detect whether the leakage current has occurred, but to identify the power line 2410 in which the leakage current has occurred.

The failure detector 210 applied to the apparatus for preventing an electric shock and a fire of the photovoltaic power generation system according to the present invention may be configured to be electrically connected between at least one of the two or more power lines 2410 and the neutral point N having the potential between the voltages of the two or more power lines 2410 and the earth to detect whether the leakage current occurs from the power line 2410 to the earth.

As described above in FIG. 2, each of the failure detectors 210 includes the current detection unit 211 that detects the leakage current and outputs the detection signal. In this case, the failure detector 210 may include a current limiting device in which the resistance value of both ends is set to be greater than or equal to a predetermined resistance value to limit the leakage current to a predetermined dangerous current or less. In addition, as illustrated in FIGS. 2(a) and 2(b), the failure detector 210 may be configured to further include the unidirectional current unit 212 that limits the path for the leakage current in a predetermined direction so that the leakage current flows through the current detection unit 211 in one-way direction.

The failure detector 210 configured to include the unidirectional current unit 212 may be installed on the power line 2410 or installed at a neutral point N to identify the power line 2410 through which the leakage current flows according to the direction of the leakage current. In this case, the failure detector 210 may detect in which any power line 2410 of the two or more power lines 2410 the leakage current occurs through the unidirectional current unit 212 configured to flow the leakage current in different directions.

In addition, the failure detector 210 according to the present invention may be configured to detect the power line 2410 in which the leakage current has occurred without using the unidirectional current unit 212.

Referring to FIG. 2C, the current detection unit 211 may be configured to identify the direction of the leakage current flowing through the failure detector 210. For example, as illustrated in FIG. 2(c), the current detection unit 211 may output different types of detection signals, i.e., detection signals of different polarities, depending on the direction of the leakage current, and control the ground switching unit 1300 to identify the power line 2410 through which the leakage current flows based on the detection signals and short-circuit the corresponding power line 2410 to the earth.

Hereinafter, an installation example of the failure detector 210 that identifies the power line 2410 through which the leakage current flows in the photovoltaic power generation system will be described.

Figure 27:
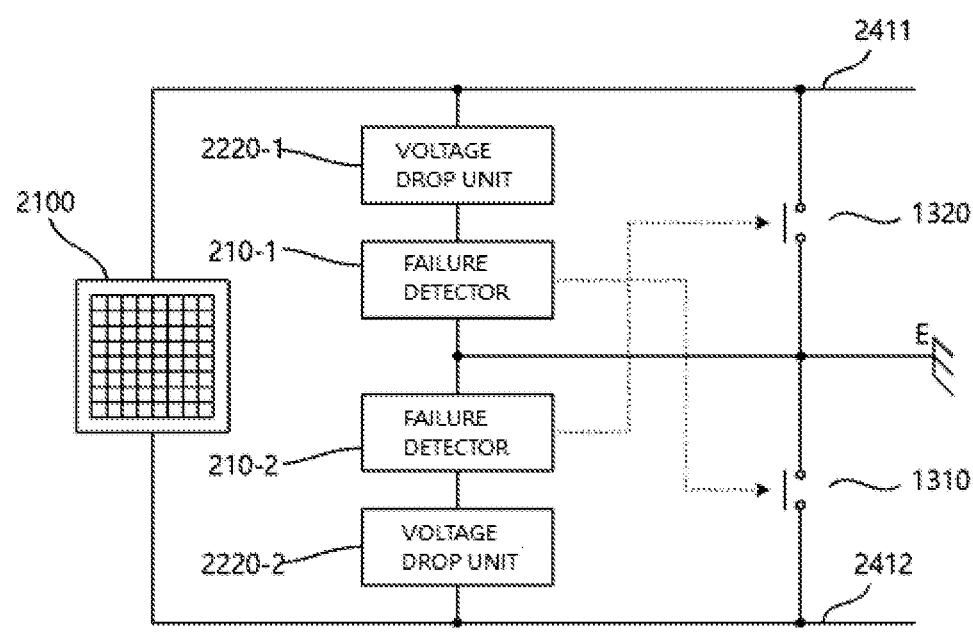
FIG. 27 is a connection diagram illustrating an example in which a failure detector is connected to a power line according to a fifth embodiment of the present invention.

FIG. 27 is a connection diagram illustrating an example in which the failure detector 210 is connected to the power line 2410 according to a fifth embodiment of the present invention.

Referring to FIG. 27, in the apparatus for preventing an electric shock and a fire of the photovoltaic power generation system according to the present invention, two or more power lines 2410 may include the first and second DC power lines 2411 and 2412 that transmit DC electricity generated from the solar panel 2100, the failure detector 210 may be configured to include the first and second failure detectors 210-1 and 210-2 that have one end electrically connected to the first and second DC power lines 2411 and 2412 to detect the leakage current from the current path by forming the current path for the leakage current flowing in the earth, and the ground switching unit 1300 that is controlled to short-circuit, to the earth, the power line 2410 in which leakage current occurs among the two or more power lines 2410 according to the detection result of the failure detectors 210-1 and 210-2 to ground the power line 2410.

Here, the ground switching unit 1300 may be configured to include the first ground switch 1310 that is controlled to ground the second DC power line 2412 to the earth when the leakage current flows in the second DC power line 2412 according to the detection result of the failure detectors 210-1 and 210-2, and the second ground switch 1320 that is controlled to ground the first DC power line 2411 to the earth when the leakage current flows in the first DC power line 2411 according to the detection result of the failure detectors 210-1 and 210-2.

Furthermore, the ground switching unit 1300 may further include a first voltage drop unit 2220-1 that is connected in series with the first failure detector 210-1 and electrically connected between the first DC power line 2411 and the earth, and a second voltage drop unit 2220-2 that is connected in series with the second failure detector 210-2 and is electrically connected between the second DC power line 2412 and the earth.

The first and second DC power lines 2411 and 2412 are power lines through which a DC current flows, and a voltage of a first polarity may be applied to the first DC power line 2411 and a voltage of a second polarity may be applied to the second DC power line 2412. Specifically, the first polarity may be a positive pole of the DC voltage and the second polarity may be a negative pole of the DC voltage, but vice versa.

The first and second voltage drop units 2220-1 and 2220-2 have a component that is conducted when being applied with a predetermined voltage or more or causes a predetermined voltage drop so that the current flowing to the failure detectors 210-1 and 210-2 in a normal state becomes less than or equal to a predetermined reference value, and may be a resistor or a Zener diode, but is not limited thereto.

In the configuration illustrated in FIG. 27, when the first and second voltage drop units 2220-1 and 2220-2 are configured to be conducted when being applied with a predetermined voltage or more like a Zener diode, each of the conduction voltages of the first voltage drop unit 2220-1 and the second voltage drop unit 2220-2 is smaller than the voltage across the first and second series power lines, and the sum of the conduction voltages of the first voltage drop unit 2220-1 and the second voltage drop unit 2220-2 is preferably greater than the voltage across the first and second series power lines.

When the conduction voltages of the first voltage drop unit 2220-1 and the second voltage drop unit 2220-2 are set as above, in the normal state in which the leakage current does not occur, since the first voltage drop unit 2220-1 and the second voltage drop unit 2220-2 do not conduct and thus a current does not flow in the failure detectors 210-1 and 210-2, it is determined that the leakage current does not occur, and in the situation in which the leakage current occurs, since one of the first voltage drop unit 2220-1 and the second voltage drop unit 2220-2 is conducted and thus the leakage current flows in the failure detectors 210-1 and 210-2, it is detected that the leakage current has occurred.

More specifically, when the ground fault or the electric leakage occurs in the first DC power line 2411, the second voltage drop unit 2220-2 is conducted to detect the leakage current in the second failure detector 210-2, and when the ground fault or the electric leakage occurs in the second DC power line 2412, the first voltage drop unit 2220-1 is conducted to detect the leakage current in the first failure detector 210-1, thereby identifying the power line in which the ground fault or the electric leakage occurs. In this way, when the ground fault or the electric leakage occurs in the first DC power line 2411, the second ground switch 1320 may be controlled to ground the first DC power line 2411 to the earth by the second failure detector 210-2, and when the ground fault or the electric leakage occurs in the second DC power line 2412, the first ground switch 1310 may be controlled to ground the second DC power line 2412 to the earth by the first failure detector 210-1.

Similarly, when the first and second voltage drop units 2220-1 and 2220-2 are configured such that the current flowing in the failure detectors 210-1 and 210-2 in the normal state is less than or equal to a predetermined reference value, in the normal state in which the leakage current does not occur, the current flowing in the failure detectors 210-1 and 210-2 is less than or equal to a predetermined reference value to determine that the leakage current does not occur, and in the situation in which the leakage current occurs, the current flowing in any one of the first and second failure detectors 210-1 and 210-2 is greater than or equal to a predetermined reference value to detect that the leakage current occurs.

More specifically, when the ground fault or the electric leakage occurs in the first DC power line 2411, the current flowing in the second failure detector 210-2 is greater than or equal to a predetermined reference value to detect the leakage current, and when the ground fault or the electric leakage occurs in the second DC power line 2412, the current flowing in the first failure detector 210-1 is greater than or equal to a predetermined reference value to detect the leakage current, thereby identifying the power line in which the ground fault or the electric leakage occurs. In this way, when the ground fault or the electric leakage occurs in the first DC power line 2411, the second ground switch 1320 may be controlled to ground the first DC power line 2411 to the earth by the second failure detector 210-2, and when the ground fault or the electric leakage occurs in the second DC power line 2412, the first ground switch 1310 may be controlled to ground the second DC power line 2412 to the earth by the first failure detector 210-1.

In this way, by grounding the power line 2410 identified that the leakage current has occurred by the failure detectors 210-1 and 210-2 to the earth, the leakage current flows by bypassing to the ground switching unit 1300 instead of flowing in the human body, the peripheral facility, or the load facility 2500, thereby fundamentally preventing the electric shock or fire caused by the leakage current.

In order for the power line 2410 to detect the occurrence of the leakage current even when the leakage current occurs for one line or both lines, although not illustrated in the drawings, in the apparatus for preventing an electric shock and a fire of the photovoltaic power generation system according to the present invention, the first and second failure detectors 210-1 and 210-2 may be configured so that, in the normal state, an operating current flows at a predetermined reference value or greater, and when the leakage current occurs, an operating current flows in the failure detectors 210-1 and 210-2 connected to the DC power line, in which the leakage current flows, at a predetermined reference value or less. In this case, the ground switching unit 1300 includes the second ground switch 1320 that is electrically connected between the first DC power line 2411 and the earth, and the first ground switch 1310 that is electrically connected between the second DC power line 2412 and the earth, and the first and second ground switches 1310 and 1320 may be a normal close (NC) type that is closed in a non-operating state.

For example, in this structure, in the normal state, when it is determined that the operating current greater than or equal to the predetermined reference value flows in the failure detectors 210-1 and 210-2 and thus the leakage current does not occur, the NC type ground switching unit 1300 operates to open contacts, and in the situation in which the leakage current occurs, when it is detected that the current flowing through any one of the first and second failure detectors 210-1 and 210-2 is less than or equal to a predetermined reference value and thus the leakage current has occurred, the ground switching unit 1300 may not operate to ground the corresponding power line to the earth.

In other words, when the ground fault or the electric leakage occurs in the first DC power line 2411, the current flowing in the first failure detector 210-1 is less than or equal to a predetermined reference value, and when the ground fault or the electric leakage occurs in the second DC power line 2412, the current flowing in the second failure detector 210-2 is less than or equal to a predetermined reference value, so it is possible to identify the power line with the ground fault or the electric leakage. In this way, when the ground fault or the electric leakage occurs in the first DC power line 2411, the second ground switch 1320 is in an non-operation mode by the first failure detector 210-1 and thus may be controlled to ground the first DC power line 2411 to the earth, and when the ground fault or the electric leakage occurs in the second DC power line 2412, the first ground switch 1310 is in an non-operation mode by the second failure detector 210-2 and thus may be controlled to ground the second DC power line 2412 to the earth.

In such a structure, even in the situation in which the leakage current occurs in one line and two lines of the power line 2410 due to the ground fault or the electric leakage, the leakage current can be detected. As such, in the situation where the ground fault or the electric leakage is detected in two lines, the DC circuit breaker 2420 is opened and closed and thus may be controlled to electrically separate the solar panel 2100 from the power line 2410.

In the above, the embodiment in which the failure detector 210 is installed between the power line 2410 and the earth has been described, but in order to detect the leakage current of the power line 2410, the failure detector 210 can be installed between the neutral point N having a potential between voltages of two or more power lines 2410 and the earth.

Figure 28:
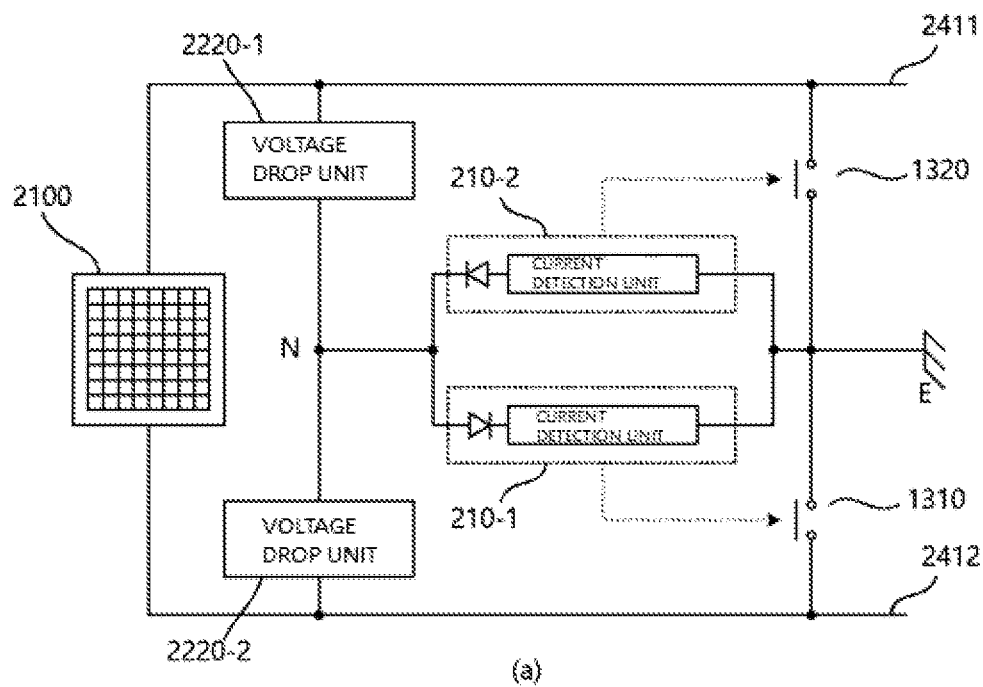
FIG. 28 is a connection diagram illustrating an example in which a failure detector is connected to a neutral point according to a sixth embodiment of the present invention.
Figure 28:
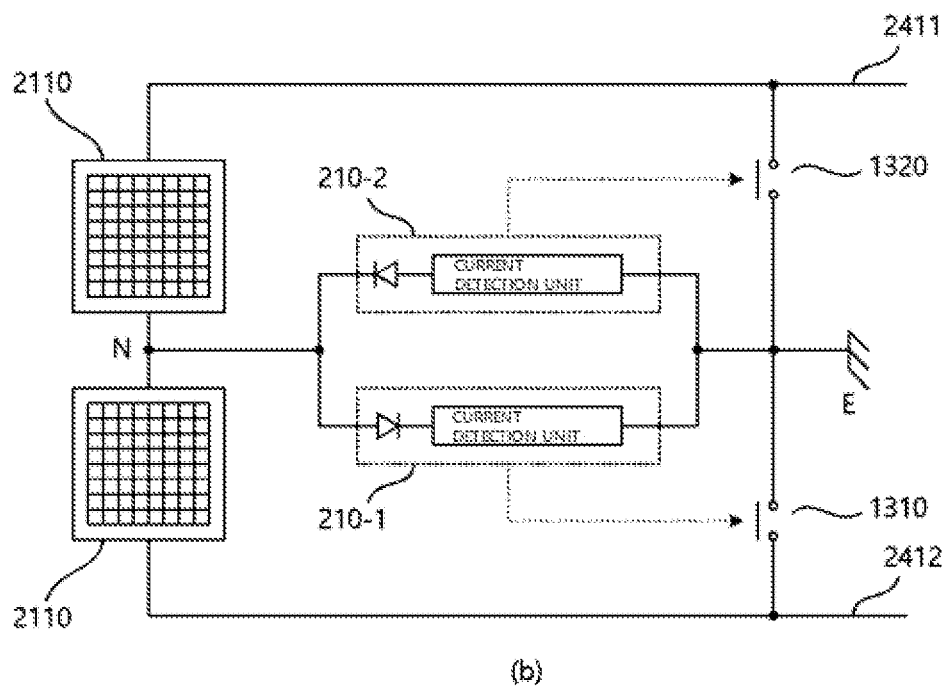

FIG. 28 is a connection diagram illustrating an example in which the failure detectors 210-1 and 210-2 are connected to the neutral point N according to a sixth embodiment of the present invention.

The neutral point N refers to a point having a potential between the voltages of two or more power lines 2410, and may be formed from each of the power lines 2410 through a voltage drop unit including a predetermined electrical device, and may be directly drawn out from a connection point between a plurality of solar cell modules 2110 connected in series between the power lines 2410. It is sufficient if the sum of the voltages of the power line 2410 with respect to the neutral point N is 0, and the magnitudes of the voltages of the power lines 2410 with respect to the neutral point N are not necessarily the same. Hereinafter, for convenience of description, the description will be made on the assumption that the voltages of the power line 2410 have the same magnitude except that the phases are different from each other with respect to the neutral point N.

Referring to FIG. 28, the failure detector 210 in the apparatus for preventing an electric shock and a fire of the photovoltaic power generation system according to the present invention is electrically connected between the neutral point N having a potential between the voltages of two or more power lines 2410 and the earth, and by forming the current path for the leakage current flowing to the earth, it is possible to detect the leakage current from the current path. In this case, the failure detector 210 may identify the power line 2410 in which the leakage current has occurred among two or more power lines 2410 according to the direction in which the leakage current flows through the failure detector 210.

Referring to FIG. 28(*a*), the apparatus for preventing an electric shock and a fire of the photovoltaic power generation system according to the present invention is configured to include a first voltage drop unit 2220-1 that is electrically connected between the first DC power line 2411 and the neutral point N and a second voltage drop unit 2220-2 that is electrically connected between the second DC power line 2412 and the neutral point N.

In the configuration of FIG. 28(*a*), the neutral point N is formed as a connection point of the first and second voltage drop units 2220-1 and 2220-2, and the first and second failure detectors are connected in parallel between the neutral point N and the earth formed in this way. In this case, the neutral point N has a potential between the voltages of the first and second DC power lines 2411 and 2412.

In this structure, the leakage current between the first DC power line 2411 and the earth passes through the second failure detector 210-2, and the current conduction direction of the unidirectional current unit 212 included in the failure detectors 210-1 and 210-2 may be set so that the leakage current between the second DC power line 2412 and the earth passes through the first failure detector 210-1.

In the embodiment of FIG. 28(*a*), the first and second voltage drop units 2220-1 and 2220-2 have a configuration in which a predetermined voltage drop occurs when conducting, and may be a configuration including a resistor or a Zener diode, but not limited thereto.

In the configuration of FIG. 28(*a*), when the ground fault or the electric leakage occurs in the first DC power line 2411, since the leakage current is detected by the second failure detector 210-2 through the second voltage drop unit 2220-2, and when the ground fault or the electric leakage occurs in the second DC power line 2412, the leakage current is detected by the first failure detector 210-1 through the first voltage drop unit 2220-1, by confirming which failure detectors 210-1 and 210-2 the detection signal is generated from, it is possible to identify the power line with the ground fault or the electric leakage.

In this way, when the ground fault or the electric leakage occurs in the first DC power line 2411, the second ground switch 1320 may be controlled to ground the first DC power line 2411 to the earth by the second failure detector 210-2, and when the ground fault or the electric leakage occurs in the second DC power line 2412, the first ground switch 1310 may be controlled to ground the second DC power line 2412 to the earth by the first failure detector 210-1.

In this way, by grounding the power line 2410 identified that the leakage current has occurred by the failure detectors 210-1 and 210-2 to the earth, the leakage current flows by bypassing to the ground switching unit 1300 instead of flowing in the human body, the peripheral facility, or the load facility 2500, thereby fundamentally preventing the electric shock or fire caused by the leakage current.

In addition, in the structure of FIG. 28(*b*), the neutral point N may be drawn out from a connection point between the two or more solar cell modules 2110 connected in series between the first and second DC power lines 2411 and 2412.

In this case, the failure detector 210 is configured to include the first and second failure detectors 210-1 and 210-2 connected in parallel between the neutral point N and the earth, and the current conduction direction of the unidirectional current unit 212 included in the failure detectors 210-1 and 210-2 may be set so that the leakage current between the first DC power line 2411 and the earth passes through the second failure detector 210-2, and the leakage current between the second DC power line 2412 and the earth passes through the first failure detector 210-1.

Similar to the configuration of FIG. 28(*a*), when the ground fault or the electric leakage occurs in the first DC power line 2411, since the leakage current is detected by the second failure detector 210-2 through the second voltage drop unit 2220-2, and when the ground fault or the electric leakage occurs in the second DC power line 2412, the leakage current is detected by the first failure detector 210-1 through the first voltage drop unit 2220-1, by confirming which failure detectors 210-1 and 210-2 the detection signal is generated from, it is possible to identify the power line with the ground fault or the electric leakage.

In this way, when the ground fault or the electric leakage occurs in the first DC power line 2411, the second ground switch 1320 may be controlled to ground the first DC power line 2411 to the earth by the second failure detector 210-2, and when the ground fault or the electric leakage occurs in the second DC power line 2412, the first ground switch 1310 may be controlled to ground the second DC power line 2412 to the earth by the first failure detector 210-1.

In the above, the plurality of failure detectors 210-1 and 210-2 are installed between the neutral point N and the earth, and each failure detector 210-1 and 210-2 is configured to detect a current in a specific direction by the unidirectional current unit 212. However, the apparatus for preventing an electric shock and a fire of the photovoltaic power generation system according to the present invention may be configured to detect the power line 2410 in which the leakage current has occurred using the failure detector 210 excluding the unidirectional current unit 212.

For example, in the failure detector 210 illustrated in FIG. 2(*c*), the current detection unit 211 may output different types of detection signals, i.e., detection signals of different polarities, depending on the direction of the leakage current, and control the ground switching unit 1300 to identify the power line 2410 through which the leakage current flows and short-circuit the corresponding power line 2410 to the earth.

Figure 29:
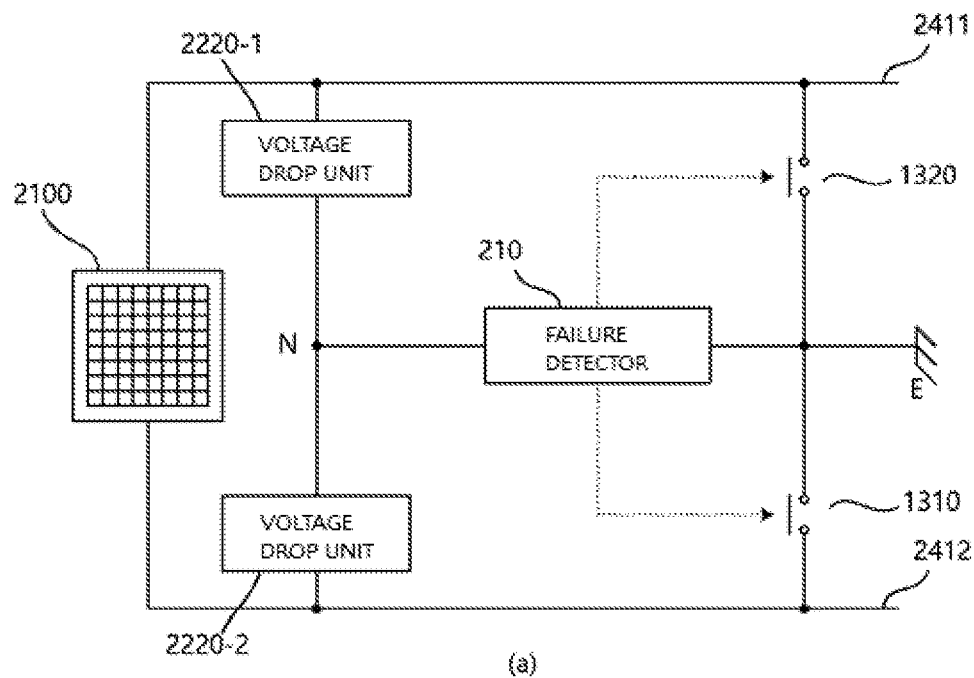
FIG. 29 is a connection diagram illustrating another example in which the failure detector is connected to the neutral point according to the sixth embodiment of the present invention.
Figure 29:
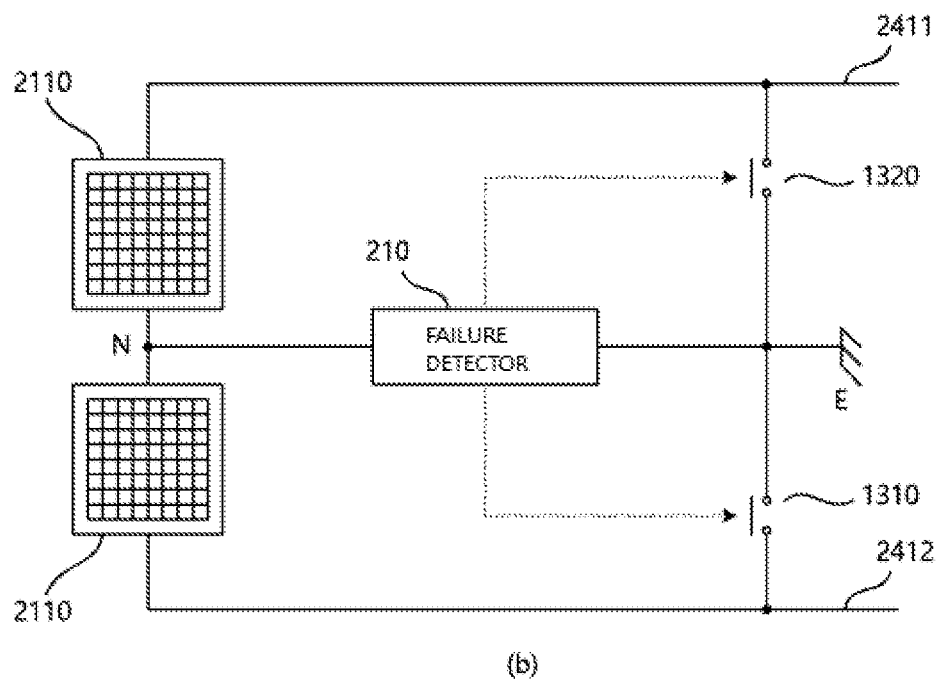

FIG. 29 is a connection diagram illustrating another example in which the failure detector 210 is connected to the neutral point N according to the sixth embodiment of the present invention.

Referring to FIG. 29, the failure detector 210 in the apparatus for preventing an electric shock and a fire of the photovoltaic power generation system according to the present invention is electrically connected between the neutral point N having a potential between the voltages of two or more power lines 2410 and the earth, and by forming the current path for the leakage current flowing to the earth, it is possible to detect the leakage current from the current path.

In this case, the failure detector 210 may output a detection signal of a different type, that is, a detection signal having a different polarity or a different level depending on the direction of the leakage current flowing through the failure detector 210, and control the ground switching unit 1300 to identify the power line 2410 through which the leakage current flows and short-circuit the corresponding power line 2410 to the earth. In other words, a current in a first direction flows to the failure detector 210 due to the leakage current generated in the first power line, and a current in a second direction flows to the failure detector 210 due to the leakage current generated in the second power line, so the failure detector 210 may operate the second ground switch 1320 with respect to the current in the first direction and operate the first ground switch 1310 with respect to the current in the second direction to ground the corresponding power line to the earth.

By grounding, to the earth, the power line 2410 identified that the leakage current has occurred depending on the direction of current flowing in the failure detector 210, the leakage current flows by bypassing to the ground switching unit 1300 instead of flowing in the human body, the peripheral facility, or the load facility 2500, thereby fundamentally preventing the electric shock or fire caused by the leakage current.

As described above, the neutral point N to which the failure detector 210 is connected refers to a point having a potential between the voltages of the two or more power lines 2410, and as illustrated in FIG. 29(*a*), the neutral point N may be formed from each of the power lines 2410 through a voltage drop unit including a predetermined electrical device, and as illustrated in FIG. 29(*b*), directly drawn out from the connection point between the plurality of solar cell modules 2110 connected in series between the power lines 2410.

Figure 30:
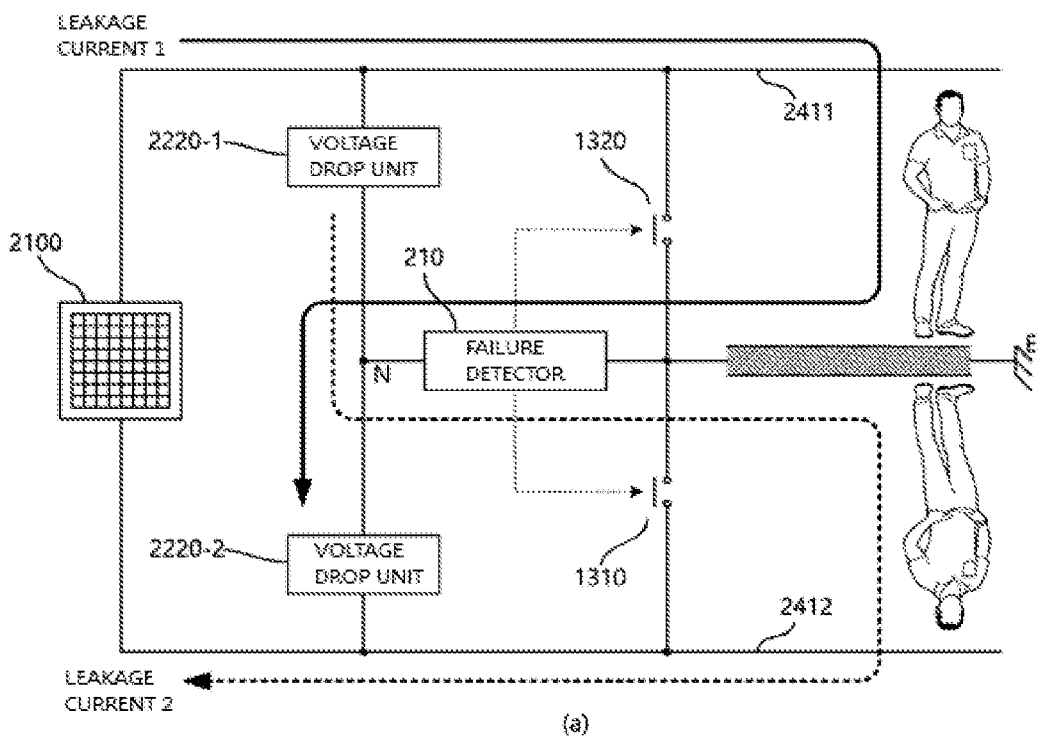
FIG. 30 is a conceptual diagram illustrating the principle of the failure detector detecting the leakage current and grounding the power line to the earth in the embodiment illustrated in FIG. 29.
Figure 30:
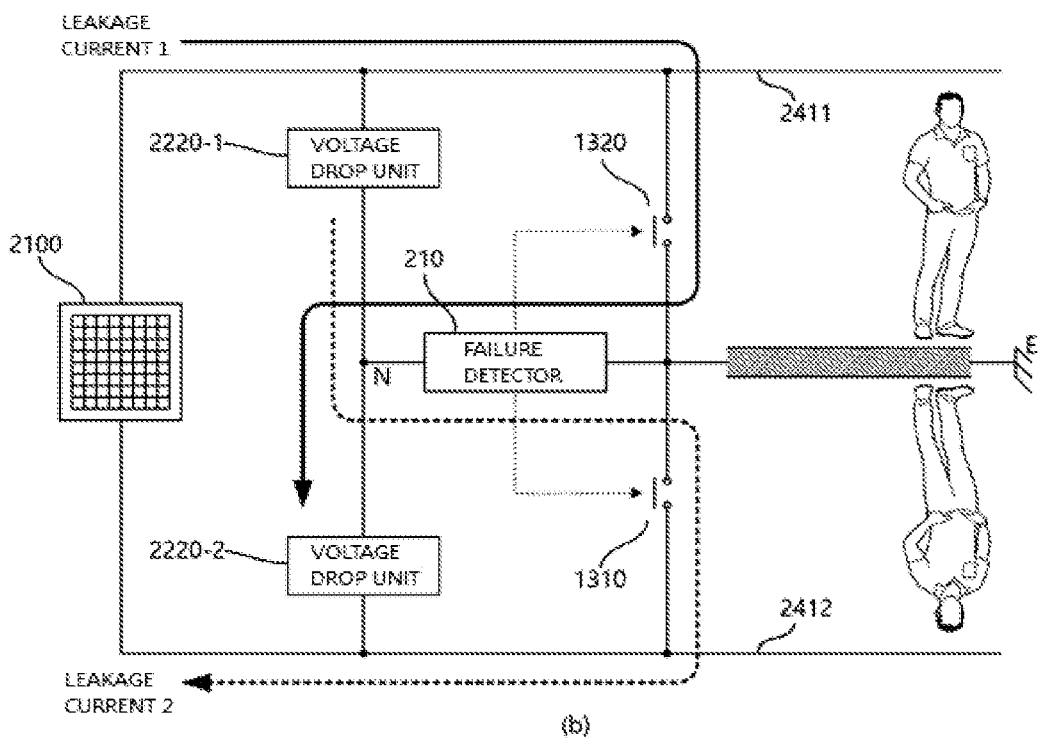

FIG. 30 is a conceptual diagram illustrating the principle of the failure detector 210 detecting the leakage current and grounding the power line 2410 to the earth in the embodiment illustrated in FIG. 29.

In FIG. 30, the operation principle of the failure detector 210 detecting the leakage current and bypassing the leakage current to the ground switching unit 1300 is described in the case where the photovoltaic power generation system of the present invention has the configuration of FIG. 29(*a*), but the principle of operation can be understood in the same way for the configuration of FIGS. 27, 28, and 29(*b*).

According to FIG. 30(*a*), the leakage current 1 generated in the first DC power line 2411 among the DC power lines forms a current path flowing through the failure detector 210 in the first direction along the solid line illustrated in the drawing, and the leakage current 2 generated in the second DC power line 2412 among the DC power lines forms a current path flowing through the failure detector 210 in the second direction along the broken line. Here, since the leakage current flows through the human body, the peripheral electrical facilities, etc., even if the magnitude of the leakage current is limited to a predetermined dangerous current or less by the failure detector 210, the risk of electric shock or fire still remains.

Referring to FIG. 30(*b*), in the photovoltaic power generation system according to the present invention, the failure detector 210 may operate to turn on the second ground switch 1320 for the leakage current 1, and the failure detector 210 may operate to turn on the first ground switch 1310 for the leakage current 2. In this way, the leakage current 1 generated in the first DC power line 2411 and flowing to the human body or peripheral electrical facilities bypasses the second ground switch 1320 and flows to the earth, and the leakage current 2 generated in the second DC power line 2412 and flowing to the human body or peripheral electrical facilities bypasses the first ground switch 1310 and flows to the earth.

Therefore, the apparatus for preventing an electric shock and a fire of the photovoltaic power generation system according to the present invention and the photovoltaic power generation system including the same allows the leakage current caused by the ground fault or the electric leakage to bypass the ground switching unit 1300 instead of flowing to the human body or the peripheral electrical facilities, thereby fundamentally preventing the electric shock or fire caused by the leakage current.

By the above-described configuration, according to an apparatus, method, and distribution system for preventing an electric shock and a fire during electric leakage and ground fault according to the present invention, by detecting a leakage current between a power line, which is insulated from the earth and supplies power, and the earth to limit the detected leakage current to be a dangerous current or less or cutting off the leakage current from flowing in a human body or peripheral facilities, it is possible to prevent the electric shock and the occurrence of the fire due to the leakage current.

[Description of Reference Signs]

| | |
|---|---|
| 100: Electrical facility | |
| 210, 210-1, 210-2, 210-3, 210-4: Failure detector | |
| 211: Current detection unit | 212: Unidirectional current unit |
| 213, 213-1, 213-2: Open/close switch | |
| 220: Controller | 230: Detection/recovery device |
| 231~233: First to third winding | 240: Isolation transformer |
| 250: Alarm generator | 260: Alarm release input device |
| 270: Circuit breaker | 280: Surge protector |
| 290: Load | 300: Main transformer |
| 1100: Power supply unit | |
| 1300: Ground switching unit | |
| 1310, 1320, 1330: First to third ground switch | |
| 1410, 1420, 1430: First to third power line | |
| 1500: Circuit breaker | |
| 2100: Solar panel | 2110: Solar cell module |
| 2220-1, 2220-2: First and second voltage drop unit | |
| 2400: Connector band | |
| 2410, 2411, 2412: DC power line | 2420: DC circuit breaker |
| 2430: Collection unit | 2500: Load facility |
| PL1: Power receiving/distribution line | PL2: Power line |
| NL: Neutral line | N, N1, N2: Neutral point |
| R1, R2: Single-phase voltage | |

The invention claimed is:

1. An apparatus for preventing an electric shock and a fire, comprising:
one or more failure detectors that have one end electrically connected to at least one of two or more power lines insulated from earth with a resistance value greater than or equal to a predetermined ground resistance value and a first neutral point having a potential between voltages of the two or more power lines, and the other end electrically connected to the earth,
wherein the failure detector detects a leakage current by forming a current path for the leakage current flowing from the two or more power lines or the first neutral point to the earth, and each of the failure detectors includes a current detection unit that limits the leakage current to a predetermined dangerous current or less and detects the leakage current and outputs a detection signal, and a unidirectional current unit that limits the path for the leakage current so that the leakage current flows through the current detection unit in one-way direction.

2. The apparatus of claim 1, further comprising:
a detection/recovery device that is connected in parallel with a load on a load side of the power line, detects an electrical failure of the power line, or detects the electrical failure to recover power.

3. The apparatus of claim 2, wherein the detection/recovery device includes:
a second neutral point that is connected to the first neutral point; and
two or more windings that have one end connected to each of the two or more power lines, and the other end commonly connected to the second neutral point,
each of the two or more windings includes at least one coupling winding portion magnetically coupled to any one of the remaining windings, and
at least one of the two or more windings includes the coupling winding portion in which voltages having phases opposite to those of voltages applied to each of the remaining windings are induced with respect to the second neutral point.

4. The apparatus of claim 3, wherein the power line supplies single-phase power,
the detection/recovery device includes first and second windings that have one end connected to each of the power lines and the other end commonly connected to the second neutral point, and
the first and second windings are magnetically coupled to each other so that voltages having phases opposite to each other are each induced with respect to the second neutral point.

5. The apparatus of claim 3, wherein the power line supplies three-phase power having R, S and T-phases,
the detection/recovery device includes first to third windings that have one end connected to each of the R, S and T-phases and the other end commonly connected to the second neutral point, and
each of the first to third windings or one of the first to third windings includes the coupling winding portion in which voltages having phases opposite to those of each of the voltages applied to the remaining windings are each induced with respect to the second neutral point.

6. An apparatus for preventing an electric shock and a fire, comprising:
a failure detector that is electrically connected to a power supply unit to transmit AC or DC electricity from the power supply unit to a load facility, and configured to detect whether a leakage current occurs between at least one of two or more power lines insulated from earth with a resistance value greater than or equal to a predetermined ground resistance value and a neutral point having a potential between voltages of the two or more power lines and the earth, wherein the failure detector operates to ground, to the earth, a power line or a neutral point in which the leakage current occurs among the two or more power lines and the neutral point when the leakage current occurs.

7. The apparatus of claim 6, wherein the failure detector is configured to detect the leakage current between a least one of the two or more power lines and the neutral point and the earth, and to output a detection signal according to the detection result for the leakage current.

8. The apparatus of claim 7, configured to cut off a supply of power to a power line through which the leakage current flows by interlocking with the detection signal, and to recover the cut-off power and supply the recovered power to a load.

9. The apparatus of claim 6, further comprising:
a ground switching unit that is controlled to short-circuit, to the earth, a power line or a neutral point in which the leakage current occurs among the two or more power lines and the neutral point according to the detection result of the failure detector to ground the power line or the neutral point.

10. The apparatus of claim 9, wherein the failure detector includes two or more failure detectors respectively electrically connected between the two or more power lines and the earth, and
the ground switching unit includes two or more ground switches whose turn-on or turn-off is controlled in response to each of the two or more failure detectors.

11. The apparatus of claim 10, wherein at least one of the two or more ground switches is a normal open (NO) type switch that is turned on when an operating current greater than or equal to a predetermined reference value flows in a corresponding failure detector, and is electrically connected to at least one of a power line and a neutral point other than a power line, to which the corresponding failure detector is connected, among the two or more power lines and the neutral point, or
at least one of the two or more ground switches is a normal close (NC) type switch that is turned off when an operating current greater than or equal to a predetermined reference value flows in the corresponding failure detector, and is electrically connected in parallel to the corresponding failure detector.

12. The apparatus of claim 11, wherein the power supply unit is a three-phase AC power supply including an R-phase, an S-phase, and a T-phase,
the failure detector includes first to third failure detectors respectively connected between the R-phase, the S-phase, and the T-phase and the earth,
the ground switching unit includes first to third ground switches that correspond to each of the first to third failure detectors and are turned on when an operating current greater than or equal to a predetermined reference value flows in the corresponding failure detector, and
the first to third ground switches are installed between a plurality of power lines and the earth so that, when the electric leakage or the ground fault occurs in any one of the plurality of power lines connected to the R-phase, the S-phase, and the T-phase, the corresponding power line is grounded to the earth.

13. The apparatus of claim 11, wherein the power supply unit is a three-phase AC power supply including an R-phase, an S-phase, and a T-phase,
the failure detector includes first to third failure detectors respectively connected between the R-phase, the S-phase, and the T-phase and the earth,
the ground switching unit includes first to third ground switches that correspond to each of the first to third failure detectors and are turned off when an operating current greater than or equal to a predetermined reference value flows in the corresponding failure detector, and
the first to third ground switches are installed between a plurality of power lines and the earth so that, when the electric leakage or the ground fault occurs in one or more of the plurality of power lines connected to the R-phase, the S-phase, and the T-phase, the corresponding power line is grounded to the earth.

14. A distribution system for preventing an electric shock and a fire, comprising:
a power supply unit configured to provide AC or DC electricity to a load facility;
two or more power lines that is electrically connected to the power supply unit and insulated from earth with a resistance value greater than or equal to a predetermined ground resistance value; and
the apparatus for preventing an electric shock and a fire of claim 6.

15. An apparatus for preventing an electric shock and a fire of a photovoltaic power generation system, the apparatus comprising:
one or more failure detectors electrically connected between at least one of two or more power lines that are electrically connected to a solar panel in which one or more solar cell modules are arranged to transmit electricity generated from the solar panel to a load facility and a neutral point having a potential between voltages of the two or more power lines and earth to detect whether a leakage current occurs between at least one of the two or more power lines insulated from the earth with a resistance value greater than or equal to a predetermined ground resistance value and the earth; and
a ground switching unit that is controlled to short-circuit, to the earth, a power line in which the leakage current occurs among the two or more power lines according to the detection result of the failure detector to ground the power line.

16. The apparatus of claim 15, wherein the two or more power lines include first and second DC power lines that transmit DC electricity generated from the solar panel, and
the failure detector includes first and second failure detectors that have one end electrically connected to the first and second DC power lines, respectively, and form a current path for a leakage current flowing in the earth to detect the leakage current from the current path.

17. The apparatus of claim 16, wherein the ground switching unit includes:
a first ground switch that is controlled to ground the second DC power line to the earth when the leakage current flows in the second DC power line according to the detection result of the failure detector; and
a second ground switch that is controlled to ground the first DC power line to the earth when the leakage current flows in the first DC power line according to the detection result of the failure detector.

18. The apparatus of claim 15, wherein the two or more power lines include first and second DC power lines that transmit DC electricity generated from the solar panel, the failure detector includes first and second failure detectors that are electrically connected between the first and second DC power lines and the earth, respectively, and in the first and second failure detectors, an operating current flows at a predetermined reference value or greater in a normal state, and when the leakage current occurs, the operating current flows in the failure detector connected to a DC power line, through which the leakage current flows, at the predetermined value or less.

19. The apparatus of claim 15, wherein the two or more power lines include first and second DC power lines that transmit DC electricity generated from the solar panel, the failure detector is electrically connected between a neutral point having a potential between the voltages of the two or more power lines and the earth, and forms a current path for a leakage current flowing in the earth to detect the leakage current from the current path, and a power line in which the leakage current occurs is identified from among the two or more power lines according to a direction of the leakage current flowing through the failure detector.

20. A photovoltaic power generation system, comprising:

a solar panel in which one or more solar cell modules are arranged;

two or more power lines that are electrically connected to the solar panel to transmit electricity generated from the solar panel to a load facility and insulated from earth with a resistance value greater than or equal to a predetermined ground resistance value; and the apparatus for preventing an electric shock and a fire of claim 15.

* * * * *